United States Patent
Vankayala et al.

(10) Patent No.: US 12,040,896 B2
(45) Date of Patent: Jul. 16, 2024

(54) METHODS AND SYSTEMS FOR OPTIMIZING COMPUTATION OF LOG-LIKELIHOOD RATIO (LLR) FOR DECODING MODULATED SYMBOLS

(71) Applicant: SAMSUNG ELECTRONICS CO., LTD., Suwon-si (KR)

(72) Inventors: Satya Kumar Vankayala, Bangalore (IN); Ravi Teja Gundeti, Bangalore (IN); Abhay Kumar Sah, Bangalore (IN); Anshuman Nigam, Bangalore (IN); Satya Venkata Umakishore Godavarti, Bangalore (IN); Issaac Kommineni, Bangalore (IN); Shruti Shetty, Bangalore (IN)

(73) Assignee: Samsung Electronics Co., Ltd., Suwon-si (KR)

( * ) Notice: Subject to any disclaimer, the term of this patent is extended or adjusted under 35 U.S.C. 154(b) by 62 days.

(21) Appl. No.: 17/995,262

(22) PCT Filed: Apr. 2, 2021

(86) PCT No.: PCT/KR2021/004146
§ 371 (c)(1),
(2) Date: Sep. 30, 2022

(87) PCT Pub. No.: WO2021/201651
PCT Pub. Date: Oct. 7, 2021

(65) Prior Publication Data
US 2023/0042213 A1 Feb. 9, 2023

(30) Foreign Application Priority Data
Apr. 2, 2020 (IN) .............................. 202041014792

(51) Int. Cl.
*H04L 1/00* (2006.01)

(52) U.S. Cl.
CPC .................................. *H04L 1/0054* (2013.01)

(58) Field of Classification Search
CPC ... H04L 1/0054; H04L 1/0045; H04L 25/067; H04L 27/34; H04L 27/38; H03M 13/6325
(Continued)

(56) References Cited

U.S. PATENT DOCUMENTS 6,977,972 B1 * 12/2005 Kandala ................ H04L 25/067
375/332
8,019,024 B2 9/2011 Guerrieri et al.
(Continued)

FOREIGN PATENT DOCUMENTS

JP 2011-004229 A 1/2011

OTHER PUBLICATIONS

International Search Report and Written Opinion of the International Searching Authority dated Jul. 26, 2021, in connection with International Application No. PCT/KR2021/004146, 7 pages.
(Continued)

Primary Examiner — Fitwi Y Hailegiorgis

(57) ABSTRACT

The present disclosure relates to a pre-5th-Generation (5G) or 5G communication system to be provided for supporting higher data rates Beyond 4th-Generation (4G) communication system such as long term evolution (LTE). Methods and systems for optimizing computation of log-likelihood ratio (LLR) for decoding modulated symbols. A method disclosed herein involves receiving at least one symbol transmitted from at least one device, wherein the received at least one symbol is encoded and modulated symbol including a plurality of data bits. The method further includes computing a log-likelihood ratio (LLR) of each bit in the received at least one symbol for decoding the received at least one symbol using a centroid method that involves exploiting a symmetry
(Continued)

of a constellation of code words and/or a uncertainty region defined on a constellation of code words.

15 Claims, 36 Drawing Sheets

(58) Field of Classification Search
USPC .......................................................... 375/340
See application file for complete search history.

(56) References Cited

U.S. PATENT DOCUMENTS

| | | | |
|---|---|---|---|
| 8,301,979 B2 | 10/2012 | Sharon et al. | |
| 8,793,560 B2 | 7/2014 | Sidi et al. | |
| 9,832,065 B2 | 11/2017 | Jung et al. | |
| 11,032,037 B2 * | 6/2021 | Beidas | H04L 25/03834 |
| 2002/0023247 A1 | 2/2002 | Akiyama et al. | |
| 2007/0260959 A1 | 11/2007 | Sidi et al. | |
| 2009/0323846 A1 | 12/2009 | Sindhushayana | |
| 2010/0325514 A1 | 12/2010 | Sugihara et al. | |
| 2012/0219097 A1 | 8/2012 | McCloud et al. | |
| 2016/0087757 A1 | 3/2016 | Nekuii | |
| 2017/0126360 A1 | 5/2017 | Millar et al. | |
| 2017/0324590 A1 | 11/2017 | Beidas et al. | |

OTHER PUBLICATIONS

Intellectual Property India, "Examination report under sections 12&13 of the Patents Act," dated Feb. 11, 2021, in connection with Indian Patent Application No. IN202041014792, 6 pages.

Le et al., "Log-Likelihood Ratio Calculation Using 3-Bit Soft-Decision for Error Correction in Visible Light Communication Systems" IEICE Trans. Fundamentals, vol. E101-A, No. 12, Dec. 2018, 3 pages.

* cited by examiner

[Fig. 1]
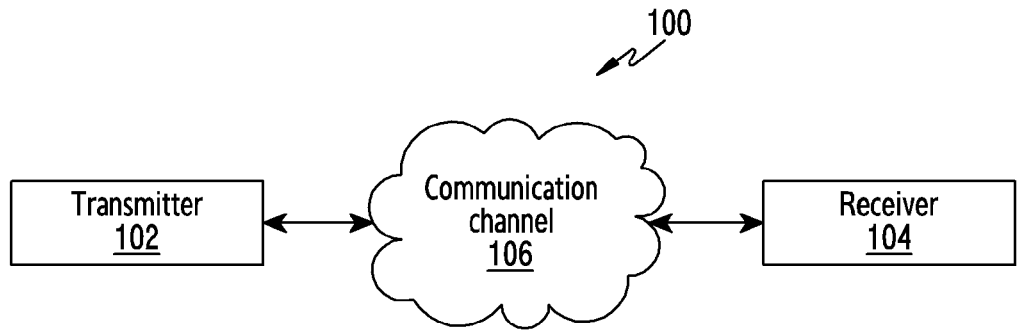
[Fig. 2]
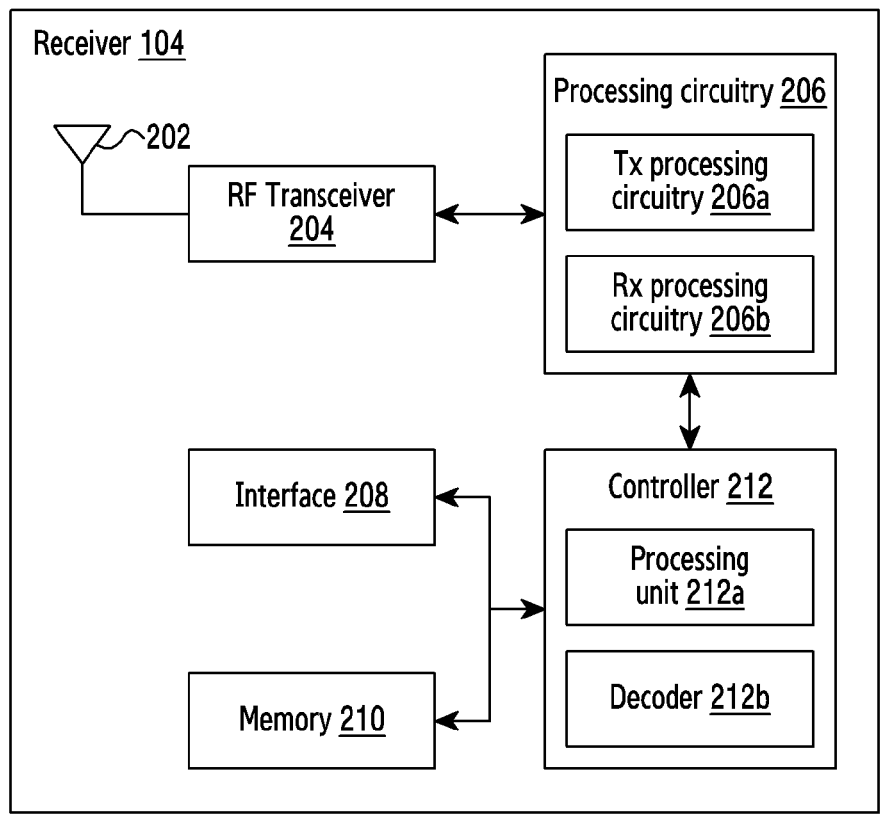
[Fig. 3]
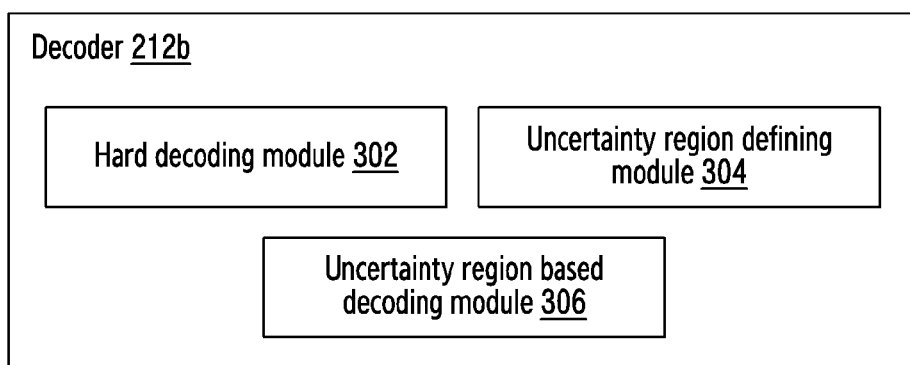

[Fig. 4]
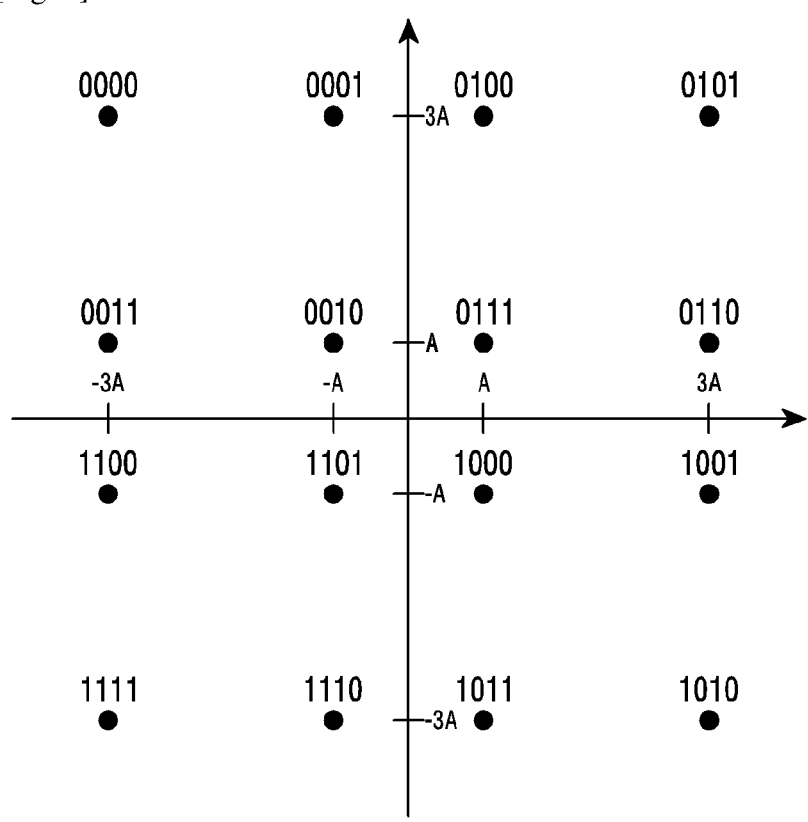

[Fig. 5C]
FIG.5A
FIG.5B  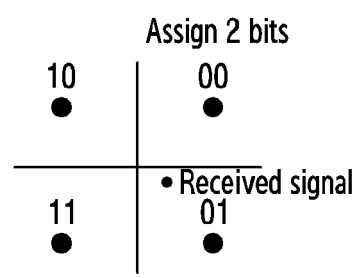

[Fig. 6A]

[Fig. 6B]
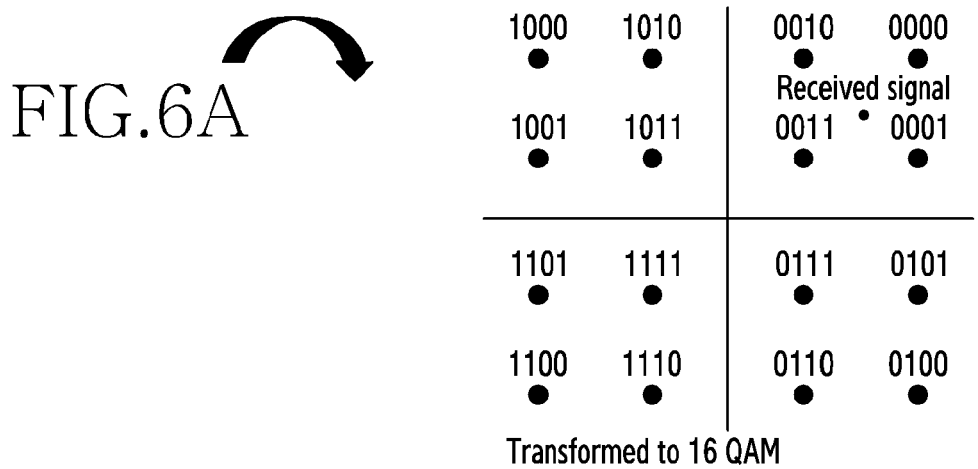
[Fig. 6C]
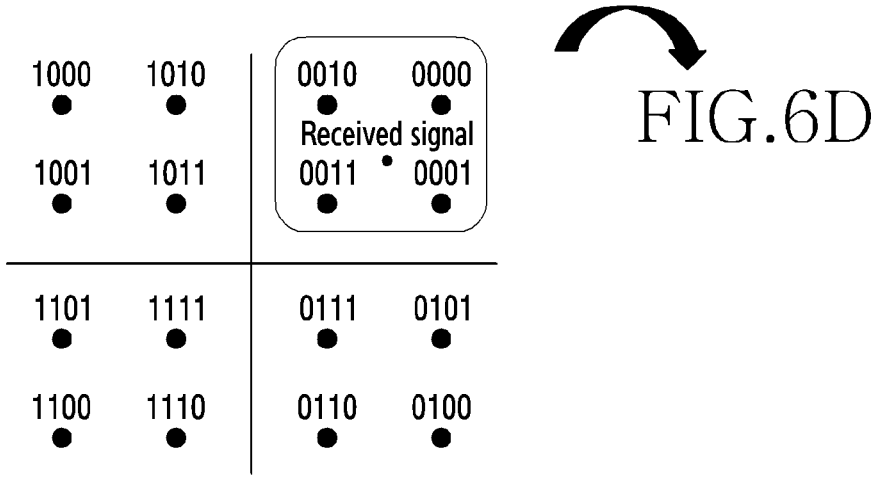
[Fig. 6D]
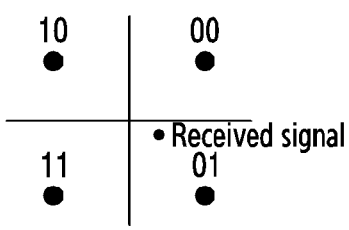

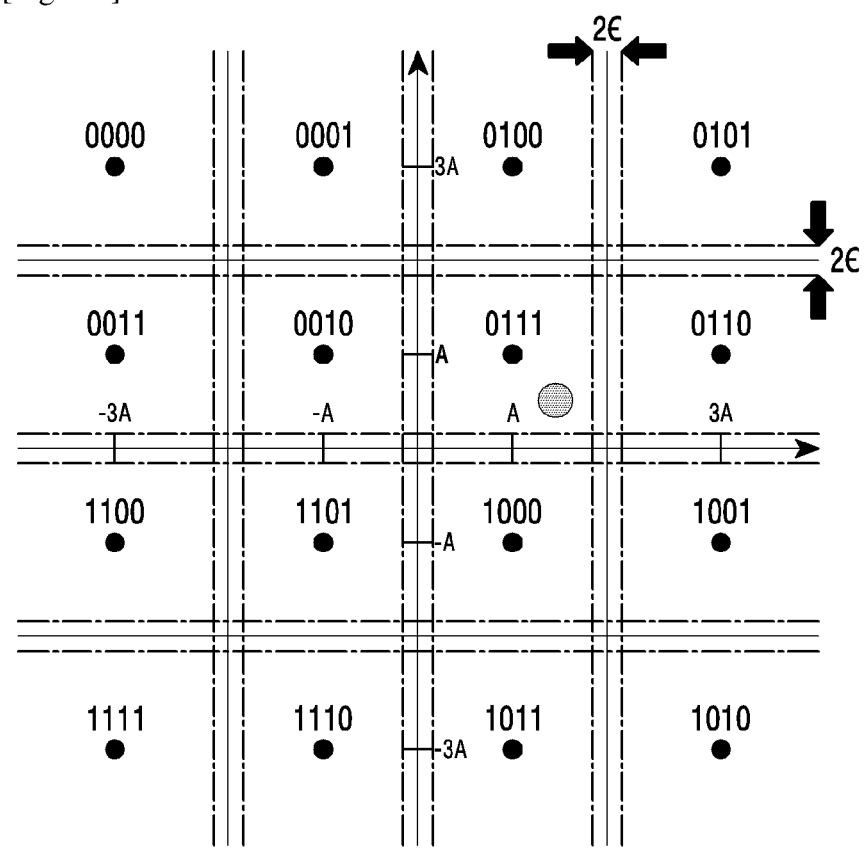
[Fig. 7A]

[Fig. 7B]
| Constellation | η value |
|---|---|
| 4-QAM | 2 |
| 16-QAM | 10 |
| 64-QAM | 42 |
| 256-QAM | 170 |
| b(n), b(n+1) | I | Q |
|---|---|---|
| 00 | $1/\sqrt{2}$ | $1/\sqrt{2}$ |
| 01 | $1/\sqrt{2}$ | $-1/\sqrt{2}$ |
| 10 | $-1/\sqrt{2}$ | $1/\sqrt{2}$ |
| 11 | $-1/\sqrt{2}$ | $-1/\sqrt{2}$ |
QPSK Constellation Points from 3GPP Spec
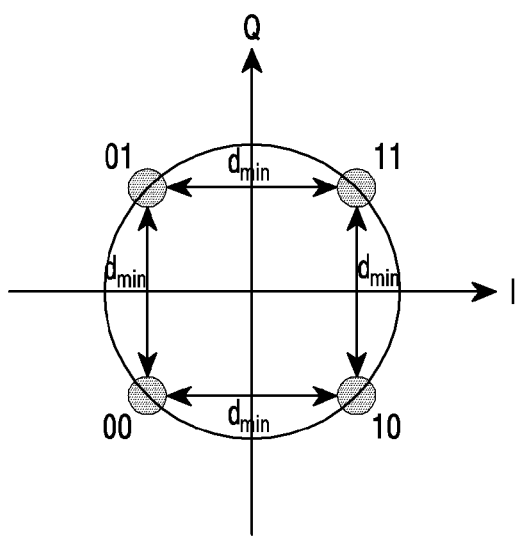

[Fig. 7C]
| SNR Range | $\epsilon$ value |
|---|---|
| Range-0 | $\epsilon_0$ |
| Range-1 | $\epsilon_1$ |
| --- | --- |
| Range-N | $\epsilon_N$ |
[Fig. 8A]
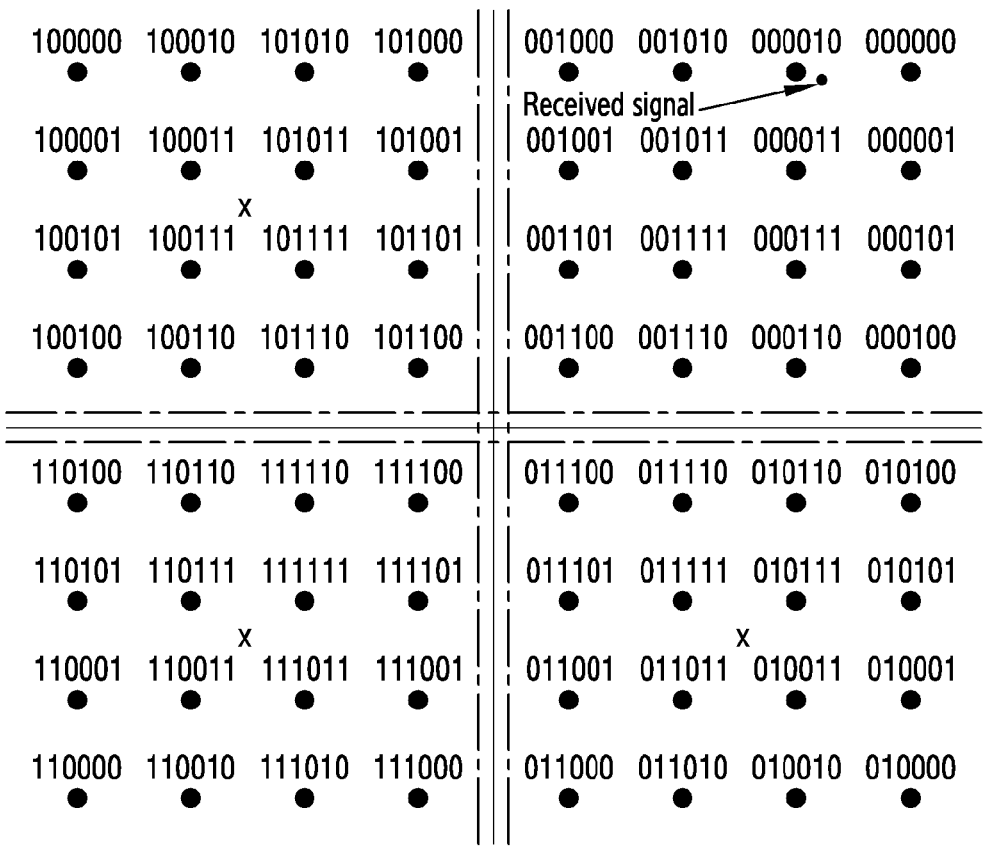
Soft decoding-received symbol is present in the uncertainty region on any constellation
Hard decoding-received symbol is not present in the uncertainty region on the 4QAM
FIG.8B  FIG.8C

[Fig. 9A]
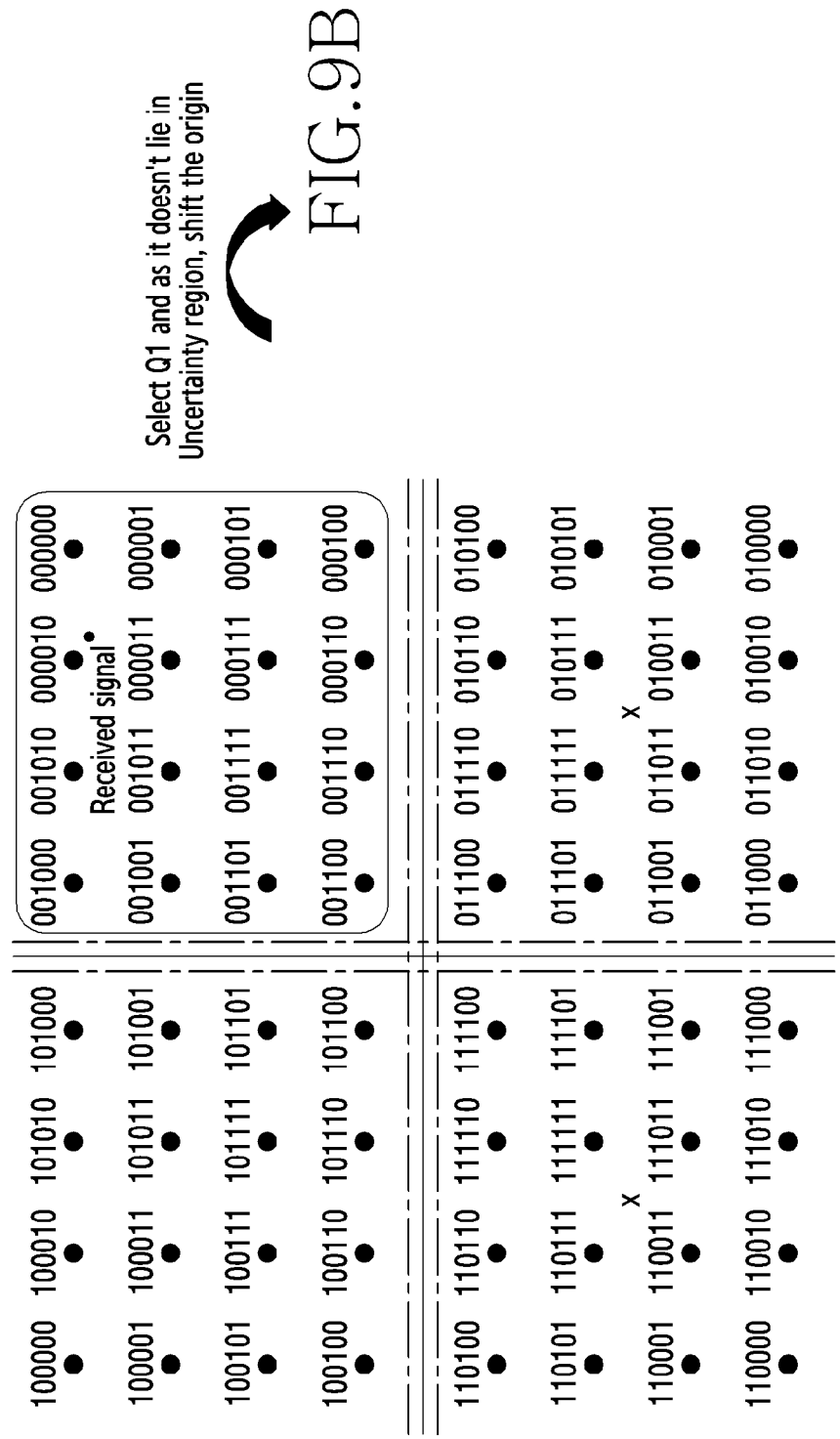

[Fig. 9B]

Select Q1 and as it doesn't lie in
Uncertainty region, shift the origin

Transformed to 16 QAM

[Fig. 9C]

Select Q1 and as it doesn't lie in
Uncertainty region, shift the origin

[Fig. 9D]

Select Q1 and as it doesn't lie in
Uncertainty region, shift the origin

Transform to 4 QAM and the signal lies in
uncertainty region, perform soft decoding

[Fig. 10A]
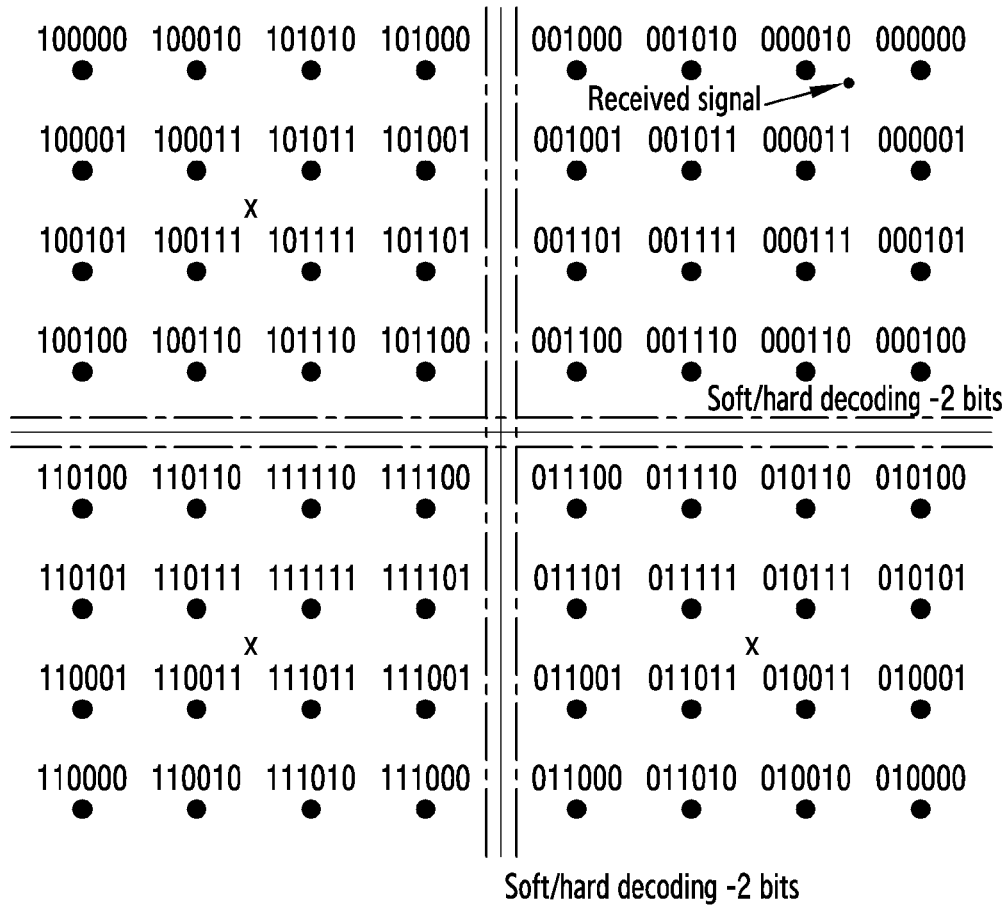
FIG.10B → FIG.10C

[Fig. 11A]
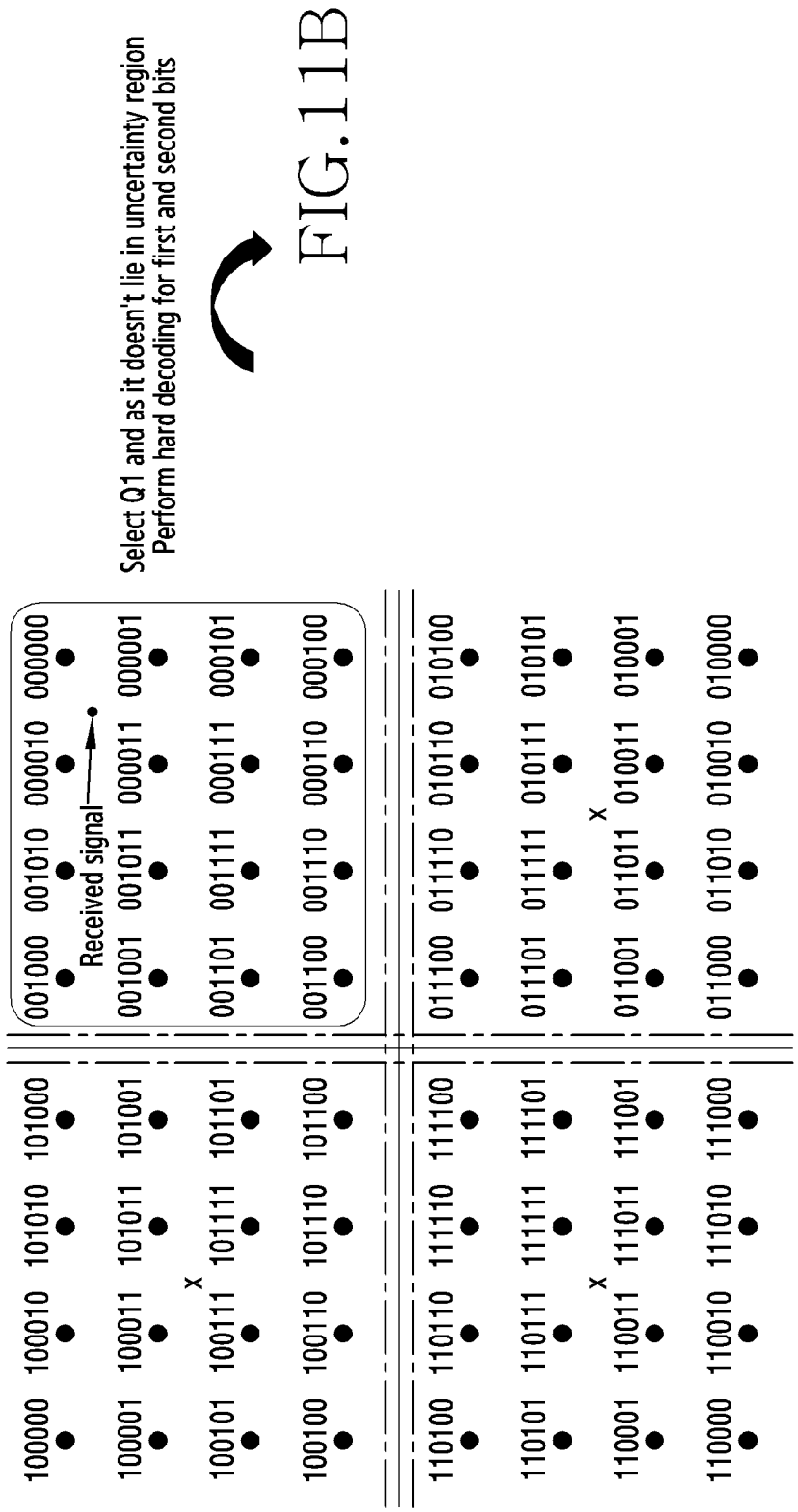

[Fig. 11D]
Select Q1 and as it lies in uncertainty region
Perform soft decoding for third and fourth bits
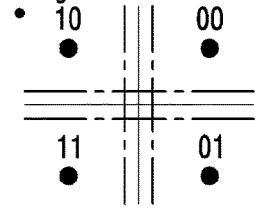
FIG.11C  Received signal
Transform to 4 QAM and the signal deosn't lies in
uncertainty region perform hard decoding for fifth and sixth bits
[Fig. 12A]
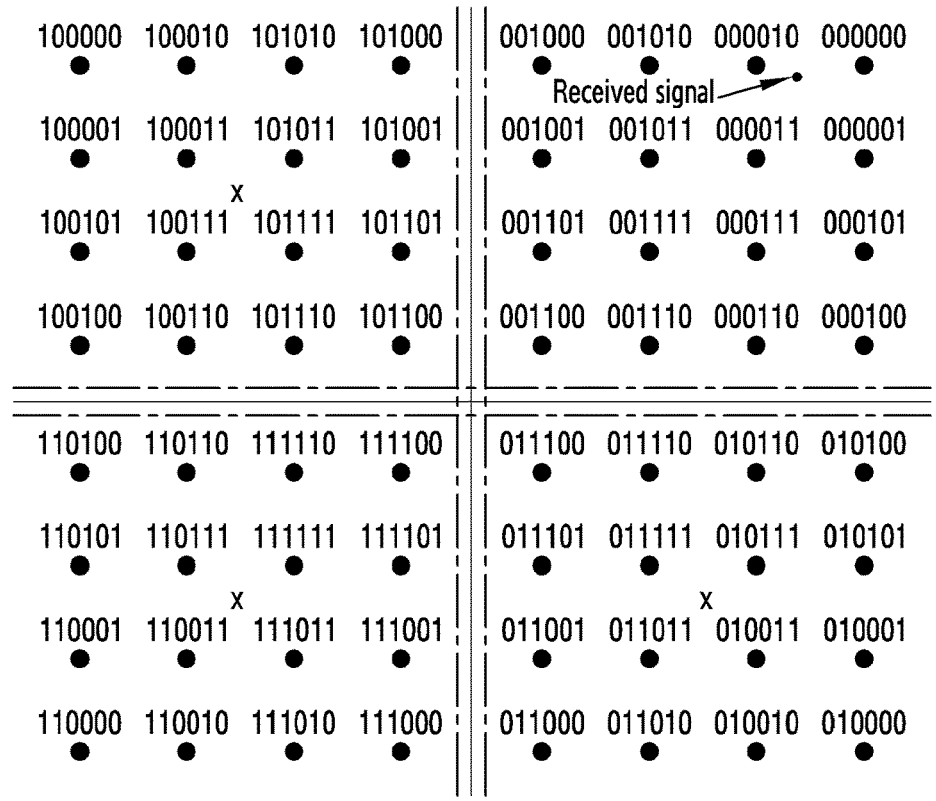
Either soft or recursive hard decoding based
on presence of the symbol in the uncertainty
region
FIG.12B → FIG.12C

[Fig. 12B]
FIG.12A
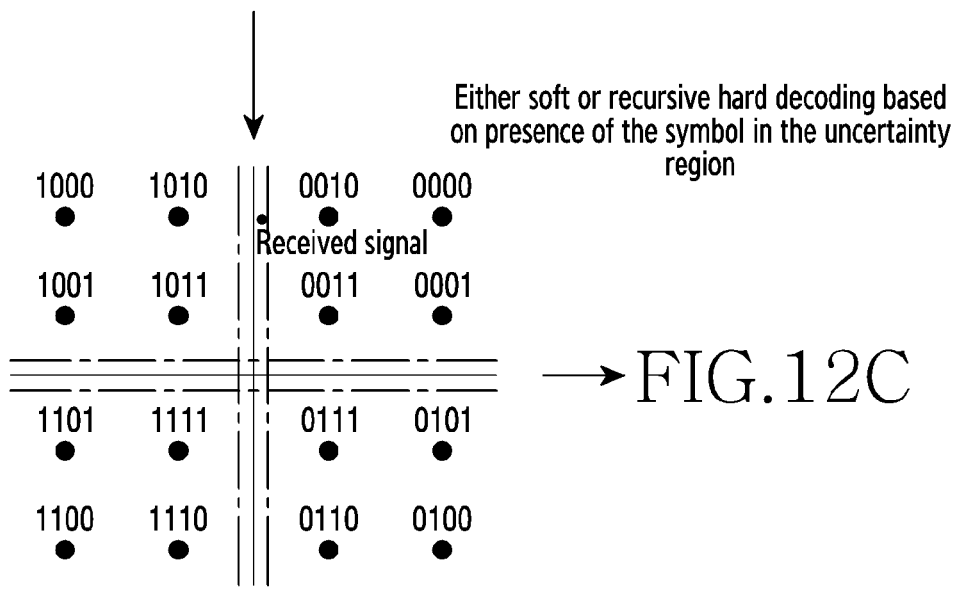
[Fig. 12C]
FIG.12A
FIG.12B
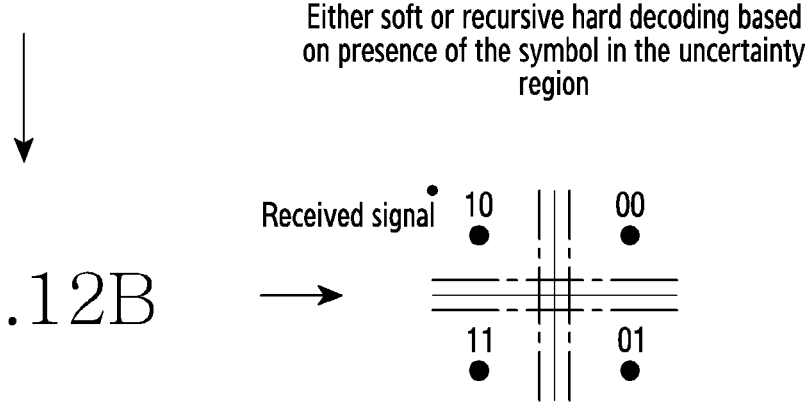

[Fig. 13A]

[Fig. 13B]
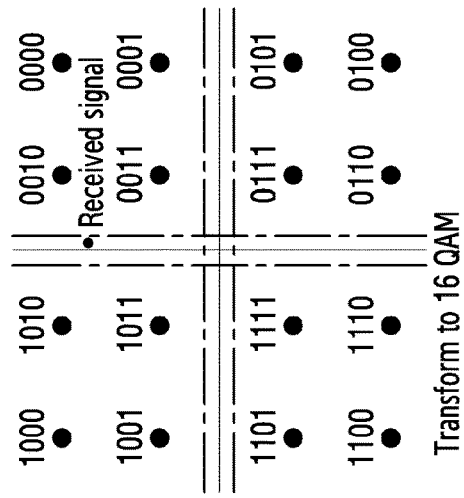
FIG. 13A
[Fig. 13C]
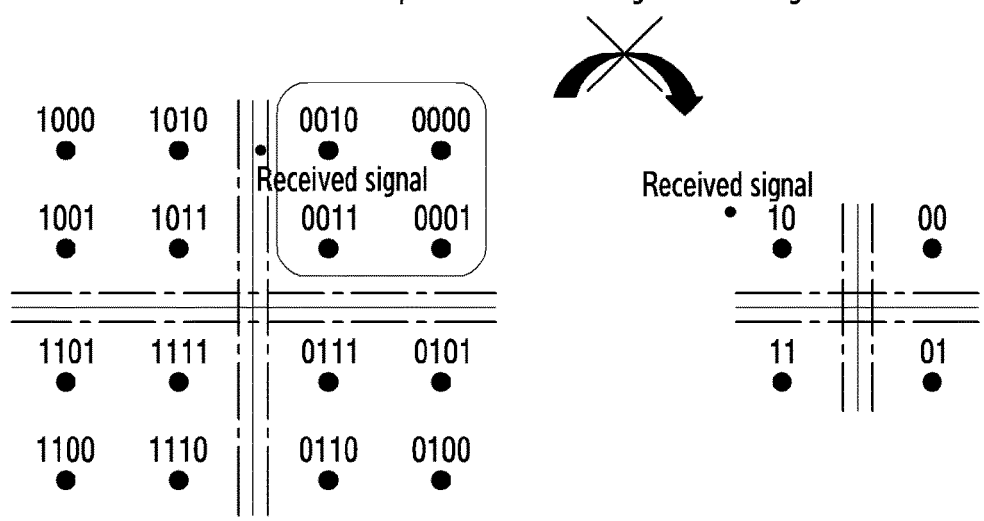

[Fig. 14A]

|  | Comparisons | Add+Sub |
|---|---|---|
| Time Complexity | X | X |

For 256 QAM, computational complexity for conventional hard decoding method and hard decoding using centroid method

| 256 QAM | Comparisons | Add+Sub | Time Complexity |
|---|---|---|---|
| Conventional hard decoding method | 30 | 0 | 30X |
| Hard decoding using centroid method | 8 | 6 | 14X |

For 1024 QAM, computational complexity for conventional hard decoding method and hard decoding using centroid method

| 1024 QAM | Comparisons | Add+Sub | Time Complexity |
|---|---|---|---|
| Hard Decoding | 62 | 0 | 62X |
| Centroid Method | 10 | 8 | 18X |

[Fig. 14B]

| Time Complexity | Comparisons | Add+Sub | Inverse | Modulus | Multiplication | Floating point Divison |
|---|---|---|---|---|---|---|
| | X | X | X | X | Y | Z |

| 256 QAM | Comparisons | Add+Sub | Inverse | Modulus | Multiplication | Floating point Divison | Time complexity |
|---|---|---|---|---|---|---|---|
| Conventional Soft Decoding | | 6 | 6 | 6 | 10 | 2 | 18X+10Y+2Z |
| Conventional Hard Decoding | 30 | | | | | | 30X |
| Centroid Method | 8 | 6 | | | | | 14X |

| 1024 QAM | Comparisons | Add+Sub | Inverse | Modulus | Multiplication | Floating point Divison | Time complexity |
|---|---|---|---|---|---|---|---|
| Conventional Soft Decoding | | 8 | 8 | 8 | 12 | 2 | 24X+12Y+2Z |
| Conventional Hard Decoding | 62 | | | | | | 62X |
| Centroid Method | 10 | 8 | 0 | | | | 18X |

[Fig. 15]
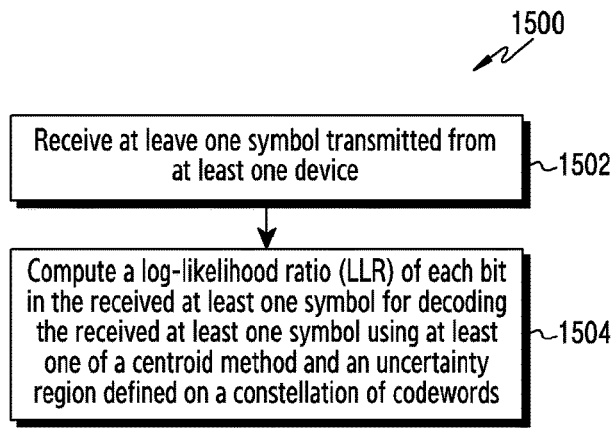
[Fig. 16A]
Step 1601: Represent the received at least one symbol on the constellation of codewords
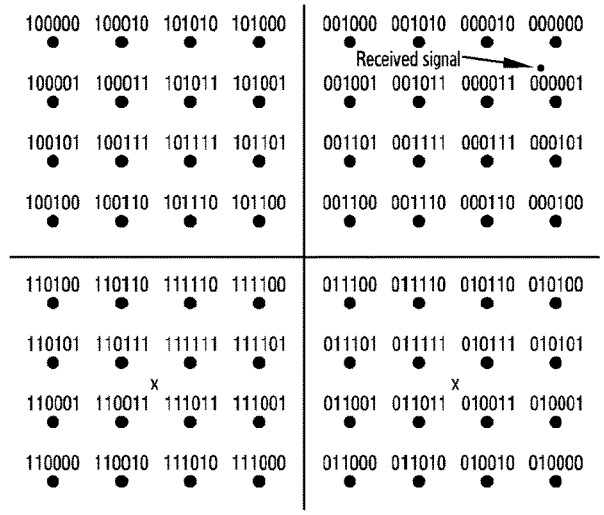
Step 1602: Perform a hard decoding to assign a plurality of decoded bits for the received at least one symbol, wherein the hard decoding includes performing steps 2a, 2b, and 2c recursively till the received symbol is transformed into an untransformable size of constellation
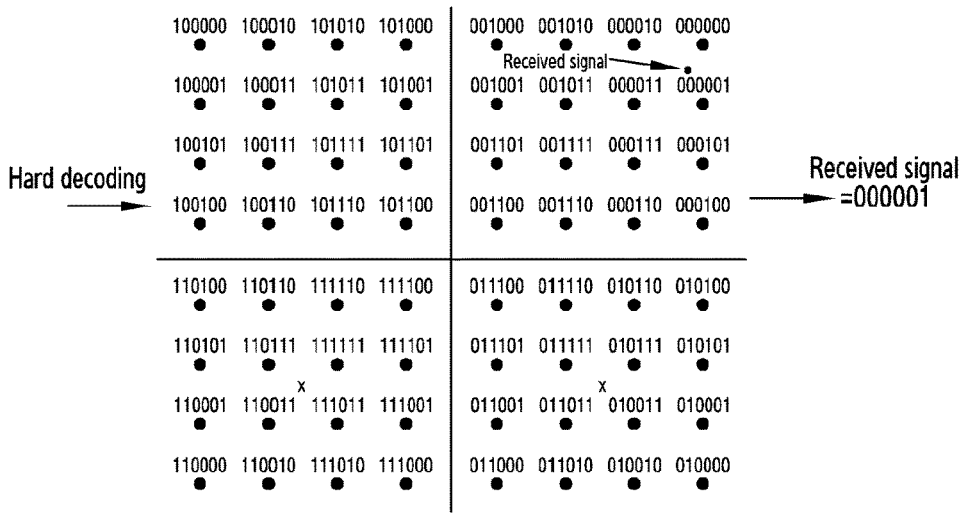

[Fig. 16B]
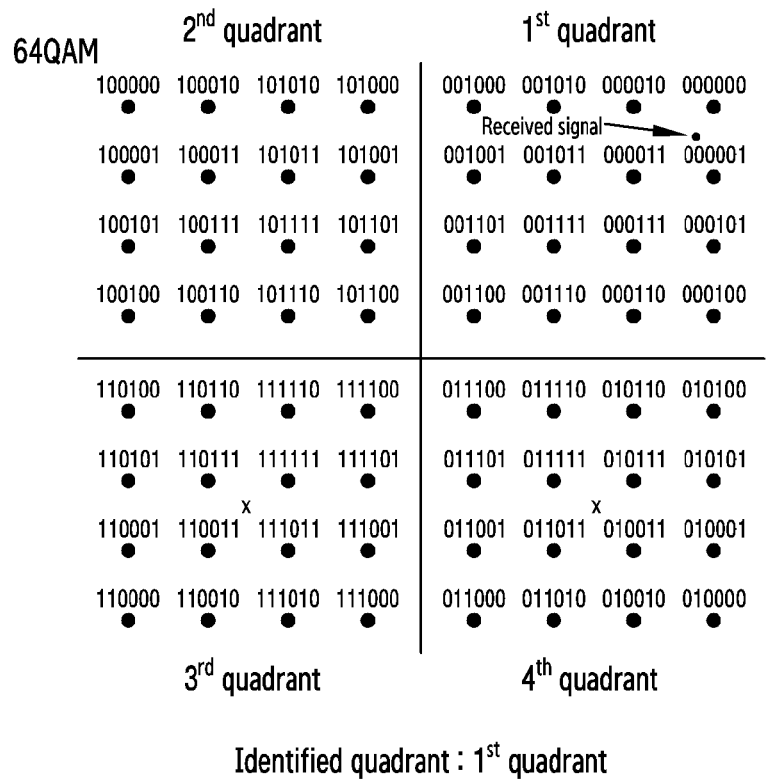

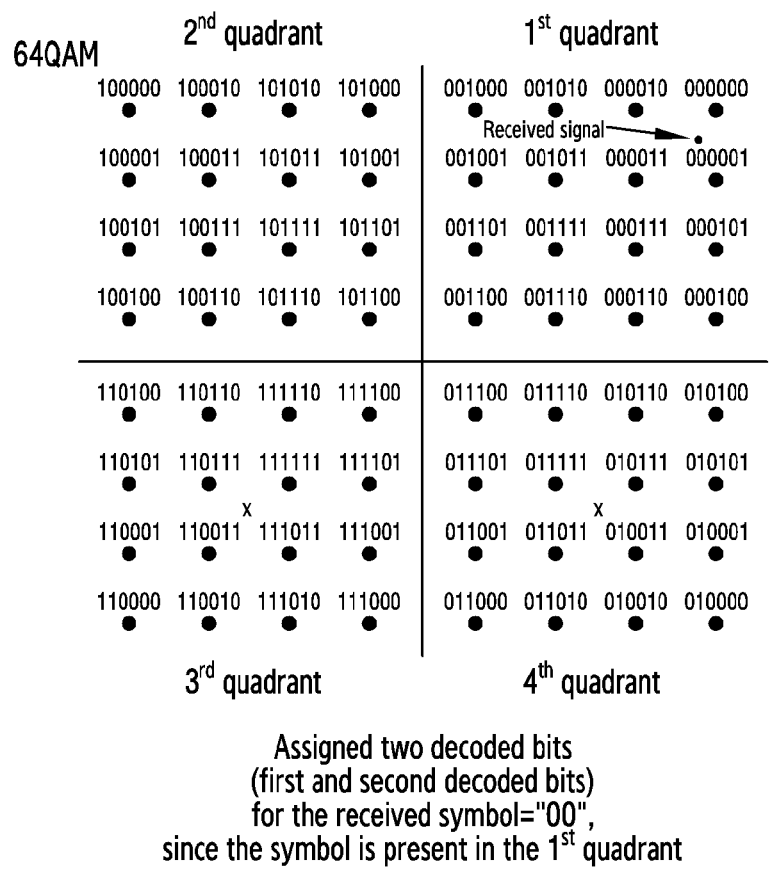
[Fig. 16C]
Step 1602b: Assign at least two decoded bits the plurality of decoded bits for the received at least one symbol based on the identified quadrant
Assigned two decoded bits
(first and second decoded bits)
for the received symbol="00",
since the symbol is present in the 1st quadrant

[Fig. 16D]
Step 1602c: Transform the received at least one symbol to the constellation of codewords of a size that is resultant from a subtraction of a centroid of the identified quadrant from the received at least one symbol
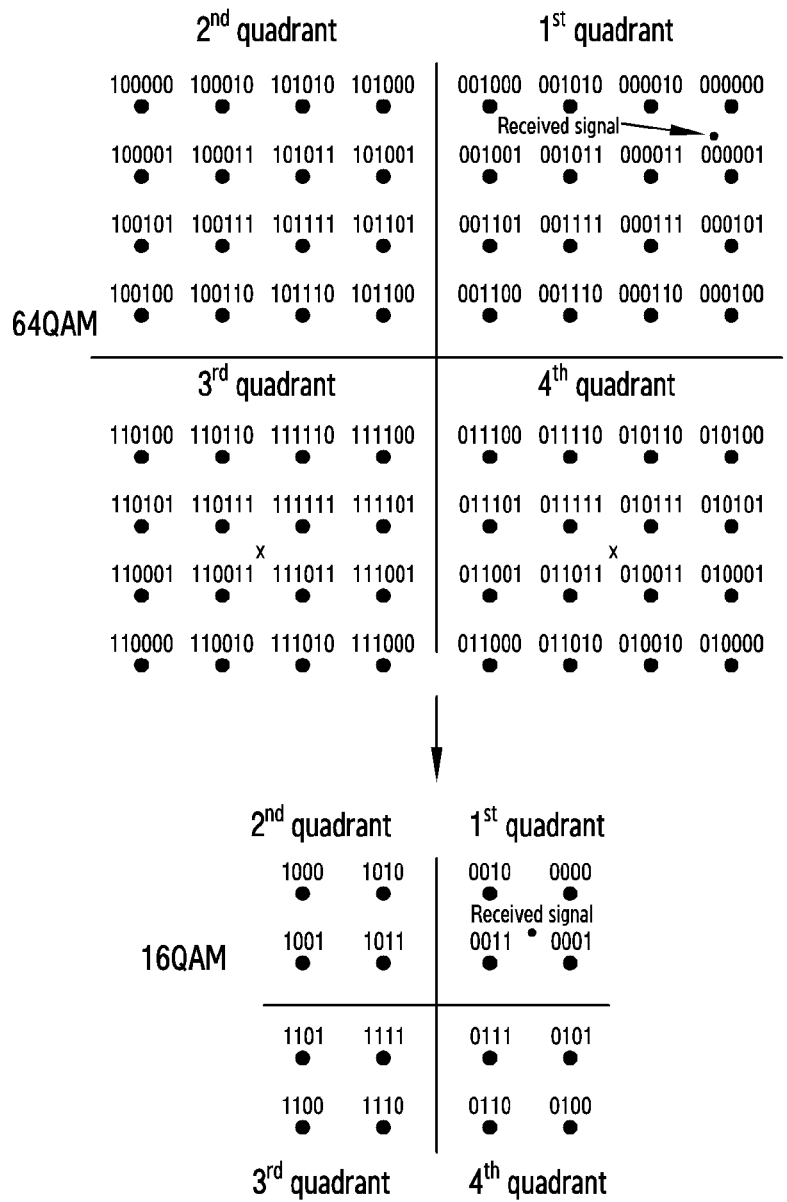

[Fig. 16E]

Repeat steps 1602a, 1602b, and 1602c, since the 16QAM is not the untransformable size constellation for the received symbol

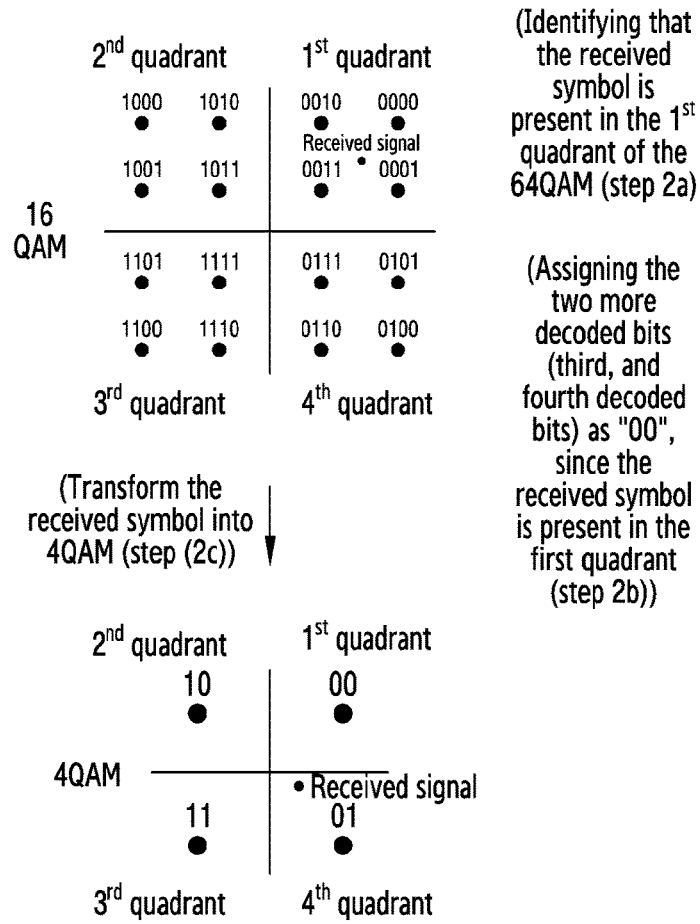

(Identifying that the received symbol is present in the 1st quadrant of the 64QAM (step 2a)

(Assigning the two more decoded bits (third, and fourth decoded bits) as "00", since the received symbol is present in the first quadrant (step 2b))

[Fig. 16F]

Repeat steps only 1602a, and 1602b, since the 4QAM is the untransformable size constellation for the received symbol

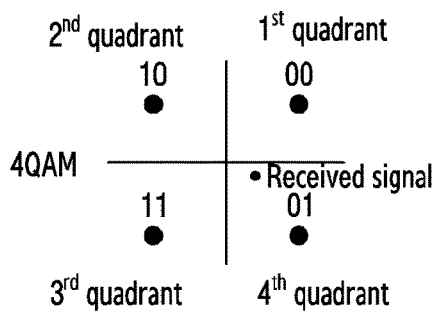

(Identifying that the received symbol is present in the 4th quadrant of the 4QAM (step 2a)

(Assigning the two more decoded bits (fourth, and fifth decoded bits) as "01", since the received symbol is present in the 4th quarant (step 2b))

[Fig. 17A]

Step 1701: Represent the received at least one symbol on the constellation of codeword, and define the uncertainty region on the constellation of codewords based on at least one parameter

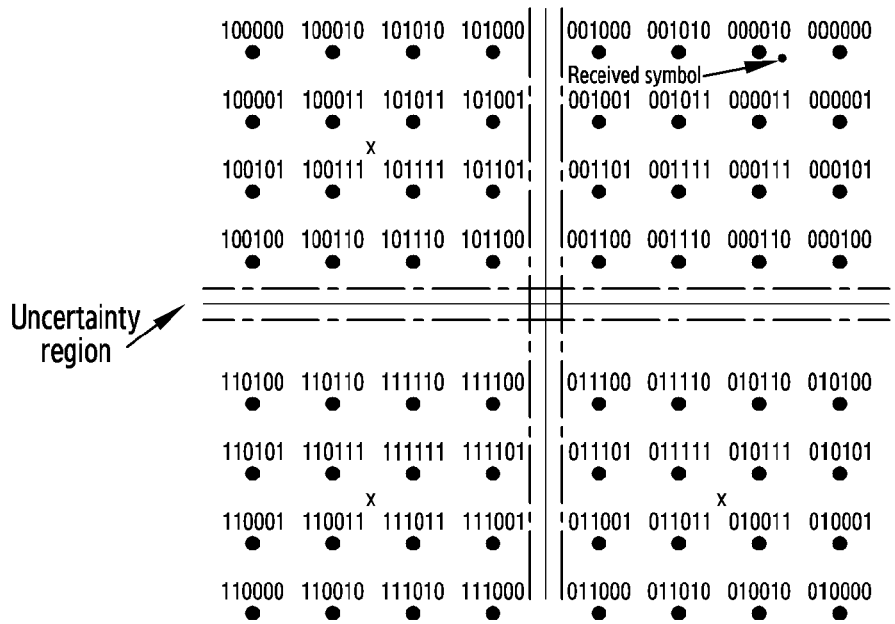

Step 1702: Perform a soft decoding on the received at least one symbol to assign the plurality of decoded bits for the received at least one symbol if the received at least one symbol is present in the uncertainty region on the represented constellation of codewords

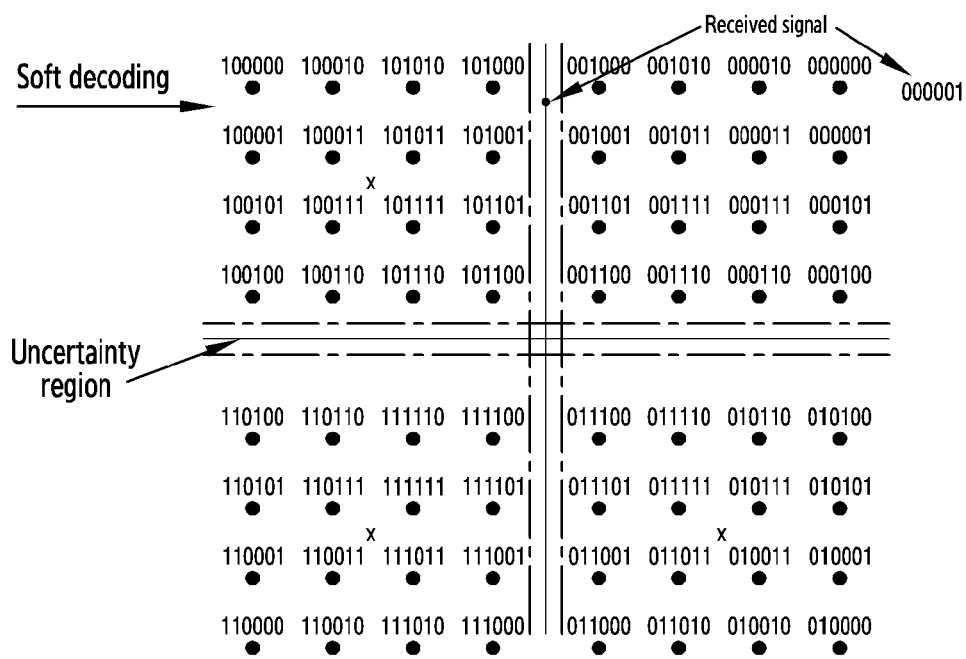

[Fig. 17B]

Step 1703: Perform at least one decoding action (1703a, 1703b, 1703c), recursively till the received at least one symbol is present in the uncurtainty region on the transformed constellation of codewords or the constellation of codewords of the untransformable size if the received at least one symbol is not present in the uncertainty region on the represented constellation of codewords Step 1703a: Transform the received at least one symbol to the constellation of codewords of the size that is resultant from the subtraction of the centroid of the identified quadrant from the received at least one symbol

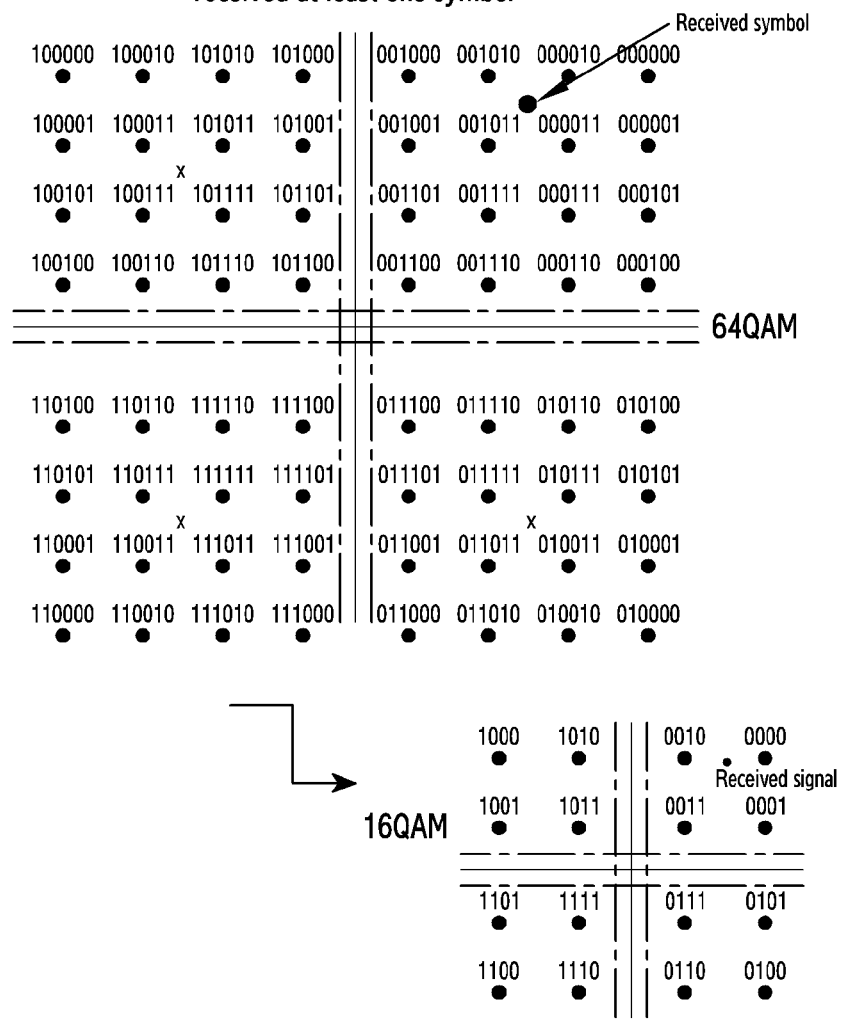

[Fig. 17C]

Step 1703b: Determine if the received at least one symbol is present in the defined uncertainty region on the transformed constellation of codewords, wherein the soft decoding is performed to assign the plurality of decoded bits to the received at least one symbol if the received at least one symbol is present in the defined uncertainty region on the transformed constellation of codewords

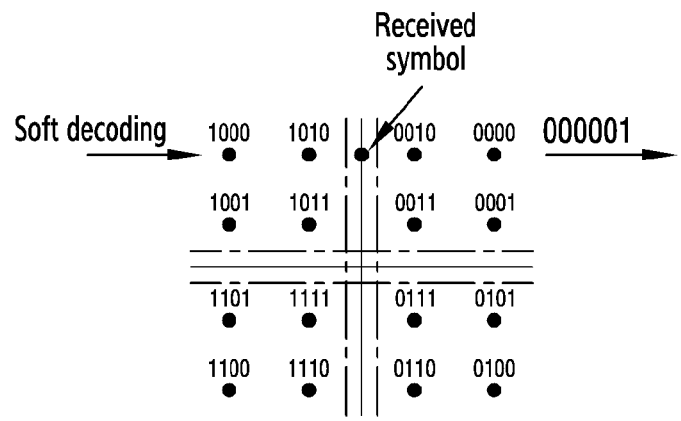

[Fig. 17D]

Repeat step 1703a if the received at least one symbol is not present in the defined uncertainty region on the transformed constellaton of codewords

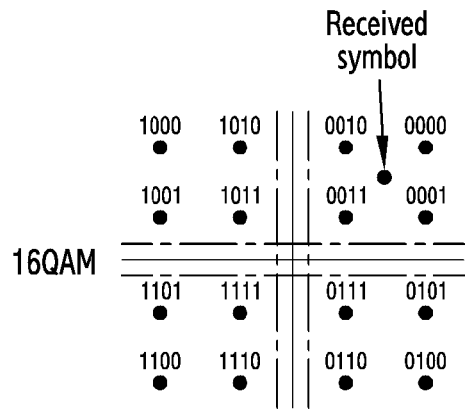

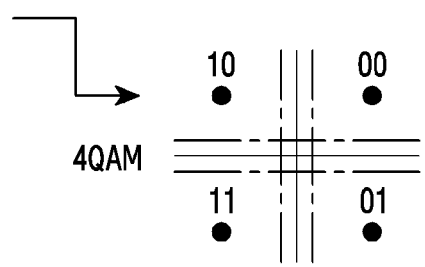

[Fig. 17E]

Repeat step 1703b: Determine if the received at least one symbol is present in the defined uncertainty region on the transformed constellation of codewords, wherein the soft decoding is performed to assign the plurality of decoded bits to the received at least one symbol if the received at least one symbol is present in the defined uncertainty region on the transformed constellation of codewords

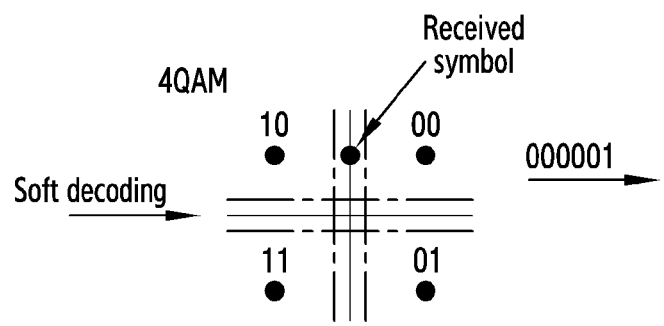

Step 1704: Perform the hard decoding on the received at least one symbol to assign the plurality of decoded bits to the received at least one symbol even if the received at least one symbol is not present in the defined uncertainty region on the constellation of codewords of the untransformable size

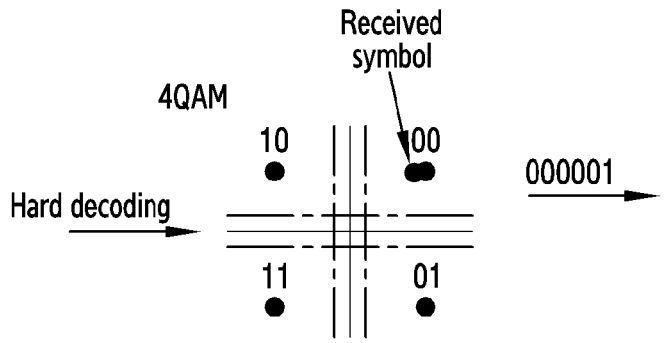

[Fig. 18]
Perform at least one of the soft decoding and the hard decoding on the received at least one symbol recursively by deriving at least two decoded bits for the receiced at least one symbol at a time on checking if the received at least one symbol is present in the defined uncertainty region of codewords
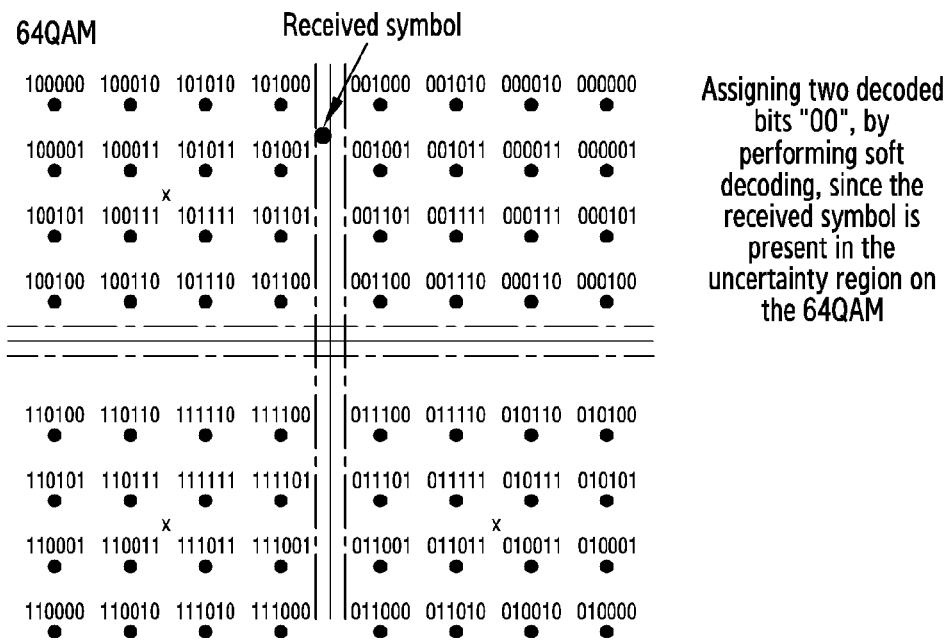
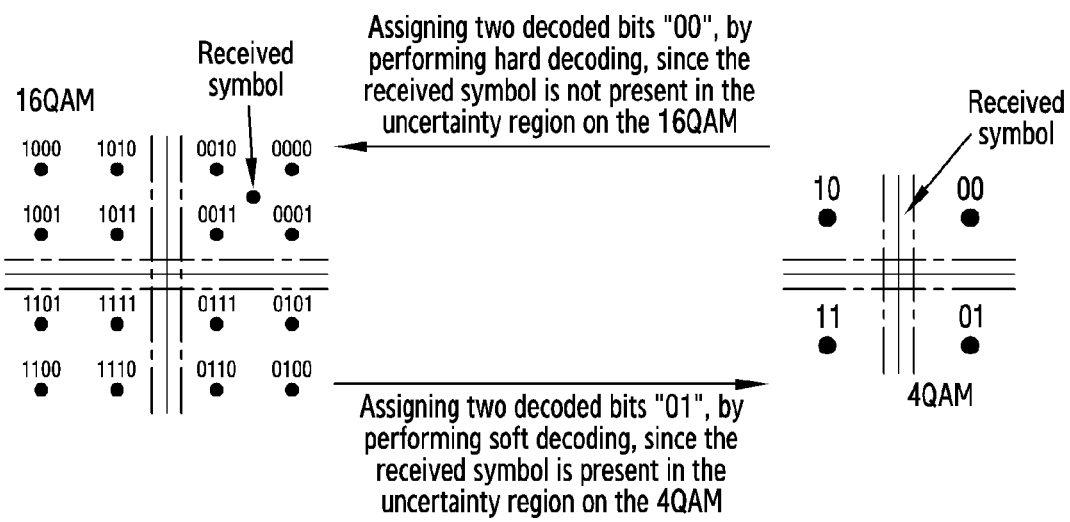

[Fig. 19A]
Step 1901: Perform the soft decoding on the received at least one symbol to assign the plurality of decoded bits for the received at least one symbol if the received at least one symbol is present in the defined uncertainty region on the represented constellation of codewords
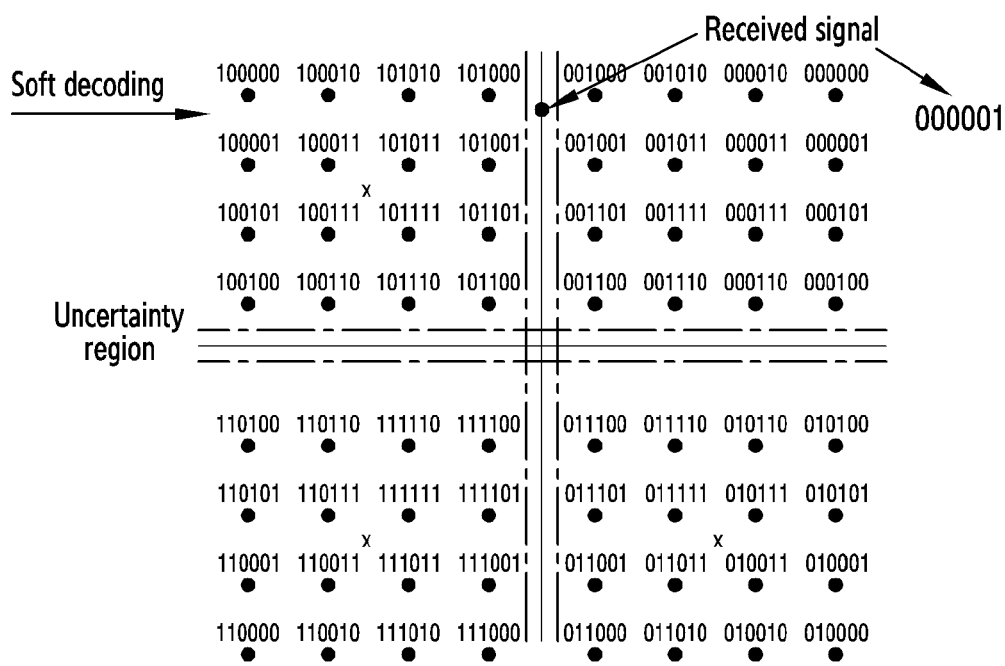

[Fig. 19B]

Step 1902: Perform at least one hard decoding action (steps 1802a, 1820b, 1802c) recursively till the received at least one symbol presents in the uncertainty region on the transformed constellation of codewords or the constellation of codewords of the untransformable size if the received at least one symbol is not present in the defined uncertainty region on the represented constellation of codewords Step 1902a: Perform the hard decoding to assign at least two decoded bits at a time for the received at least one symbol

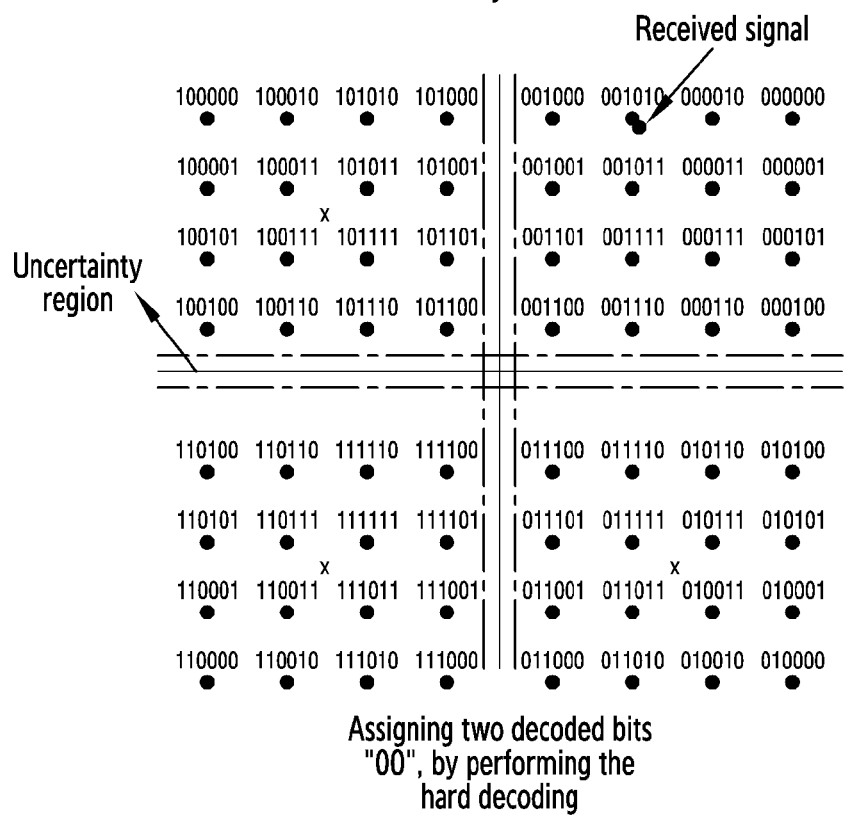

Assigning two decoded bits "00", by performing the hard decoding

[Fig. 19C]
Step 1902b: Perform the received at least one symbol to the constellation of codewords of the size that is resultant from the subtraction of the centroid of the idenified quadrant from the received at least one symbol
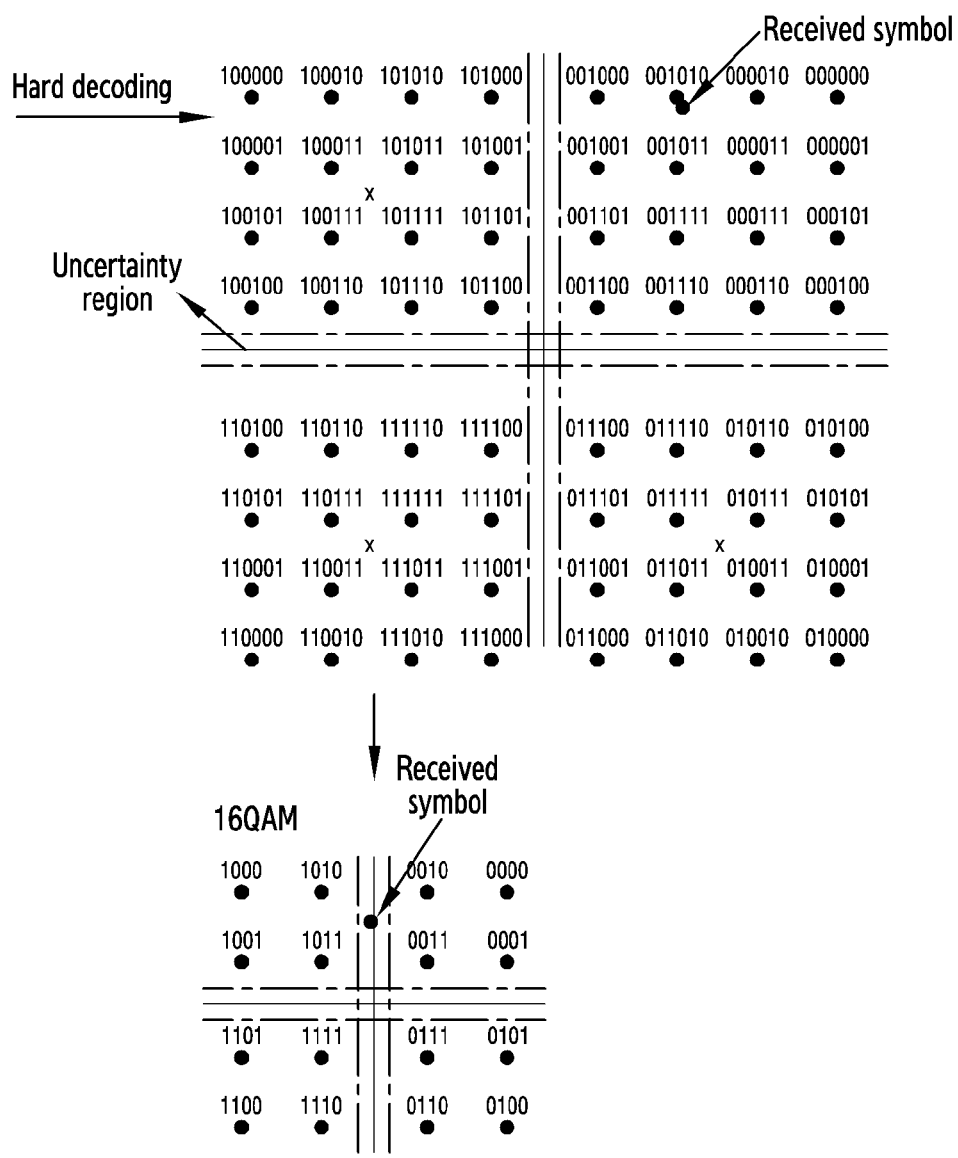

[Fig. 19D]

Step 1902c: Determine if the received at least one symbol is present in the defined uncertainty region on the transformed constellation of codewords, wherein the soft decoding is performed to assign remaining succeeding decoded bits of the plurality of bits for the received at least one symbol if the received at least one symbol is present in the defined uncertainty region on the transformed constellation of codewords,

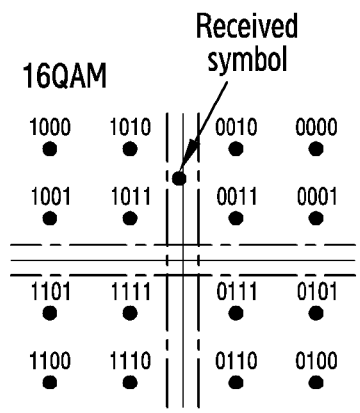

Perform soft decoding to assign four remaining decoded bits "0001" to the received symbol

METHODS AND SYSTEMS FOR OPTIMIZING COMPUTATION OF LOG-LIKELIHOOD RATIO (LLR) FOR DECODING MODULATED SYMBOLS

CROSS-REFERENCE TO RELATED APPLICATIONS

This application is a 371 of International Application No. PCT/KR2021/004146, filed Apr. 2, 2021, which claims priority to Indian Patent Application No. 202041014792, filed Apr. 2, 2020, the disclosures of which are herein incorporated by reference in their entirety.

BACKGROUND

1. Field

The present disclosure relates to the field of communication networks and more particularly to optimizing computation of log-likelihood ratio (LLR) for decoding modulated symbols at a receiver in a communication network.

2. Description of Related Art

To meet the demand for wireless data traffic having increased since deployment of 4G communication systems, efforts have been made to develop an improved 5G or pre-5G communication system. Therefore, the 5G or pre-5G communication system is also called a 'Beyond 4G Network' or a 'Post LTE System'.

The 5G communication system is considered to be implemented in higher frequency (mmWave) bands, e.g., 60 GHz bands, so as to accomplish higher data rates. To decrease propagation loss of the radio waves and increase the transmission distance, the beamforming, massive multiple-input multiple-output (MIMO), Full Dimensional MEMO (FD-MIMO), array antenna, an analog beam forming, large scale antenna techniques are discussed in 5G communication systems.

In addition, in 5G communication systems, development for system network improvement is under way based on advanced small cells, cloud Radio Access Networks (RANs), ultra-dense networks, device-to-device (D2D) communication, wireless backhaul, moving network, cooperative communication, Coordinated Multi-Points (CoMP), reception-end interference cancellation and the like.

In the 5G system, Hybrid FSK and QAM Modulation (FQAM) and sliding window superposition coding (SWSC) as an advanced coding modulation (ACM), and filter bank multi carrier (FBMC), non-orthogonal multiple access (NOMA), and sparse code multiple access (SOMA) as an advanced access technology have been developed.

Generally, in a communication system, a transmitter encodes data to obtain code bits for the data and maps the obtained code bits to modulation symbols using a suitable modulation scheme. The transmitter further generates the modulated signal by processing the modulated symbols and transmits the generated modulated signal to a receiver over a communication channel.

The receiver receives the transmitted signal and processes the received signal to obtain the modulated symbols, which have been sent by the transmitter. The receiver computes log-likelihood ratios (LLRs) for the code bits based on the received modulated symbols. The LLRs are indicative of a confidence in zero ('0') or one ('1') being sent for each code bit. For a given code bit, a positive LLR value may indicate more confidence in '0' being sent for the code bit, a negative LLR value may indicate more confidence in '1' being sent for the code bit, and an LLR value of zero may indicate equal likelihood of '0' or '1' being sent for the code bit. The receiver may then decode the LLRs to obtain the decoded data that has been transmitted by the transmitter.

In conventional approaches, the receiver may use at least one of a hard decoding and a soft decoding for computing the LLR. The hard decoding may be used to compute the LLR without any complexity, but it degrades an error performance. The soft decoding may achieve better error performance, but at a cost of significant increase in complexity. The soft decoding may involve expressions for computing the LLR. For example, the expressions may correspond to the operations such as, but not limited to, square, square-root, division, absolute, multiplication, adders, and so on. However, such operations may be expensive and may increase the complexity involved in the soft decoding: In order to reduce the complexity involved in the soft decoding, several approximations may be used. However, the approximations either suffer from a loss in the error performance or involve a sizeable amount of computation.

SUMMARY

This present invention is to provide a method and an apparatus for decoding modulated symbols in a communication network.

Also, this present invention is to provide a method and an apparatus for decoding a data in a wireless communication system.

Accordingly, the embodiments herein provide methods and systems for optimizing computation of log-likelihood ratio (LLR) for decoding modulated symbols at a receiver in a communication network. A method disclosed herein includes receiving at least one symbol transmitted from at least one device. The method includes computing a log-likelihood ratio (LLR) of each bit in the received at least one symbol using a centroid method. The method includes decoding the computed LLR to obtain decoded data corresponding to the received at least one symbol.

Accordingly, the embodiments herein provide a receiver in a communication system including a memory and a decoder. The decoder is configured to receive at least one symbol transmitted from at least one device. The decoder is further configured to compute a log-likelihood ratio (LLR) of each bit in the received at least one symbol using a centroid method. The decoder is further configured to decode the computed LLR to obtain decoded data corresponding to the received at least one symbol.

These and other aspects of the example embodiments herein will be better appreciated and understood when considered in conjunction with the following description and the accompanying drawings. It should be understood, however, that the following descriptions, while indicating example embodiments and numerous specific details thereof, are given by way of illustration and not of limitation. Many changes and modifications may be made within the scope of the example embodiments herein without departing from the spirit thereof, and the example embodiments herein include all such modifications.

Advantageous effects of this present invention are to provide a method and an apparatus for optimizing a log-likelihood ratio (LLR) computation in a wireless communication system.

BRIEF DESCRIPTION OF THE DRAWINGS

Embodiments herein are illustrated in the accompanying drawings, throughout which like reference letters indicate corresponding parts in the various figures. The embodiments herein will be better understood from the following description with reference to the drawings, in which:

FIG. 1 depicts a communication system, according to embodiments as disclosed herein;

FIG. 2 is a block diagram depicting various components of a receiver for decoding modulated symbols, according to embodiments as disclosed herein;

FIG. 3 is a block diagram depicting various components of a decoder for computing a log-likelihood ratio (LLR) to decode the modulated symbols, according to embodiments as disclosed herein;

FIG. 4 depicts an example constellation used for computing the LLR to decode the modulated symbol, according to embodiments as disclosed herein;

FIGS. 5a-5c are example diagrams depicting decoding of the modulated symbol using a centroid method, according to embodiments as disclosed herein;

FIGS. 6a-6d are example diagrams depicting the hard decoding performed using the centroid method to compute the LLR for the modulated symbol, according to embodiments as disclosed herein;

FIG. 7a depicts an example constellation including the uncertainty region, according to embodiments as disclosed herein;

FIGS. 7b and 7c are example tables depicting parameters used for defining the uncertainty region on the constellation, according to embodiments as disclosed herein;

FIGS. 8a-8c are example diagrams depicting the decoding of the received symbol by performing at least one of the soft decoding and the hard decoding using the uncertainty region, according to embodiments as disclosed herein;

FIGS. 9a-9d are example diagrams depicting the computation of the LLR for the modulated symbol by performing at least one of the soft decoding and the hard decoding using the uncertainty region, according to embodiments as disclosed herein;

FIGS. 10a-10c are example diagrams depicting the decoding of the modulated symbol by performing the combination of the soft decoding and the hard decoding using the uncertainty region, according to embodiments as disclosed herein;

FIGS. 11a-11d are example diagrams depicting the computation of the LLR for the modulated symbol using the combination of the soft decoding and the hard decoding based on the uncertainty region, according to embodiments as disclosed herein;

FIGS. 12a-12c are example diagrams depicting the decoding of the modulated symbol by performing either the soft decoding or the recursive hard decoding using the uncertainty region, according to according to embodiments as disclosed herein;

FIGS. 13a-13c are example diagrams depicting the computation of the LLR for the modulated symbol by performing either the soft decoding or the recursive hard decoding using the uncertainty region, according to according to embodiments as disclosed herein;

FIGS. 14a and 14b are example tables depicting reduced computational complexity during the computation of the LLR using the centroid method and the uncertainty region, according to embodiments as disclosed herein;

FIG. 15 is flow diagram depicting a method for decoding the modulated symbols, according to embodiments as disclosed herein;

FIGS. 16a-16f depict an example method of computing the LLR using the hard decoding, according to embodiments as disclosed herein;

FIGS. 17a-17e depict an example method of computing the LLR using the uncertainty region, according to embodiments as disclosed herein;

FIG. 18 depicts another example method of computing the using the uncertainty region, according to embodiments as disclosed herein; and FIGS. 19a-19d depict another example method of computing the LLR using the uncertainty region, according to embodiments as disclosed herein.

DETAILED DESCRIPTION

Figures 5A, 5C:

The example embodiments herein and the various features and advantageous details thereof are explained more fully with reference to the non-limiting embodiments that are illustrated in the accompanying drawings and detailed in the following description. Descriptions of well-known components and processing techniques are omitted so as to not unnecessarily obscure the embodiments herein. The description herein is intended merely to facilitate an understanding of ways in which the example embodiments herein can be practiced and to further enable those of skill in the art to practice the example embodiments herein. Accordingly, this disclosure should not be construed as limiting the scope of the example embodiments herein.

Embodiments herein disclose methods and systems for optimizing computation of a log-likelihood ratio (LLR) for decoding modulated symbols at a receiver in a communication network.

Embodiments herein disclose methods and systems for computing the LLR using a centroid method that involves exploiting symmetry of a constellation of codewords.

Embodiments herein disclose methods and systems for computing the LLR by defining an uncertainty region on the constellation of codewords.

Referring now to the drawings, and more particularly to FIGS. 1 through 19d, where similar reference characters denote corresponding features consistently throughout the figures, there are shown example embodiments.

Embodiments herein optimize computation of a log-likelihood ratio (LLR) for decoding modulated symbols at a receiver in a communication system. Embodiments herein computes the LLR using one of the below methods:

performing a hard decoding based on a centroid method, wherein the centroid method involves exploiting symmetry of a constellation of codewords;

performing at least one of a soft decoding and the hard decoding based on a presence of the modulated symbol in an uncertainty region defined on the constellation of codewords;

performing a combination of the soft decoding and the hard decoding based on the presence of the modulated symbol in the uncertainty region defined on the constellation of codewords; and performing at least one of the soft decoding and a recursive hard decoding based on the presence of the received symbol in the uncertainty region defined on the constellation of codewords.

FIG. 1 depicts a communication system 100, according to embodiments as disclosed herein. The communication system 100 referred herein can be at least one of a Centralized Radio Access Network (RAN) network, a cloud RAN network, a virtualized RAN network, a Long Term Evolution (LTE)/4G network, an LTE advanced network, a Fifth Generation/New radio (5G) network, Worldwide interoperability for Microwave Access (WiMAX/IEEE 802.16), Wi-Fi (IEEE 802.11), a 5G based wireless communication system, a 4G based wireless communication system, Wi-Fi Direct, a narrowband Internet of Things (IoT) system, a millimeter wave (mmWave) system, a centimeter-wave 5G system, and so on.

The communication system 100 includes a transmitter 102, and a receiver 104. Examples of the transmitter 102, and the receiver 104 can be, but is not limited to, a Base Band Unit (BBU), a Virtualized-Radio Access Network (V-RAN), a Cloud-RAN (C-RAN), Open-RAN (O-RAN), a Base Station (BS) (eNodeB, gNodeB, or the like), a Remote Radio Unit (RRU), a Remote Radio Head (RRH), a User Equipment (UE), a memory device, or any other device that can be capable of transferring/receiving data to/from another device. Examples of the UE can be, but is not limited to, a mobile phone, a smartphone, a tablet, a phablet, a personal digital assistant (PDA), a laptop, a computer, a wearable computing device, a vehicle infotainment device, an Internet of Things (IoT) device, a Wireless Fidelity (Wi-Fi) router, a USB dongle, and so on Examples of the memory device can be, but is not limited to, Random Access Memory (RAM), Read Only Memory (ROM), and so on. The data referred herein may be associated with at least one service session. Examples of the service session can be, but is not limited to, a voice service session, a live streaming service session, a real time gaming service session, a buffered streaming service session, a Transport Control Protocol (TCP) based session (for example; an email, a messaging service, a file transferring service, and so on), an Internet Protocol (IP) Multimedia Subsystem (MS) service, and so on.

The transmitter 102 can be configured to transfer the data to the receiver 104 over a communication channel 106. Examples of the communication channel 106 can be, but is not limited to, a wired communication link, a wireless communication link, an air interface, a fiber optic cable, an Ethernet, an intranet, the Internet, and so on. In order to transfer the data to the receiver 104, the transmitter 102 encodes the data using any suitable coding scheme and obtains code bits. The transmitter 102 maps the obtained code bits to the modulation symbols using a modulation scheme. Examples of the modulation scheme can be, but is not limited to, a Quadrature Amplitude Modulation (QAM) scheme, Quadrature Phase Shift Keying (QPSK) scheme, and so on. The transmitter 102 performs at least one processing action (for example: conversion to analog form, amplification, filtering, frequency up conversion, or the like) on the modulated symbols and generates a modulated signal corresponding to the modulated symbols. The transmitter 102 further transmits the generated modulated signal to the receiver 104 over the communication channel 106.

The receiver 104 receives the transmitted modulated signal and processes the received signal to obtain the symbols, which have been transmitted by the transmitter 102. The receiver 104 processes the received signal (for example; filters, amplifies, frequency down converts, and digitizes) to obtain digitized samples. The receiver 104 may further process the digitized samples to obtain the received symbols that have been received from the transmitter 102. The obtained symbols can be modulated symbols. The obtained modulated symbols further include a combination of a real value and a complex/imaginary value. Further, each modulated symbol may be represented by a number of bits that is decided based on the modulation scheme associated with the modulated symbol. For example, the modulated symbol may be represented by 4 bits, when a 16QAM is associated with the modulated symbol.

The receiver 104 computes Log-Likelihood ratios (LLRs) of the bits in the modulated symbols. The LLRs are indicative of a confidence in zero ('0') or one ('1') being sent for each bit. A positive LLR value may indicate more confidence in '0' being transmitted for a given bit. A negative LLR value may indicate more confidence in '1' being transmitted for the given bit. An LLR value of zero may indicate equal likelihood of '0' or '1' being transmitted for the given bit. The receiver 104 may then decode the LLRs computed for the modulated symbols to obtain the decoded data, wherein the decoded data refers to the data that has been transmitted by the transmitter 102. In an embodiment, the receiver 104 decodes the LLRs using at least one of machine learning methods, deep learning methods, Artificial Intelligence (AI) methods, and so on.

The receiver 104 uses a set of codewords for computing the LLRs for the modulated symbols. The set of codewords (hereinafter referred to as a constellation) can be a plot/two-dimensional complex plane including the plurality of bits on which the modulated symbols can be represented. The size of the constellation varies based on the modulated scheme associated with modulated symbols. In an example herein, the size of the constellation can be at least one of 4, 16, 64, 256, 1024, and so on (for example; four to the power of the modulated symbol). Further, the constellation may include four quadrants with real and complex/imaginary values/parts with signs. A first quadrant may include the real and imaginary parts of a positive sign. A second quadrant may include the real part of a negative sign and the imaginary part of the positive sign. A third quadrant may include the real and imaginary parts of the negative sign. A fourth quadrant may include the real part of the positive sign and the complex part of the negative sign.

In an embodiment, the receiver 104 performs a hard decoding on the modulated symbols using a centroid method to compute the LLRs for the modulated symbols. The centroid method involves exploiting symmetry of the constellation. Performing the hard decoding on each modulated symbol involves performing a stepwise assignment of decoded bits to each modulated symbol, wherein the assigned decoded bits represent the LLR for that modulated symbol.

In an embodiment, the receiver 104 defines an uncertainty region on the constellation and performs at least one decoding method based on the defined uncertainty region to compute the links for the modulated symbols. The uncertainty region can be a well-defined boundary/region surrounding any point in the constellation and the uncertainty region can be at different distances from any given point in the constellation. In an embodiment, the receiver 104 defines the uncertainty region on the constellation based on parameters such as, but not limited to, noise variance, average interference, User Equipment (UE) distribution, Quality of Service (QoS) requirement, instantaneous signal-to-noise-plus-interference ratio (SINR) ratio, estimated interference, average Channel Quality Indicator (CQI) information, instantaneous CQI information, available computing power, system load, bandwidth, signal to noise ratio (SNR), and so on. The at least one decoding method includes at least one of a soft decoding and the hard decoding. The hard decoding involves considering a stream of bits of the modulated symbols from a threshold stage of the receiver 104 and decoding each bit by considering each bit as '1' or '0'. The soft decoding involves considering the stream of bits of the modulated symbols and decoding the stream of bits by determining a range of possible values that may take. The soft decoding referred can be at least one of a maximum likelihood soft decision decoding method, a maximum a posteriori MAP (ML rule) based soft decoding method, and so on.

In an embodiment, the receiver 104 performs either a soft decoding or the hard decoding based on a presence of the modulated symbol in the uncertainty region on the constellation to compute the LLRs for the modulated symbols.

In an embodiment, the receiver 104 performs a combination of the soft decoding and the hard decoding based on the presence of the modulated symbol in the uncertainty region on the constellation to compute the LLRs for the modulated symbols.

In an embodiment, the receiver 104 performs either the hard decoding recursively or the soft decoding based on the presence of the modulated symbol in the uncertainty region on the constellation to compute the LLRs for the modulated symbols. Thus, computing the LLRs based on the centroid method or the uncertainty region reduces computational complexity without compromising an error performance.

In an embodiment, the receiver 104 may decide to use at least one of the centroid methods and the uncertainty region (above described methods) for computing the LLR based on at least one of the value of the parameter at the reception of the modulated symbol/signal from the transmitter 102, timing constraints, availability of computing resources, frequency resources, and so on. Examples of the parameter can be, but not limited to, based on parameters such as, but not limited to, noise variance, average interference, User Equipment (UE) distribution, Quality of Service (QoS) requirement, instantaneous signal-to-noise-plus-interference ratio (SINR) ratio, estimated interference, average Channel Quality Indicator (COI) information, instantaneous COI information, available computing power, system load, bandwidth, signal to noise ratio (SNR), and so on.

FIG. 1 shows exemplary elements of the communication system 100, but it is to be understood that other embodiments are not limited thereon. In other embodiments, the communication system 100 may include less or a greater number of elements/units. Further, the labels or names of the units are used only for illustrative purpose and does not limit the scope of the embodiments herein. One or more units can be combined together to perform same or substantially similar function in the communication system 100.

FIG. 2 is a block diagram depicting various components of the receiver 104 for computing the LLR for decoding the modulated symbols received from the transmitter 102, according to embodiments as disclosed herein. The receiver 104 includes at least one antenna 202, at least one Radio Frequency (RF) transceiver 204, a processing circuitry 206 (including a transmission (Tx) processing circuitry 206a, and a reception (Rx) processing circuitry 206b), an interface 208, a memory 210, and a controller 212.

The antenna 202 can be configured to receive the RF signals from the transmitter 102 over the communication channel 106. The RF signals may be the modulated signals that have been transmitted by the transmitter 102. The antenna 202 provides the received signals to the RF transceivers 204.

The RF transceiver 204 can be configured to generate Intermediate Frequency (IF) signals/baseband signals by down converting the received RF signals. The RF transceiver 204 may provide the generated IF signals to the Rx processing circuitry 206b.

The Rx processing circuitry 206b can be configured to perform at least one processing action (filtering, decoding, digitizing the IF signals (conversion of analog to digital form), and so on) on the IF signals. The RX processing circuitry 206b provides the processed IF signals to the processor 208 for further processing.

The Tx processing circuitry 206a can be configured to receive analog/digital data from the controller 212. The Tx processing circuitry 206a generates the IF signals by performing at least one of encoding the received data, multiplexing the received data, and so on. The Tx processing circuitry 206a further provides the generated IF signals to the RF transceivers 204. The RF transceivers 204 further up-converts the received IF signals to the RF signals and transmits the RF signals to the at least one external entity (the transmitter 102, or any other device) via the antennas 202.

The interface 208 can be configured to enable the receiver 104 to communicate with the at least one external entity over the communication channel 106. Examples of the interface 208 can be at least one of a wired or wireless fronthaul interface, a wired or wireless backhaul interface, or any structure supporting communications over a wired or wireless connection.

The memory 210 can store at least one of the received decoded symbols, the LLRs computed for the received symbols, results of the hard decoding, the soft decoding, or the like, the decoded data, the constellation, and so on. The memory 210 may also include program code that can be used for at least one of computing the LLRs for the received symbols, controlling operations of the receiver 104, and so on. The memory 210 may include one or more computer-readable storage media. The memory 210 may include non-volatile storage elements. Examples of such non-volatile storage elements may include magnetic hard discs, optical discs, floppy discs, flash memories, or forms of electrically programmable memories (EPROM) or electrically erasable and programmable (EEPROM) memories. In addition, the memory may, in some examples, be considered a non-transitory storage medium. The term "non-transitory" may indicate that the storage medium is not embodied in a carrier wave or a propagated signal. However, the term "non-transitory" should not be interpreted to mean that the memory is non-movable. In some examples, the memory can be configured to store larger amounts of information than the memory. In certain examples, a non-transitory storage medium may store data that can, over time, change (e.g., in Random Access Memory (RAM) or cache).

The controller 212 includes at least of a processing unit 212a and a decoder 212b. The processing unit 212a can be at least one of a single processor, a plurality of processors, multiple homogeneous or heterogeneous cores, multiple Central Processing Units (CPUs) of different kinds, microcontrollers, special media, and other accelerators. The processing unit 212a can be configured to control operations of the receiver 104 by executing the program code stored in the memory 210. In an embodiment, the processing unit 212a can be the decoder 212b, which can perform the intended functions of the decoder 212b.

The decoder 212b can be configured to decode the data that has been received from the transmitter 102. The decoder 212b receives the IF signals (corresponding to the received modulated signals from the transmitter 102) from the Rx processing circuitry 206b and processes the IF signals to obtain the samples. The processing the IF signals involves filtering, amplifying, frequency down converting, digitizing, equalizing the IF signals and so on. The decoder 212b further processes the samples (for example: for coding division multiplexing (CDM), frequency division multiplexing (FDM), orthogonal frequency division multiplexing (OFDM), single-carrier FDM (SC-FDM), and so on) to obtain the symbols that are modulated and encoded.

The decoder 212b computes the LLRs for decoding the modulated symbols and uses the computed LLR to derive the decoded data, which has been transmitted by the transmitter 102. The decoder may perform at least one suitable decoding method (for example: Turbo decoding method, Viterbi decoding method or the like) on the computed LLR to derive the data. The decoder 212b provides the decoded data to the processing unit 212a for further operations. The decoder 212b may also store the decoded data in the memory 210.

In an embodiment, the decoder 212b computes the LLRs for the modulated symbols using the centroid method with functions. In an example herein, the functions can be at least one of an adder and a subtractor. Further, the centroid method involves exploiting the symmetry of the constellation to compute the LLRs.

In an embodiment, the decoder 212b computes the LLRs for the modulated symbols using the uncertainty region defined on the constellation. Thus, the LLR can be computed without any computational complexity.

The decoder 212b includes a hard decoding module 302, an uncertainty region defining module 304, and an uncertainty region based decoding module 306 for computing the LLRs for decoding the modulated symbol(s).

The decoder 212b operates the hard decoding module 302 for performing the hard decoding based on the centroid method to compute the LLR. The decoder 212b operates the uncertainty region defining module 304 and the uncertainty region based decoding module 306 for defining the uncertainty region on the constellation and performing the decoding based on the defined uncertainty region to compute the LLR. In an embodiment, the decoder 212b operates the modules 302-306 based on values of the parameters at a time of reception of the modulated signals/symbols from the transmitter 102. Examples of the parameters can be, but not limited to, noise variance, average interference, User Equipment (UE) distribution, Quality of Service (QoS) requirement, instantaneous signal-to-noise-plus-interference ratio (SINR) ratio, estimated interference, average Channel Quality Indicator (CQI) information, instantaneous CQI information, available computing power, system load, bandwidth, signal to noise ratio (SNR), and so on. In an example, the decoder 212b may operate the hard decoding module 302, when the modulated signals/symbols have been received from the transmitter 102 with less noise variance. In an example, the decoder 212b may operate the uncertainty region defining module 304 and the uncertainty region based decoding module 306, when the modulated signals/symbols have been received from the transmitter 102 with high noise variance.

The hard decoding module 302 can be configured to compute the LLR for decoding the modulated symbol by performing the hard decoding using the centroid method. The hard decoding module 302 represents the modulated symbol on the constellation, wherein the size of the constellation corresponds to the modulated scheme associated with the modulated symbol. The hard decoding module 302 checks the sign of the real and imaginary values/parts of the modulated symbol and identifies the quadrant on the constellation in which the modulated symbol is present. For identifying the quadrant, the hard decoding module 302 compares the sign of the real and imaginary values of the modulated symbol with the signs of the real and imaginary parts of each quadrant. The hard decoding module 302 further identifies the quadrant as the quadrant in which the modulated symbol falls if the sign of the real and imaginary parts of that quadrant matches with the signs of the real and imaginary values of the modulated symbol.

Based on the identified quadrant, the hard decoding module 302 assigns a plurality of decoded bits to the modulated symbol. In an example herein, the hard decoding module 302 assigns two decoded bits to the modulated symbol. The hard decoding module 302 transforms the modulated symbol to the constellation of a size resultant from a subtraction of a centroid of the identified quadrant from each real and imaginary value of the modulated symbol. The centroid is a constellation point that has least distance from the represented symbol on the constellation. The hard decoding module 302 further performs the steps of identifying the quadrant on the plotted constellation in which the modulated symbol is present, assigning the plurality of decoded bits and transferring the received symbol to the constellation of the size resultant from the subtraction of the centroid of the identified quadrant from the modulated symbol recursively till the modulated symbol has been transformed into the constellation of untransformable size. The constellation with the untransformable size can be a constellation from which the received symbol cannot be transformed into another recursively or the constellation on which all the decoded bits can be assigned to the modulated symbol. For example, the untransformable size for the modulated symbol associated with the 64QAM may be 16/16QAM, 4/4QAM or the like, the untransformable size for the modulated symbol associated with the 256QAM may be 16QAM, or the like. The decoded bits assigned to the modulated symbol on each constellation may represent the LLR for the modulated symbol.

Consider an example scenario, wherein the hard decoding module 302 receives the modulated symbol, wherein the real and imaginary values of the modulated symbol are of the positive sign. The hard decoding module 302 represents/plots the modulated symbol on the constellation of the size corresponding to the modulation scheme associated with the modulated symbol (in an example herein, consider that the size of the constellation can be 64QAM). The hard decoding module 302 then checks the sign of the modulated symbol to identify the quadrant on the 64QAM in which the modulated symbol is present. As the real and imaginary values of the modulated symbol are of the positive sign, the hard decoding module 302 identifies that the modulated symbol is present in the first quadrant on the 64QAM. The hard decoding module 302 further assigns first and second decoded for the modulated symbol based on the values of the first quadrant. The hard decoding module 302 transforms the modulated symbol into the constellation of the size (for example: 16QAM) that is resultant from subtraction of the centroid of the identified quadrant (for example; the centroid can be 4A, as the identified quadrant is the first quadrant of the constellation of 64QAM) from the real and imaginary values of the modulated symbol.

On transferring the modulated symbol into the 16QAM, the hard decoding module 302 identifies the quadrant on the 16QAM in which the modulated symbol is present based on the sign of the real and the imaginary values of the modulated symbol. In an example herein, consider that the modulated symbol transformed into the 16QAM has the real and imaginary values of the positive sign. As the modulated symbol transformed into the 16QAM has the real and imaginary values of the positive sign, the hard decoding module 302 identifies that the first quadrant on the 16QAM as the quadrant in which the modulated symbol is present and accordingly assigns third and fourth decoded bits for the modulated symbol. The hard decoding module 302 transforms the modulated symbol into the constellation of the size (in an example herein, 4QAM) that is resultant the subtraction of the centroid of the identified quadrant (for example, the centroid can be 2A) from the real and imaginary values of the modulated symbol.

After transforming the modulated symbol into the 4QAM, the hard decoding module 302 checks for the quadrant on the 4QAM in which the modulated symbol is present based on the sign of the real and the imaginary values of the transformed modulated symbol. In an example herein, consider that the modulated symbol transformed into the 4QAM has the real value of the positive sign and the imaginary value of the negative sign. As the modulated symbol transformed into the 4QAM has the real value of the positive sign and the imaginary value of the negative sign, the hard decoding module 302 identifies that the fourth quadrant on the 4QAM as the quadrant in which the modulated symbol is present. Accordingly, the hard decoding module 302 assigns fifth decoded bit and sixth decoded bits for the modulated symbol. After assigning the decoded bits for the modulated symbol on the 4QAM, the hard decoding module 302 accumulates all the assigned six decoded bits, which can represent the LLR for the modulated symbol.

The uncertainty region defining region 304 can be configured to define the uncertainty region/uncertain decision region on the constellation, which can be used for computing the LLR for the modulated symbol. The uncertainty region can be the decision boundary defined on the constellation/complex plane. In an embodiment, the uncertainty-defining region 304 estimates width of the sides of the uncertainty region/decision boundary based on the parameters such as, but not limited to, noise variance, average interference, User Equipment (UE) distribution, Quality of Service (QoS) requirement, instantaneous signal-to-noise-plus-interference ratio (SINR) ratio, estimated interference, average Channel Quality Indicator (CQI) information, instantaneous CQI information, available computing power, system load, bandwidth, signal to noise ratio (SNR), and so on.

Embodiments herein are further explained considering the noise variance and the average interference as examples of the parameters for estimating the width of the sides of the uncertainty region, but it may be obvious to a person skilled in the art that any other parameters may be considered for estimating the width of the uncertainty region.

In an example herein, the width of the uncertainty region ($\varepsilon$) can be estimated using the below equation:

$$\varepsilon = k(\sigma)^2$$

wherein, k can be a positive constant and $(\sigma)^2$ can be the noise variance and the average interference.

In an embodiment, the uncertainty region defining module 304 may estimate minimum and maximum values of the width ($\varepsilon$) of the uncertainty region. In an example herein, minimum value of the width of the uncertainty region ($\varepsilon$) can be zero. The uncertainty region defining module 304 may estimate the maximum value of the width of the uncertainty region ($\varepsilon$) using the below equation:

$$2\varepsilon = \frac{d_{min}}{2}$$

wherein, $d_{min}$ can be a minimum distance between two points in the constellation and $d_{min}$ may be calculated as:

$$d_{min} = \sqrt{\frac{P}{\eta}}$$

wherein, P can be transmit symbol power (according to 3GPP specification, the transmit symbol power can be 1 unit) and $\eta$ can be a constant that can be decided based on the size of the constellation. For example, the value of $\eta$ may be 2, 10, 42, and 170 for the constellations of 4QAM, 16QAM, 64QAM, and 256QAM respectively.

In an embodiment, the uncertainty region defining module 304 may vary the width of the uncertainty region as a function of the parameters. Examples of the parameters can be, but not limited to, User Equipment (UE) distribution, Quality of Service (QoS) requirement, instantaneous signal-to-noise-plus-interference ratio (SINR) ratio, signal to noise ratio (SNR), estimated interference, average Channel Quality Indicator (CQI) information, instantaneous CQI information, available computing power, system load, bandwidth, and so on. The width of the uncertainty region can be dynamically varied based on a change in values of the parameters of the receiver 104.

In an example herein, the uncertainty region defining module 304 may vary the width of the uncertainty region based on the different SNR ranges. The SNR ranges can be determined based on target BLER and/or availability of computational resources. The SNR ranges may not be uniform always. For small SNR, the SNR ranges may be selected with more granularities and for higher SNR, the SNR ranges may be selected with less values.

In an example herein, the uncertainty region defining module 304 may vary the width of the uncertainty region based on the SINR. A relation between the width ($\varepsilon$) of the uncertainty region and the SINR may be represented as:

$$SINR \alpha 1/(\text{Noise} + \text{Interference})$$

$$SINR \alpha \frac{1}{\varepsilon}, \{\varepsilon = k(\sigma)^2\}$$

wherein, if the SINR is high, the width ($\varepsilon$) of the uncertainty region may have smaller value and vice versa.

In an example herein, the uncertainty region defining module 304 may vary the width of the uncertainty region based on at least one of long term SINR, short term SINR average SINR, average interference, estimated interference, and so on. If at least one of the long term SINR, the short term SINR, the average SINR, the average interference, the estimated interference, and so on is high, the width of the uncertainty region may have smaller value and vice versa.

In an example herein, the uncertainty region defining module 304 may vary the width of the uncertainty region based on the QoS requirement. The width of the uncertainty region may have the smaller value in order to achieve a lower QoS (for example: one error in 103 packets) and the width of the uncertainty region may have the maximum value in order to achieve a high QoS (for example: one error in 106 packets).

In an example herein, the uncertainty region defining module 304 may vary the width of the uncertainty region based on the availability of the computing resources at centralized nodes (such as the BBU, the V-RAN the C-RAN, or the like). If the computing resources are more at the centralized nodes, the uncertainty region may have the maximum value. If the computing resources are less, the uncertainty region may have smaller values.

In an example herein, the uncertainty region defining module 304 may vary the width of the uncertainty region based on the CQI. If the CQI is good (i.e., the channel is good), the width of the uncertainty region may have the smaller value. If the CQI is bad (i.e., the channel is bad), the width of the uncertainty region may have the maximum value.

The uncertainty region based decoding module 306 can be configured to compute the LLR for the modulated symbol based on the uncertainty region defined on the constellation.

In an embodiment, the uncertainty region based decoding module 306 performs either the hard decoding or the soft decoding based on the presence of the modulated symbol in the uncertainty region for computing the LLR. The uncertainty region based decoding module 306 represents the modulated symbol in the constellation of size corresponding to the modulation scheme associated with the modulated symbol, wherein the constellation includes the uncertainty region. Thereafter, the uncertainty region based decoding module 306 checks the sign of the modulated symbol based on its real and imaginary values and identifies the quadrant in which the modulated symbol is present. After identifying the quadrant, the uncertainty region based decoding module 306 checks if the modulated symbol is present in the uncertainty region. If the modulated symbol is present in the uncertainty region, the uncertainty region based decoding module 306 performs the soft decoding on the modulated symbol and assigns the decoded bits to the modulated symbol, wherein the decoded bits represent the LLR for the modulated symbol. The soft decoding involves considering the stream of bits of the modulated symbols and decoding the stream of bits by determining a range of possible values that may take. The soft decoding referred can be at least one of a maximum likelihood soft decision decoding method, a ML rule based soft decoding method, and so on.

If the modulated symbol is not present in the uncertainty region, the uncertainty region based decoding module 306 recursively transforms the modulated symbol into the constellation of the size that is resultant from the subtraction of the centroid of the identified quadrant from each real and imaginary value of the modulated symbol, identifying the quadrant on the transformed constellation and checking if the modulated symbol is present in the uncertainty region on the transformed constellation till the modulated symbol is present into the uncertainty region or till the modulated symbol has been transformed into the constellation of the untransformable size. If the modulated symbol is present in the uncertainty region at any stage, the uncertainty region based decision module 304 performs the soft decoding and assigns the decoded bits, which can be the LLR of the modulated symbol. If the modulated symbol is not present in the uncertainty region even after transforming the modulated symbol into the constellation of the s untransformable size, then the uncertainty region based decision module 304 instructs the hard decoding module 302 to perform the hard decoding on the modulated symbol to compute the LLR for the modulated symbol.

Consider an example scenario, wherein the uncertainty region based decision module 306 receives the modulated symbol and the real and imaginary values of the modulated symbol are of the positive sign. The uncertainty region based decision module 306 represents/plots the modulated symbol on the constellation (including the uncertainty region) of the size corresponding to the modulation scheme associated with the modulated symbol (in an example herein, consider that the size of the constellation can be 64QAM). The uncertainty region based decision module 306 then checks the sign of the modulated symbol to identify the quadrant on the 64QAM in which the modulated symbol is present. As the real and imaginary values of the modulated symbol are of the positive sign, the uncertainty region based decision module 306 identifies that the modulated symbol is present in the first quadrant on the 64QAM. After identifying the quadrant, the uncertainty region based decision module 306 checks if the modulated symbol is present in the uncertainty region on the 64QAM. In an example herein, consider that the modulated symbol fall in the uncertainty region on the identified quadrant of the 64QAM. In such a case, the uncertainty region based decision module 306 performs the soft decoding on the modulated symbol and assigns the decoded bits to the modulated symbol, wherein the decoded bits represent the LLR computed for the modulated symbol.

In an example herein, consider that the modulated symbol is not present in the uncertainty region on the 64QAM. In such a case, the uncertainty region based decision module 306 transforms the modulated symbol into the 16QAM (shifting the origin) by subtracting the centroid of the identified quadrant (for example: 4A) from each real and imaginary value of the modulated symbol. After transforming the modulated symbol into the 16QAM, the uncertainty region based decision module 306 identifies the quadrant on the 16QAM in which the modulated symbol is present and checks if the modulated symbol is present in the uncertainty region on the 16QAM. In an example herein, consider that even after transforming into the 16QAM, the modulated symbol is not present into the uncertainty region. In such a case, the uncertainty region based decision module 306 further transforms the modulated symbol into the 4QAM (shifting the origin) by subtracting the centroid of the identified quadrant (for example: 2A) from each real and imaginary value of the modulated symbol. After transforming the modulated symbol into the 4QAM, the uncertainty region based decision module 306 identifies the quadrant on the 4QAM in which the modulated symbol is present and checks if the modulated symbol is present into the uncertainty region on the 4QAM. In an example herein, consider that the modulated symbol is not present into the uncertainty region on the 4QAM also. In such a case, the uncertainty region based decision module 306 instructs the hard decoding module 302 to perform the hard decoding on the modulated symbol for assigning the decoded bits for the modulated symbol, wherein the assigned decoded bits represent the LLR.

In an embodiment, the uncertainty region based decoding module 306 analyzes the real and imaginary values of the modulated symbol separately with respect to the defined uncertainty region on the constellation for computing the LLR for the modulated symbol.

In an embodiment, for computing the LLR, the uncertainty region based decoding module 306 checks if the real value of the modulated symbol is present in the uncertainty region after representing the modulated symbol on the constellation. If the real value of the modulated symbol is present in the uncertainty region, the uncertainty region based decoding module 306 performs the soft decoding on the real value of the modulated symbol and assigns the decoded bits to the real value of the modulated symbol, wherein the real value of the decoded bits represent the LLR for the real value of the modulated symbol. If the real value of the modulated symbol is not present in the uncertainty region on the transformed constellation, the uncertainty region based decoding module 306 recursively transforms the real value of the modulated symbol into the constellation of the succeeding size by subtracting the centroid of the identified quadrant from the real value of the modulated symbol and checks if the real value of the modulated symbol is present in the uncertainty region till the real value of the modulated symbol is present in the uncertainty region or till the real value of the modulated symbol has been transformed into the constellation of the untransformable size. If the real value of the modulated symbol is present in the uncertainty region at any stage, the uncertainty region based decision module 304 performs the soft decoding on the real value of the modulated symbol. If the real value of the modulated symbol is not present in the uncertainty region even after transforming the modulated symbol into the constellation of the untransformable size, then the uncertainty region based decision module 304 instructs the hard decoding module 302 to perform the hard decoding on the modulated symbol to compute the LLR for the modulated symbol and accordingly for decoding the data.

In an embodiment, for computing the LLR, the uncertainty region based decoding module 306 checks if the imaginary value of the modulated symbol is present into the uncertainty region after representing the modulated symbol on the constellation. If the imaginary value of the modulated symbol is present in the uncertainty region, the uncertainty region based decoding module 306 performs the soft decoding on the imaginary value of the modulated symbol and assigns the decoded bits to the imaginary value of the modulated symbol, wherein the decoded bits represent the LLR for the imaginary value of the modulated symbol. If the imaginary value of the modulated symbol is not present in the uncertainty region on the constellation, then the uncertainty region based decoding module 306 recursively transforms the imaginary value of the modulated symbol into the constellation of the succeeding size by subtracting the centroid of the identified quadrant from the imaginary value of the modulated symbol and checks if the imaginary value of the modulated symbol is present in the uncertainty region recursively till the imaginary value of the modulated symbol is present in the uncertainty region or till the imaginary value of the modulated symbol has been transformed into the constellation of the untransformable size. If the imaginary value of the modulated symbol is present in the uncertainty region at any stage, the uncertainty region based decision module 304 performs the soft decoding on the imaginary value of the modulated symbol. If the imaginary value of the modulated symbol is not present in the uncertainty region even after transforming the modulated symbol into the constellation of the untransformable size, then the uncertainty region based decision module 304 instructs the hard decoding module 302 to perform the hard decoding on the modulated symbol to compute the LLR for the modulated symbol and accordingly for decoding the data.

In an embodiment, the uncertainty region based decision module 306 performs the combination of the soft decoding and the hard decoding on the modulated symbol recursively by deriving the two decoded bits for the modulated symbol at a time on checking if the modulated symbol is present in the defined uncertainty region.

The uncertainty region based decision module 306 represents the modulated symbol in the constellation of size corresponding to the modulation scheme associated with the modulated symbol, wherein the constellation includes the defined uncertainty region. Thereafter, the uncertainty region based decoding module 306 recursively identifies the quadrant in which the modulated symbol is present on the constellation/transformed constellation, assigns the two decoded bits at a time for the modulated symbol based on the presence of the modulated symbol in the uncertainty region, and transforms the modulated symbol into the constellation of the size that is resultant from the subtraction of the centroid of the identified quadrant from the real and imaginary values of the modulated symbol till the modulated symbol has been transformed into the constellation of the untransformable size. At any stage, if the modulated symbol is present in the uncertainty region, the uncertainty region based decoding module 306 performs the soft decoding and assigns the two decoded bits at a time for the modulated symbol. The soft decoding involves considering the stream of bits of the modulated symbols and decoding the stream of bits by determining a range of possible values that may take. The soft decoding referred can be at least one of a maximum likelihood soft decision decoding method, a ML rule based soft decoding method, and so on.

If the modulated symbol is not present in the uncertainty region, the uncertainty region based decoding module 306 performs the hard decoding and assigns the two decoded bits at a time for the modulated symbol. The hard decoding involves considering the stream of bits of the modulated symbols from a threshold stage of the receiver 104 and decoding each bit by considering each bit as '1' or '0'. After assigning the decoded bits for the modulated symbol on the constellation of the untransformable size, the uncertainty region based decoding module 306 accumulates the decoded bits assigned on the constellation sizes, wherein the accumulated decoded bits represent the LLR for the modulated symbol.

Consider an example scenario, wherein the uncertainty region based decoding module 306 receives the symbol, and the real and imaginary values of the modulated symbol are of the positive sign. The uncertainty region based decoding module 306 represents/plots the modulated symbol on the constellation (including the uncertainty region) of the size corresponding to the modulation scheme associated with the modulated symbol (in an example herein, consider that the size of the constellation can be 64QAM). The uncertainty region based decoding module 306 then identify the quadrant on the 64QAM in which the modulated symbol is present. The uncertainty region based decoding module 306 further checks if the modulated symbol is present in the uncertainty region on the 64QAM. In an example herein, consider that the modulated symbol is present in the uncertainty region on the 64QAM. In such a case, the uncertainty region based decoding module 306 performs the soft decoding and assigns the two decoded bits for the modulated symbol. After assigning the decoded bits, the uncertainty region based decoding module 306 transforms the modulated symbol into the 16QAM by subtracting the centroid of the identified quadrant (for example; the centroid can be 4A) from the real and imaginary values of the modulated symbol. On transferring the modulated symbol into the 16QAM, the uncertainty region based decoding module 306 identifies the quadrant on the 16QAM in which the modulated symbol is present and checks if the modulated symbol is present in the uncertainty region on the 16QAM. In an example herein, consider that the modulated symbol is not present in the uncertainty region on the 64QAM. In such a case, the uncertainty region based decoding module 306 performs the hard decoding and assigns the two decoded bits for the modulated symbol. Thereafter, the uncertainty region based decoding module 306 transforms the modulated symbol into the 4QAM by subtracting the centroid of the identified quadrant (for example; the centroid can be 2A) from the real and imaginary values of the modulated symbol. On transferring the modulated symbol into the 4QAM, the uncertainty region based decoding module 306 identifies the quadrant on the 4QAM in which the modulated symbol is present and checks if the modulated symbol is present in the uncertainty region on the 4QAM. In an example herein, consider that the modulated symbol is not present in the uncertainty region on the 4QAM. In such a case, the uncertainty region based decoding module 306 performs the hard decoding on the modulated symbol and assigns the two decoded bits for the modulated symbol. After assigning the decoded bits for the modulated symbol based on the quadrant on the 4QAM, the uncertainty region based decoding module 306 accumulates the assigned decoded bits, which can be the LLR for the modulated symbol.

In an embodiment, the uncertainty region based decision module 306 performs the combination of the soft decoding and the hard decoding on the real value of the modulated symbol recursively by deriving the two decoded bits for the real value of the modulated symbol at a time on checking if the real value of the modulated symbol is present in the defined uncertainty region.

In an embodiment, the uncertainty region based decision module 306 performs the combination of the soft decoding and the hard decoding on the imaginary value of the modulated symbol recursively by deriving the two decoded bits for the imaginary value of the modulated symbol at a time on checking if the imaginary value of the modulated symbol is present in the defined uncertainty region.

In an embodiment, the uncertainty region defining module 306 performs either the hard decoding recursively or the soft decoding to compute the LLR by checking if the modulated symbol is present in the uncertainty region. The uncertainty region based decision module 306 represents the modulated symbol in the constellation of size corresponding to the modulation scheme associated with the modulated symbol, wherein the constellation includes the defined uncertainty region. The uncertainty region based decision module 306 checks if the modulated symbol is present in the uncertainty region on the represented constellation. If the modulated symbol is present in the uncertainty region, the uncertainty region based decision module 306 performs the soft decoding on the modulated symbol and assigns the decoded bits for the modulated symbol, wherein the decoded bits represent the LLR. The soft decoding involves considering the stream of bits of the modulated symbols and decoding the stream of bits by determining a range of possible values that may take. The soft decoding referred can be at least one of a maximum likelihood soft decision decoding method, a ML rule based soft decoding method, and so on.

If the modulated symbol is not present in the uncertainty region on the represented constellation, the uncertainty region based decision module 306 recursively performs the hard decoding to assign only a pre-defined number of bits (for example; the two bits herein) at a time for the modulated symbol on the constellation, transforms the modulated symbol into the constellation of the size that is resultant from the subtraction of the centroid of the identified quadrant from the real and imaginary value of the modulated symbol, and checks if the modulated symbol is present in the uncertainty region till the modulated symbol is present in the uncertainty region or the modulated symbol has been transformed into the constellation of the untransformable size. The hard decoding involves considering a stream of bits of the modulated symbols from a threshold stage of the receiver 104 and decoding each bit by considering each bit as '1' or '0'. If the modulated symbol is present in the uncertainty region at any stage, then the uncertainty region based decision module 306 performs the soft decoding to assign the remaining successive bits to the modulated symbol.

Consider an example scenario, wherein the uncertainty region based decoding module 306 receives the symbol, wherein the real and imaginary values of the modulated symbol are of the positive sign. The uncertainty region based decoding module 306 represents/plots the modulated symbol on the constellation (including the uncertainty region) of the size corresponding to the modulation scheme associated with the modulated symbol (in an example herein, consider that the size of the constellation can be 64QAM). The uncertainty region based decoding module 306 then identifies the quadrant on the 64QAM in which the modulated symbol is present. The uncertainty region based decoding module 306 further checks if the modulated symbol is present in the uncertainty region on the 64QAM. In an example herein, consider that the modulated symbol is not present in the uncertainty region on the 64QAM. In such a case, the uncertainty region based decoding module 306 performs the hard decoding (similar to the hard decoding performed by the hard decoding module 302) on the modulated symbol and assigns first and second decoded bits for the modulated symbol. Thereafter the uncertainty region based decoding module 306 transforms the modulated symbol into the constellation of 16QAM. The uncertainty region based decoding module 306 checks whether the modulated symbol is present in the uncertainty region on the 16QAM. In an example herein, consider that the modulated symbol is present in the uncertainty region on the 16QAM. In such a case, the uncertainty region based decoding module 306 performs the soft decoding and assigns the remaining successive decoded bits to the modulated symbol (i.e. third, fourth, fifth and sixth decoded bits). Thereafter, the uncertainty region based decoding module 306 accumulates all the decoded bits. The accumulated decoded bits may be the LLR for the modulated symbol.

In an embodiment, the uncertainty region based decoding module 306 analyzes the real and imaginary values of the modulated symbol separately with respect to the defined uncertainty region on the constellation for computing the LLR for the modulated symbol.

The uncertainty region based decision module 306 represents the real value of the modulated symbol in the constellation of size corresponding to the modulation scheme associated with the modulated symbol, wherein the constellation includes the defined uncertainty region. The uncertainty region based decision module 306 checks if the real value of the modulated symbol is present in the uncertainty region on the represented constellation. If the real value of the modulated symbol is present in the uncertainty region, the uncertainty region based decision module 306 performs the soft decoding on the real value of the modulated symbol and assigns the decoded bits for the real value of the modulated symbol, wherein the decoded bits represent the LLR. If the real value of the modulated symbol is not present in the uncertainty region on the represented constellation, the uncertainty region based decision module 306 recursively performs the hard decoding to assign only the two bits at a time for the real value of the modulated symbol, transforming the real value of the modulated symbol into the constellation of the size resultant from the subtraction of the centroid of the identified quadrant from the real value of the modulated symbol, and checking if the real value of the modulated symbol is present in the uncertainty region till the real value of the modulated symbol is present in the uncertainty region or the real value of the modulated symbol has been transformed into the constellation of the untransformable size. If the real value of the modulated symbol is present in the uncertainty region at any stage, then the uncertainty region based decision module 306 performs the soft decoding to assign the remaining successive bits to the real value of the modulated symbol.

The uncertainty region based decision module 306 represents the imaginary value of the modulated symbol in the constellation of size corresponding to the modulation scheme associated with the modulated symbol, wherein the constellation includes the defined uncertainty region. The uncertainty region based decision module 306 checks if the imaginary value of the modulated symbol is present in the uncertainty region on the represented constellation. If the imaginary value of the modulated symbol is present in the uncertainty region, the uncertainty region based decision module 306 performs the soft decoding on the imaginary value of the modulated symbol and assigns the decoded bits for the imaginary value of the modulated symbol, wherein the decoded bits represent the LLR. If the imaginary value of the modulated symbol is not present in the uncertainty region on the represented constellation, the uncertainty region based decision module 306 recursively performs the hard decoding to assign only the two bits at a time for the imaginary value of the modulated symbol, transforms the imaginary value of the modulated symbol into the constellation of the size that is resultant from the subtraction of the centroid of the identified quadrant from the imaginary value of the modulated symbol, and checks if the imaginary value of the modulated symbol is present in the uncertainty region till the imaginary value of the modulated symbol is present in the uncertainty region or the imaginary value of the modulated symbol has been transformed into the constellation of the untransformable size. If the imaginary value of the modulated symbol is present in the uncertainty region at any stage, then the uncertainty region based decision module 306 performs the soft decoding to assign the remaining successive bits to the imaginary value of the modulated symbol.

FIGS. 2 and 3 show exemplary units/modules of the decoder 212*b*, but it is to be understood that other embodiments are not limited thereon. In other embodiments, the decoder 212*b* may include less or a greater number of elements/units. Further, the labels or names of the units are used only for illustrative purpose and does not limit the scope of the embodiments herein. One or more units can be combined together to perform same or substantially similar function in the decoder 212*b*.

FIG. 4 depicts an example constellation used for computing the LLR to decode the modulated symbol, according to embodiments as disclosed herein. The constellation can be the plot on which the modulated symbol can be represented. The size of the constellation depends on the modulation scheme associated with the modulated symbol. In an example herein, the constellation of 16QAM is depicted in FIG. 4. The 16QAM has 4 quadrants and 16 regions. On the 16QAM constellation, each symbol can be represented by 4bits as depicted in FIG. 4.

FIGS. 5*a*-5*c* are example diagrams depicting decoding of the modulated symbol using the centroid method, according to embodiments as disclosed herein. Embodiments herein further explained considering the modulated scheme associated with the modulation symbol as the 64QAM, but it may be obvious to the person skilled in the art that any other modulation schemes such as, but not limited to, 256, 1024, or the like can be considered.

Consider an example scenario, wherein the receiver 104 receives the modulated symbol of 64QAM from the transmitter 102. In such a case, the receiver 104 checks for the noise variance. If the noise variance is low, the receiver 104 decodes the modulated symbol by performing the hard decoding using the centroid method. For performing the hard decoding, the receiver 104 represents the modulated symbol in the constellation of 64QAM, as depicted in FIG. 5*a*. The receiver 104 then identifies the quadrant (for example; the first quadrant) on the 64QAM in which the modulated symbol is present based on the sign of the real and imaginary values of the modulated symbol. Based on the identified quadrant, the receiver 104 assigns the two decoded bits to the modulated symbol and transforms the modulated symbol into the constellation of the size that is resultant from the subtraction of the centroid of the identified quadrant from the received symbol (for example; 16QAM), as depicted in FIG. 5*b*. The receiver 104 identifies the quadrant (for example; the first quadrant) on the 16QAM in which the modulated symbol is present based on the sign of the modulated symbol and assigns the two decoded bits to the modulated symbol based on the identified quadrant. The receiver 104 further transforms the modulated symbol into the constellation of the size that is resultant from the subtraction of the centroid of the identified quadrant from the received symbol (for example; 4QAM), as depicted in FIG. 5*c*. The receiver 104 identifies the quadrant (for example; the fourth quadrant) on the 4QAM in which the modulated symbol is present based on the sign of the modulated symbol and assigns the two decoded bits to the modulated symbol based on the identified quadrant. The six decoded bits assigned to the modulated symbol represent the LLR for the modulated symbol. The receiver 104 uses the determined LLR and derives the data that has been transmitted from the transmitter 102.

Figure 6B:
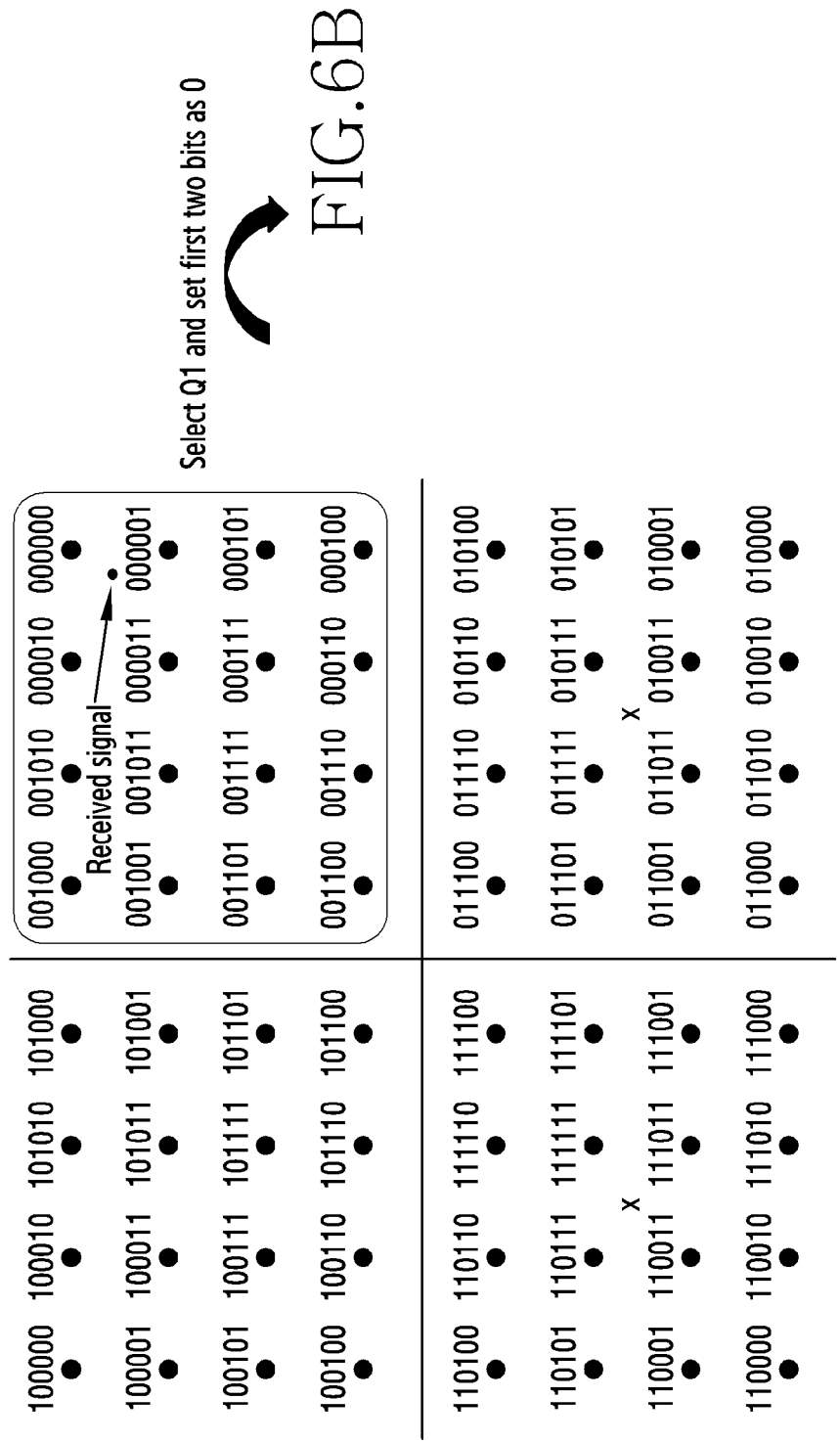

FIGS. 6*a*-6*d* are example diagrams depicting the hard decoding performed using the centroid method to compute the LLR, according to embodiments as disclosed herein. Consider an example scenario, wherein the receiver 104 receives the modulated symbol of 64QAM from the transmitter 102. The receiver 104 represents the modulated symbol in the constellation of 64QAM as depicted in FIG. 6*a*. The receiver 104 then identifies the quadrant on the 64QAM in which the modulated symbol is present based on the sign of the real and imaginary value of the modulated symbol. In an example herein, consider that the modulated symbol includes the real and the imaginary values with a positive sign. In such a case, the receiver 104 identifies that the modulated symbol is present n the first quadrant and accordingly assigns the first and second decoded bits as '0' for the modulated symbol. After assigning the first and second decoded bits, the receiver 104 transforms the modulated symbol into the constellation of 16QAM, as depicted in FIG. 6*b* by subtracting the centroid of the identified quadrant (for example: 4A) from the real and imaginary value of the modulated symbol.

On transferring the modulated symbol into the 16QAM, the receiver 104 identifies the quadrant on the 16QAM in which the modulated symbol is present based on the sign of the real and the imaginary values of the modulated symbol as depicted in FIG. 6*c*. In an example herein, consider that the modulated symbol transformed into the 16QAM has the real and imaginary values of the positive sign. As the modulated symbol transformed into the 16QAM has the real and imaginary values of the positive sign, the receiver 104 identifies that the first quadrant on the 16QAM as the quadrant in which the modulated symbol is present and accordingly assigns third and fourth decoded bits for the modulated symbol as '0'. After assigning the third and fourth decoded bits, the receiver 104 transforms the modulated symbol into the constellation of 4QAM by subtracting the centroid of the identified quadrant (for example, the centroid can be 2A) from the real and imaginary values of the modulated symbol as depicted in FIG. 6*d*. On transforming the modulated symbol into the 4QAM, the receiver 104 checks for the quadrant on the 4QAM in which the modulated symbol is present based on the sign of the real and the imaginary values of the transformed modulated symbol as depicted in FIG. 6*d*. In an example herein, consider that the modulated symbol transformed into the 4QAM has the real value with the positive sign and the imaginary value with the negative sign. As the modulated symbol transformed into the 4QAM has the real value with the positive sign and the imaginary value with the negative sign, the receiver 104 identifies that the fourth quadrant on the 4QAM as the quadrant in which the modulated symbol is present. Accordingly, the receiver 104 assigns a fifth decoded bit as '0' and a sixth decoded bit as '1' for the modulated symbol. The six decoded bits '000001' represent the LLR for the modulated symbol.

FIG. 7*a* depicts an example constellation including the uncertainty region, according to embodiments as disclosed herein. Embodiments herein enable the receiver 104 to define the uncertainty region on the constellation for computing the LLR for the modulated symbol. The uncertainty region can be the boundary defined on the constellation based on the parameters such as, but not limited to, noise variance, User Equipment (UE) distribution, Quality of Service (QoS) requirement, instantaneous signal-to-noise-plus-interference ratio (SINR) ratio, signal to noise ratio (SNR), estimated interference, average Channel Quality Indicator (CQI) information, instantaneous CQI information, available computing power, system load, bandwidth, and so on.

Embodiments herein enable the receiver 104 to define the maximum and minimum value of the width of the uncertainty region. The minimum value of the width of the uncertainty region can be zero. The maximum value of the width of the uncertainty region can be defined as:

$$2\varepsilon = \frac{d_{min}'}{2},$$

wherein the $d_{min}'$ may be calculated as;

$$d_{min}' = \sqrt{\frac{P}{\eta}}.$$

The $d_{min}'$ and $\eta$ values may depend on the size of the constellation. In an example herein, example values of the $d_{min}'$ and $\eta$ with respect to the sizes of the constellations are depicted in FIG. 7*b*.

Embodiments herein enable the receiver 104 to vary the value of the width of the uncertainty region based on the change in the values of the parameters. In an example herein, the values of the width ($\varepsilon$) of the uncertainty region with respect to the SNR ranges is depicted in FIG. 7*c*.

Figure 8A:
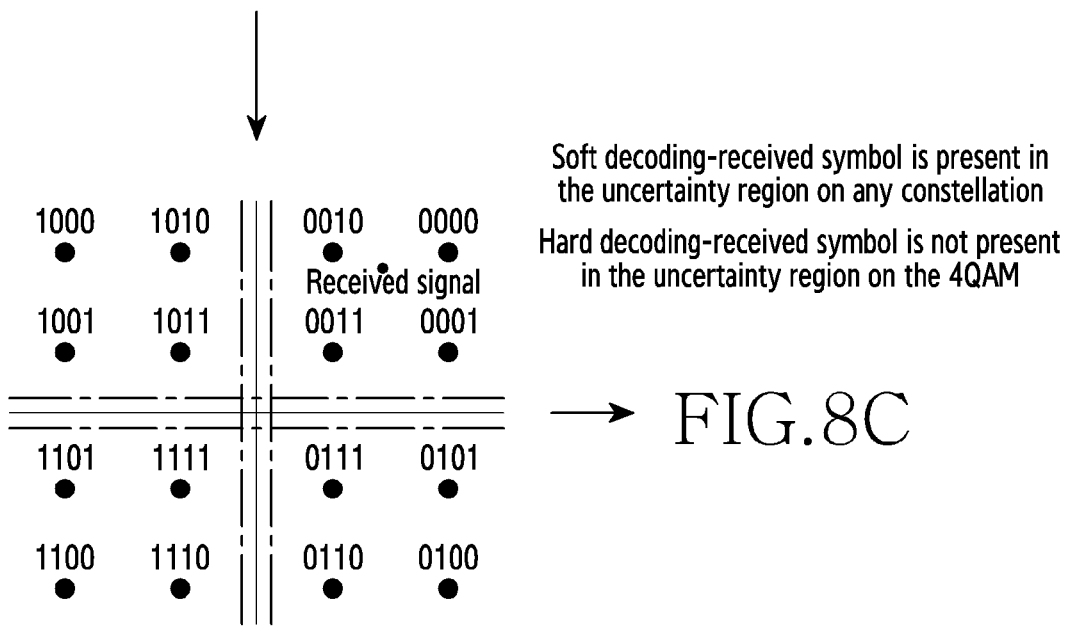
Figure 8A:
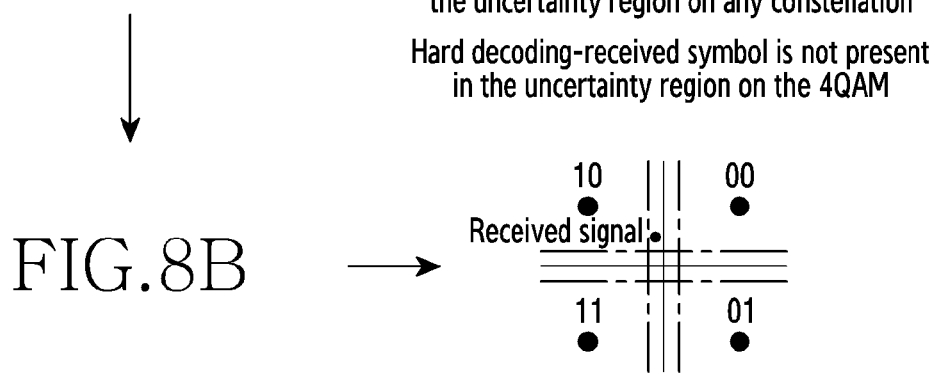

FIGS. 8*a*-8*c* are example diagrams depicting the decoding of the received symbol by performing at least one of the soft decoding and the hard decoding using the uncertainty region, according to embodiments as disclosed herein. Consider an example scenario, wherein the receiver 104 receives the modulated symbol of 64QAM from the transmitter 102 with high noise variance. In such a case, the receiver 104 computes the for decoding the modulated symbol based on the uncertainty region defined on the constellation. For computing the LLR, the receiver 104 represents the receiver symbol on the constellation of 64QAM including the uncertainty region, as depicted in FIG. 8*a* and identifies the quadrant on the 64QAM in which the modulated symbol is present based on the sign of the real and imaginary values of the modulated symbol. After identifying the quadrant, the receiver 104 checks if the modulated symbol is present in the uncertainty region on the identified quadrant of the 64QAM. If the modulated symbol is present in the uncertainty region, the receiver 104 performs the soft decoding on the modulated symbol and assigns the decoded bits to the modulated symbol, which represent the LLR for the modulated symbol.

If the modulated symbol is not present in the uncertainty region, the receiver 104 transforms the modulated symbol into the constellation of 16QAM, as depicted in FIG. 8*b*. Thereafter, the receiver 104 identifies the quadrant on the 16QAM, in which the modulated symbol is present and checks if the modulated symbol is present in the uncertainty region on the identified quadrant of the 16QAM. If the modulated symbol is present in the uncertainty region, the receiver 104 performs the soft decoding on the modulated symbol and assigns the decoded bits to the modulated symbol, which represent the LLR for the modulated symbol. If the modulated symbol is not present in the uncertainty region on the 16QAM, the receiver 104 transforms the modulated symbol into the constellation of 4QAM, as depicted in FIG. 8*c*. Thereafter, the receiver 104 identifies the quadrant on the 4QAM, in which the modulated symbol is present and checks if the modulated symbol is present in the uncertainty region on the identified quadrant of the 4QAM. If the modulated symbol is present in the uncertainty region on the 4QAM, the receiver 104 performs the soft decoding on the modulated symbol and assigns the decoded bits to the modulated symbol, which may represent the LLR for the modulated symbol. If the modulated symbol is not present in the uncertainty region on the 4QAM, then the receiver 104 performs the hard decoding on the modulated symbol and assigns the decoded bits to the modulated symbol, which may represent the LLR for the modulated symbol.

FIGS. 9*a*-9*d* are example diagrams depicting the computation of the LLR by performing at least one of the soft decoding and the hard decoding using the uncertainty region, according to embodiments as disclosed herein.

Figure 9A:
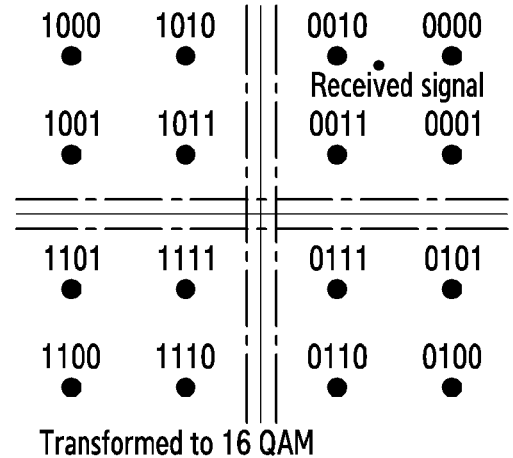

Consider an example scenario, wherein the receiver 104 receives the modulated symbol of 64QAM from the transmitter 102. The receiver 104 represents the modulated symbol in the constellation of 64QAM as depicted in FIG. 9*a*. The receiver 104 then identifies the quadrant on the 64QAM in which the modulated symbol is present based on the sign of the real and imaginary value of the modulated symbol. In an example herein, consider that the modulated symbol includes the real and the imaginary value of the positive sign. In such a case, the receiver 104 identifies the first quadrant as the quadrant in which the modulated symbol is present. Thereafter, the receiver 104 checks if the modulated symbol is present in the uncertainty region on the identified quadrant of the 64QAM. In an example herein, consider that the modulated symbol is not present n the uncertainty region on the identified quadrant of the 64QAM. In such a case, the receiver 104 transforms the modulated symbol into the constellation of 16QAM, as depicted in FIG.

9b by subtracting the centroid of the identified quadrant (for example: 4A) from the real and imaginary value of the modulated symbol.

Figure 9D:
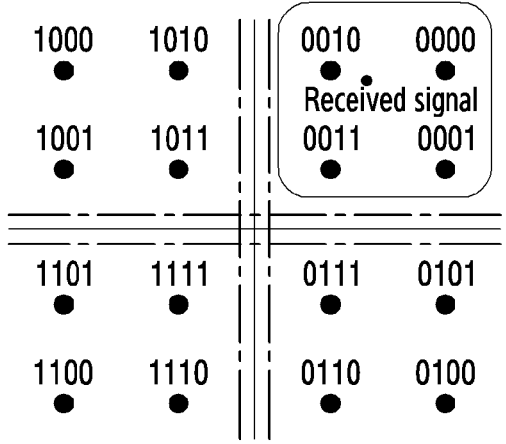
Figure 9C:
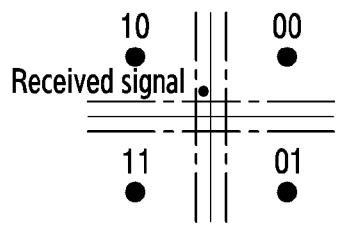

On transferring the modulated symbol into the 16QAM, the receiver 104 identifies the quadrant on the 16QAM (for example; the first quadrant) in which the modulated symbol is present and checks if the modulated symbol is present in the uncertainty region on the identified quadrant of the 16QAM, as depicted in FIG. 9c. In an example herein, consider that the modulated symbol is not present in the uncertainty region on the identified quadrant of the 16QAM. In such a case, the receiver 104 transforms the modulated symbol into the constellation of 4QAM by subtracting the centroid of the identified quadrant (for example: 4A) from the real and imaginary value of the modulated symbol, as depicted in FIG. 9d. On transferring the modulated symbol into the 4QAM, the receiver 104 identifies the quadrant (for example; the second quadrant) on the 4QAM in which the modulated symbol is present and checks if the modulated symbol is present in the uncertainty region on the identified quadrant of the 4QAM, as depicted in FIG. 9d. In an example herein, consider that the modulated symbol is present in the uncertainty region on the identified quadrant of the 4QAM. In such a case, the receiver 104 performs the soft decoding on the modulated symbol and assigns the decoded bits (for example; '000001') to the modulated symbol, which may represent the LLR for the modulated symbol.

Figure 10A:
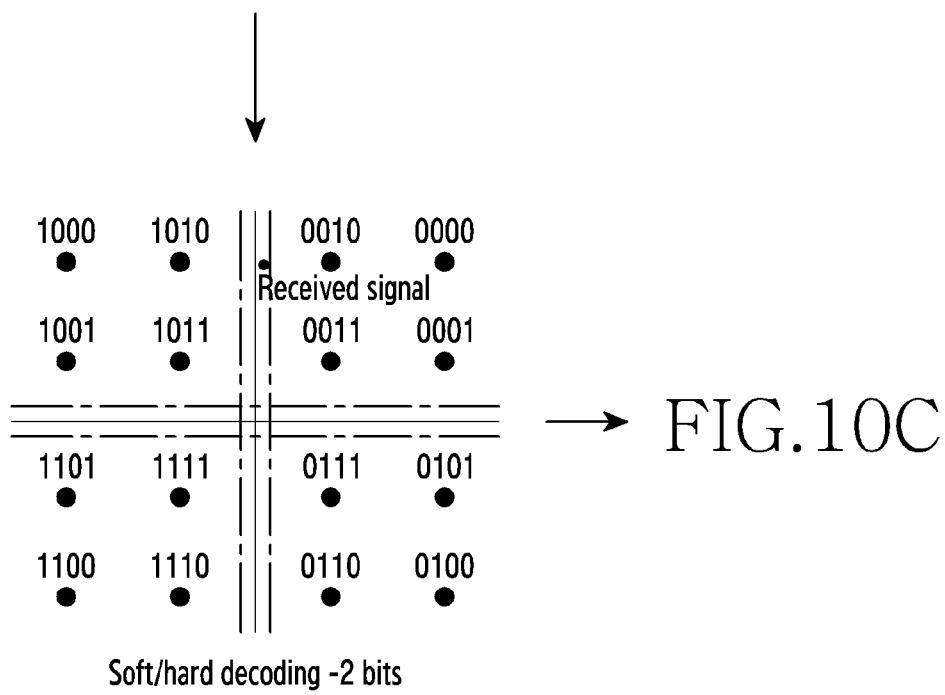
Figure 10A:
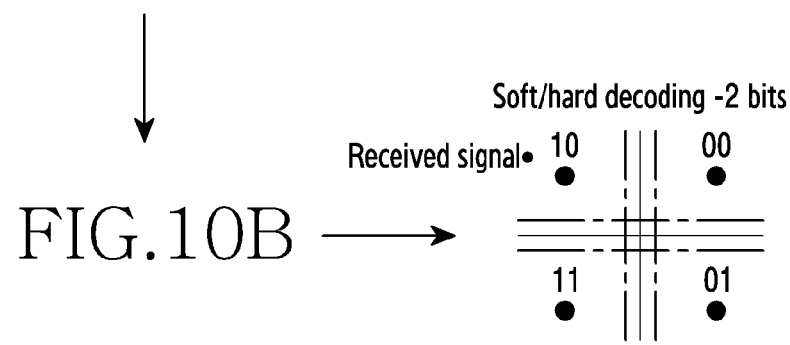

FIGS. 10a-10c are example diagrams depicting the decoding of the modulated symbol by performing the combination of the soft decoding and the hard decoding using the uncertainty region, according to embodiments as disclosed herein.

Consider an example scenario, wherein the receiver 104 receives the modulated symbol of 64QAM from the transmitter 102. In such a case, the receiver 104 computes the LLR for decoding the modulated symbol by performing the combination of the hard decoding and the soft decoding using the uncertainty region defined on the constellation. For computing the LLR, the receiver 104 represents the receiver symbol on the constellation of 64QAM including the uncertainty region, as depicted in FIG. 10a and identifies the quadrant on the 64QAM in which the modulated symbol is present based on the sign of the real and imaginary values of the modulated symbol. After identifying the quadrant, the receiver 104 checks if the modulated symbol is present in the uncertainty region on the identified quadrant. If the modulated symbol is present in the uncertainty region on the identified quadrant of the 64QAM, the receiver 104 performs the soft decoding on the modulated symbol and assigns the two decoded bits to the modulated symbol. If the modulated symbol is not present in the uncertainty region on the identified quadrant of the 64QAM, the receiver 104 performs the hard decoding on the modulated symbol and assigns the two decoded bits to the modulated symbol.

After assigning the two decoded bits, the receiver 104 transforms the modulated symbol into the constellation of 16QAM as depicted in FIG. 10b. Thereafter, the receiver 104 identifies the quadrant on the 16QAM, in which the modulated symbol is present and checks if the modulated symbol is present in the uncertainty region on the identified quadrant of the 16QAM. If the modulated symbol is present in the uncertainty region on the identified quadrant of the 16QAM, the receiver 104 performs the soft decoding on the modulated symbol and assigns the two decoded bits to the modulated symbol on the 16QAM. If the modulated symbol is not present in the uncertainty region on the identified quadrant of the 16QAM, the receiver 104 performs the hard decoding on the modulated symbol and assigns the two decoded bits to the modulated symbol on the 16QAM.

Thereafter, the receiver 104 transforms the modulated symbol into the constellation of 4QAM as depicted in FIG. 10c. Thereafter, the receiver 104 identifies the quadrant on the 4QAM, in which the modulated symbol is present and checks if the modulated symbol is present in the uncertainty region on the identified quadrant of the 4QAM. If the modulated symbol is present in the uncertainty region on the identified quadrant of the 4QAM, the receiver 104 performs the soft decoding on the modulated symbol and assigns the two decoded bits to the modulated symbol on the 4QAM. If the modulated symbol is not present in the uncertainty region on the identified quadrant of the 4QAM, the receiver 104 performs the hard decoding on the modulated symbol and assigns the two decoded bits to the modulated symbol on the 4QAM. The six decoded bits assigned to the modulated symbol (by performing either the soft decoding or the hard decoding) may represent the LLR for the modulated symbol.

FIGS. 11a-11d are example diagrams depicting the computation of the LLR using the combination of the soft decoding and the hard decoding based on the uncertainty region, according to embodiments as disclosed herein.

Figure 11A:
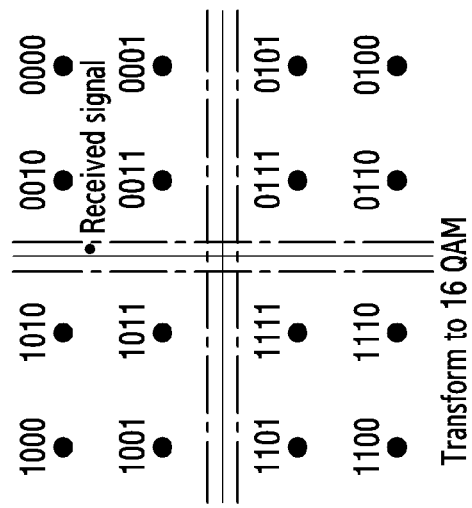
Figure 11D:
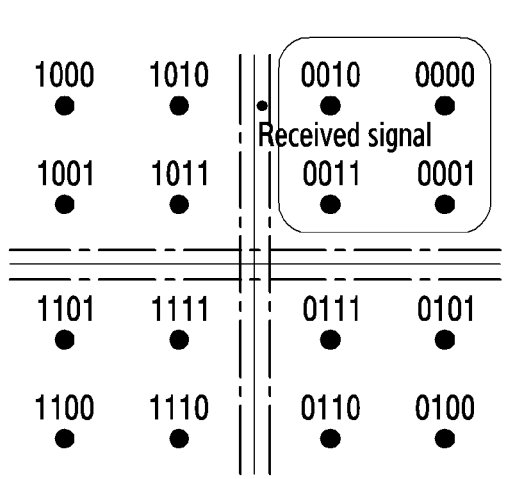

Consider an example scenario, wherein the receiver 104 receives the modulated symbol of 64QAM from the transmitter 102. For computing the LLR, the receiver 104 represents the receiver symbol on the constellation of 64QAM including the uncertainty region as depicted in FIG. 11a and identifies the quadrant on the 64QAM in which the modulated symbol is present based on the sign of the real and imaginary values of the modulated symbol. In an example herein, consider that the modulated symbol includes the real and the imaginary value of the positive sign. In such a case, the receiver 104 identifies the first quadrant as the quadrant in which the modulated symbol is present. Thereafter, the receiver 104 checks if the modulated symbol is present in the uncertainty region on the identified quadrant of the 64QAM. In an example herein, consider that the modulated symbol is not present in the uncertainty region on the identified quadrant of the 64QAM. In such a case, the receiver 104 performs the hard decoding on the modulated symbol and assigns the first and second decoded bits as '0' to the modulated symbol. After assigning the first and second decoded bits, the receiver 104 transforms the modulated symbol into the constellation of 16QAM, as depicted in FIG. 11b by subtracting the centroid of the identified quadrant (for example: 4A) from the real and imaginary value of the modulated symbol. The receiver 104 identifies the quadrant (for example: the first quadrant) on the 16QAM in which the modulated symbol is present and checks if the modulated symbol is present in the uncertainty region on the identified quadrant of the 16QAM. In an example herein, consider that the modulated symbol is present in the uncertainty region on the identified quadrant of the 16QAM. In such a case, the receiver 104 performs the soft decoding on the modulated symbol and assigns the third and fourth bits as '0' to the modulated symbol. Thereafter, the receiver 104 transforms the modulated symbol into the constellation of 4QAM by subtracting the centroid of the identified quadrant (for example; 2A) from the real and imaginary values of the modulated symbol. On the 4QAM, the receiver identifies the quadrant (for example; the second quadrant) in which the modulated symbol is present and checks if the modulated symbol is present in the uncertainty region on the identified quadrant of the 4QAM. In an example herein, consider that the modulated symbol is not present in the uncertainty region on the identified quadrant of the 4QAM. In such a case, the receiver 104 performs the hard decoding on the modulated symbol and assigns the fifth and sixth bits as '0' and '1' to the modulated symbol. The decoded bits '000001' to the modulated symbol can be the LLR for the modulated symbol.

FIGS. 12a-12c are example diagrams depicting the decoding of the modulated symbol by performing either the soft decoding or the recursive hard decoding using the uncertainty region, according to according to embodiments as disclosed herein.

Consider an example scenario, wherein the receiver 104 receives the modulated symbol of 64QAM from the transmitter 102. The receiver 104 represents the modulated symbol in the constellation of 64QAM, as depicted in FIG. 12a. The receiver 104 then identifies the quadrant on the 64QAM in which the modulated symbol is present based on the sign of the real and imaginary values of the modulated symbol and checks if the modulated symbol is present in the uncertainty region on the quadrant of the 64QAM. If the modulated symbol is present in the uncertainty region on the identified quadrant of the 64QAM, the receiver 104 performs the soft decoding on the modulated symbol and assigns the decoded bits to the modulated symbol, which can be the LLR for the modulated symbol.

If the modulated symbol is not present in the uncertainty region on the identified quadrant of the 64QAM, the receiver 104 performs the hard decoding on the modulated symbol and assigns the two decoded bits to the modulated symbol on the 64QAM. Thereafter, the receiver 104 transforms the modulated symbol into the constellation of 16QAM, as depicted in FIG. 12b. The receiver 104 identifies the quadrant on the 16QAM in which the modulated symbol is present and checks if the modulated symbol is present in the uncertainty region on the identified quadrant of the 16QAM. If the modulated symbol is present in the uncertainty region on the identified quadrant of the 16QAM, the receiver 104 performs the soft decoding on the modulated symbol and assigns the remaining successive decoded bits to the modulated symbol. The two decoded bits assigned using the hard decoding and the four decoded bits assigned using the soft decoding collectively represent the LLR for the modulated symbol.

If the modulated symbol is not present in the uncertainty region on the identified quadrant of the 16QAM, the receiver 104 performs the hard decoding on the modulated symbol and assigns the two decoded bits to the modulated symbol on the 16QAM. Thereafter, the receiver 104 transforms the modulated symbol into the constellation of 4QAM, as depicted in FIG. 12c. The receiver 104 identifies the quadrant on the 4QAM in which the modulated symbol is present and checks if the modulated symbol is present in the uncertainty region on the identified quadrant of the 4QAM. If the modulated symbol is present in the uncertainty region on the identified quadrant of the 4QAM, the receiver 104 performs the soft decoding on the modulated symbol and assigns the remaining successive decoded bits to the modulated symbol. The four decoded bits assigned using the hard decoding and the two decoded bits assigned using the soft decoding collectively represent the LLR for the modulated symbol.

If the modulated symbol is not present in the uncertainty region on the identified quadrant of the 4QAM, the receiver 104 performs the hard decoding on the modulated symbol and assigns the two decoded bits to the modulated symbol on the 4QAM. The decoded bits, assigned using the hard decoding, represent the for the modulated symbol.

Figure 13B:
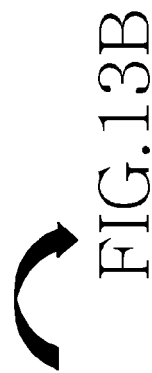

FIGS. 13a-13c are example diagrams depicting the computation of the LLR by performing either the soft decoding or the recursive hard decoding using the uncertainty region, according to according to embodiments as disclosed herein.

Consider an example scenario, wherein the receiver 104 receives the modulated symbol of 64QAM from the transmitter 102 with high noise variance. The receiver 104 represents the modulated symbol in the constellation of 64QAM, as depicted in FIG. 13a. The receiver 104 then identifies the quadrant on the 64QAM (for example: the first quadrant) in which the modulated symbol is present based on the sign of the real and imaginary values of the modulated symbol and checks if the modulated symbol is present in the uncertainty region on the quadrant of the 64QAM. In an example herein, consider that the modulated symbol is not present in the uncertainty region on the identified quadrant of the 64QAM. In such a case, the receiver 104 performs the hard decoding on the modulated symbol and assigns the two decoded bits as '0' to the modulated symbol on the 64QAM. Thereafter, the receiver 104 transforms the modulated symbol into the constellation of 16QAM by subtracting the centroid of the identified quadrant (for example; 4A) from the real and imaginary values of the modulated symbol as depicted in FIG. 13b. The receiver 104 identifies the quadrant (for example; the first quadrant) on the 16QAM in which the modulated symbol is present and checks if the modulated symbol is present in the uncertainty region on the identified quadrant of the 16QAM as depicted in FIG. 13c. In an example herein, consider that the modulated symbol is present in the uncertainty region on the identified quadrant of the 16QAM. In such a case, the receiver 104 performs the soft decoding on the modulated symbol and assigns the remaining succeeding decoded (for example: third-'0', fourth-'0', fifth-'1' and sixth-'1') bits to the modulated symbol without transforming to the constellation of the 4QAM. The assigned two decoded bits ('00') using the hard decoding and four decoded bits ('0011') using the soft decoding represent the LLR (for example: '000011') for the received symbol.

FIGS. 14a and 14b are example tables depicting reduced computational complexity during the computation of the LLR using the centroid method and the uncertainty region, according to embodiments as disclosed herein. In conventional approaches, the hard decoding/the soft decoding used for computing the LLR involves operations such as, but not limited to, square, square-root, division, absolute, multiplication, adders, and so on, which increase the computational complexity. In contrast, embodiments herein enable the receiver 104 to perform the hard decoding based on the centroid method for computing the LLR to decode the modulated symbol, which involves only few operations (for example; 8 comparison and 6 adder+subtractor operations) that further reduces the computational complexity as depicted in the example table.

FIG. 15 is a flow diagram 1500 depicting a method for decoding the modulated symbols, according to embodiments as disclosed herein.

At step 1502, the method includes receiving, by the receiver 104, the at least one symbol transmitted from the at least one device/transmitter 102. The receiver 104 receives the RF signal from the transmitter 102 and processes the received RF signal (for example: filters, amplifies, down-converts, digitizes) to obtain the at least one symbol that has been received from the transmitter 102. The received at least one symbol can be encoded and modulated symbol including a plurality of data bits.

At step 1504, the method includes computing, by the receiver 104, the LLR of each bit in the received at least one symbol for decoding the received at least one symbol using at least one of a centroid method and the uncertainty region defined on the constellation of codewords. The receiver 104 can perform at least one of the following methods to compute the LLR using at least one of the centroid method and the uncertainty region:

- performing the hard decoding based on the centroid method, wherein the centroid method involves exploiting symmetry of the constellation of codewords;
- performing at least one of the soft decoding and the hard decoding based on the presence of the modulated symbol in the uncertainty region defined on the constellation of codewords;
- performing the combination of the soft decoding and the hard decoding based on the presence of the modulated symbol in the uncertainty region defined on the constellation of codewords; and
- performing at least one of the soft decoding and the recursive hard decoding based on the presence of the received symbol in the uncertainty region defined on the constellation of codewords. The various actions in method 1500 may be performed in the order presented, in a different order or simultaneously. Further, in some embodiments, some actions listed in FIG. 15 may be omitted.

FIGS. 16a-16f depict the computation of the LLR using the hard decoding, according to embodiments as disclosed herein. At step 1601, the receiver 104 represents the received at least one symbol on the constellation of codewords as depicted in FIG. 16a, wherein the received at least one symbol includes the real part and the imaginary part. At step 1602, the receiver 104 performs the hard decoding to assign the plurality of decoded bits for the received at least one symbol as depicted in FIG. 16a. The hard decoding involves recursively performing steps 1602a, 1602b, and 1602c till the received at least one symbol is transformed into the constellation of codewords of an untransformable size. The assigned plurality of decoded bits represents the LLR for the received at least one symbol.

As depicted in FIG. 16b, at step 1602a, the receiver 104 checks a sign of the received at least one symbol to identify the quadrant on the constellation of codewords in which the received at least one symbol is present. As depicted in FIG. 16c, at step 1602b, the receiver 104 assigns the at least two decoded bits of the plurality of decoded bits for the received at least one symbol based on the identified quadrant. As depicted in FIG. 16d, at step 1602c, the receiver 104 transforms the received at least one symbol to the constellation of codewords of the size that is resultant from the subtraction of the centroid of the identified quadrant from the received at least one symbol till the received at least one symbol is transformed into the constellation of codewords of an untransformable size.

Consider an example scenario, wherein the receiver 104 represents the received symbol on the 64QAM constellation at step 1602 as depicted in FIG. 6a. As depicted in FIG. 6b, at step 1602a, the receiver 104 identifies that the received symbol is present in the first quadrant. As depicted in FIG. 16c, at step 1602b, the receiver 104 assigns the two decoded bits "00" to the received symbol, since the received symbol is present in the first quadrant. As depicted in FIG. 16d, at step 1602c, the receiver 104 transforms the received symbol into the 16QAM. As depicted in FIG. 16e, the receiver 104 repeats the step 1602a, and the step 1602b to assign the two more decoded bits "00" to the received symbol. As depicted in FIG. 16e, the receiver 104 then repeats the step 1602c to transform the received symbol from the 16QAM quadrant to the 4QAM. As depicted in FIG. 16f, the receiver 104 then repeats the step 1602a, and the step 1602b to assign the two more decoded bits "01" to the received symbol. The receiver 104 does not perform the step 1602c, since the 4QAM is the untransformable size constellation for the received symbol. The assigned bits "000010" represent the LLR for the received symbol.

FIGS. 17a-17e depict an example method of computing the LLR using the uncertainty region, according to embodiments as disclosed herein. As depicted in FIG. 17a, at step 1701, the receiver 104 represents the received at least one symbol on the constellation of codewords and defines the uncertainty region on the constellation of codewords based on the at least one parameter. As depicted in FIG. 17a, at step 1702, the receiver 104 determines if the received at least one symbol is present in the defined uncertainty region on the represented constellation of codewords, and performs the soft-decoding on the received at least one symbol to assign the plurality of decoded bits for the received at least one symbol if the received at least one symbol is present in the uncertainty region on the represented constellation of codewords.

As depicted in FIG. 17b, the receiver 104 performs at least one first decoding action step (steps 1703a, and 1703b) recursively till the received at least one symbol is present in the uncertainty region on the transformed constellation of codewords or the constellation of codewords of the untransformable size if the received at least one symbol is not present in the uncertainty region on the represented constellation of codewords. As depicted in FIG. 17b, at step 1703a, the receiver 104 transforms the received at least one symbol to the constellation of codewords of the size that is resultant from the subtraction of the centroid of the identified quadrant from the received at least one symbol. As depicted in FIG. 17c, at step 1703b, the receiver 104 determines if the received at least one symbol is present in the defined uncertainty region on the transformed constellation of codewords, wherein the soft decoding is performed to assign the plurality of decoded bits to the received at least one symbol if the received at least one symbol is present in the defined uncertainty region on the transformed constellation of codewords.

As depicted in FIG. 17e, at step 1704, the receiver 104 performs the hard decoding on the received at least one symbol to assign the plurality of decoded bits to the received at least one symbol even if the received at least one symbol is not present n the defined uncertainty region on the constellation of codewords of the untransformable size, wherein the assigned plurality of decoded bits represent the LLR for the received at least one symbol.

Consider an example scenario as depicted in FIG. 17a, wherein the receiver 104 represents the received symbol on the 64QAM constellation defined with the uncertainty region. As depicted in FIG. 17a, at step 1702, the receiver 104 performs the soft decoding to assign the bits "000001" to the received symbol, if the received symbol is present in the defined uncertainty region on the 64QAM. The assigned bits "000001" represent the LLR for the received symbol.

As depicted in FIG. 17b, at step 1703a, the receiver 104 transforms the received symbol from the 64QAM into the 16QAM if the received symbol is not present in the uncertainty region on the 64QAM. As depicted in FIG. 17c, at step 1703b, the receiver 104 checks if the received symbol is present in the uncertainty region on the 16QAM. The receiver 104 performs the soft decoding to assign the bits "000001" to the received symbol, if the received symbol is present in the defined uncertainty region on the 16QAM. The assigned bits "000001" represent the LLR for the received symbol.

As depicted in FIG. 17d, the receiver 104 repeats the step 1703a and transforms the received symbol into the 4QAM if the received symbol is not present in the defined uncertainty region on the 16QAM. As depicted in FIG. 17e, the receiver 104 repeats the step 1703b to check if the received symbol is present in the uncertainty region on the 4QAM. The receiver 104 performs the soft decoding to assign the bits "000001" to the received symbol, if the received symbol is present in the defined uncertainty region on the 4QAM. The assigned bits "000001" represent the LLR for the received symbol. As depicted in FIG. 17e, at step 1704, the receiver 104 performs the hard decoding to assign the bits "000001" to the received symbol, if the received symbol is not present in the defined uncertainty region on the 4QAM.

FIG. 18 depicts another example method of computing the LLR using the uncertainty region, according to embodiments as disclosed herein. The receiver 104 performs at least one of the soft decoding and the hard decoding on the received at least one symbol recursively by deriving at least two decoded bits for the received at least one symbol at a time on checking if the received at least one symbol is present in the defined uncertainty region of codewords.

Consider an example scenario as depicted in FIG. 18, wherein the receiver 104 represents the received symbol on the 64QAM constellation defined with the uncertainty region. The receiver 104 performs the soft decoding to assign the two decoded bits "00" to the received symbol, since the received symbol is present in the uncertainty region on the 64QAM. The receiver 104 then transforms the received symbol from the 64QAM into the 16QAM. The receiver 104 performs the hard decoding to assign the two more decoded bits "00" to the received symbol, since the received symbol is not present in the uncertainty region on the 16QAM. The receiver 104 then transforms the received symbol from the 16QAM into the 4QAM. The receiver 104 performs the soft decoding to assign the two more decoded bits "01" to the received symbol, since the received symbol is present in the uncertainty region on the 4QAM. The assigned bits "000001" represent the LLR for the received symbol.

FIGS. 19a-19d depict another example method of computing the LLR for the received symbol, according to embodiments as disclosed herein. As depicted in FIG. 19a, at step 1901, the receiver 104 performs the soft decoding on the received at least one symbol to assign the plurality of decoded bits for the received at least one symbol if the received at least one symbol is present in the defined uncertainty region on the represented constellation of codewords.

As depicted in FIG. 19b, the receiver 104 performs at least one second decoding action step (1902a, 1902b, and 1902c) recursively till the received at least one symbol is present in the uncertainty region on the transformed constellation of codewords or the constellation of codewords of the untransformable size if the received at least one symbol is not present in the defined uncertainty region on the represented constellation of codewords. As depicted in FIG. 19b, at step 1902a, the receiver 104 performs the hard decoding to assign at least two decoded bits at a time for the received at least one symbol. As depicted in FIG. 19c, at step 1902b, the receiver 104 transforms the received at least one symbol to the constellation of codewords of the size that is resultant from the subtraction of the centroid of the identified quadrant from the received at least one symbol. As depicted in FIG. 19d, at step 1902c, the receiver 104 determines if the received at least one symbol is present in the defined uncertainty region on the transformed constellation of codewords. The receiver 104 performs the soft decoding to assign remaining succeeding decoded bits of the plurality of bits for the received at least one symbol if the received at least one symbol is present in the defined uncertainty region on the transformed constellation of codewords. The plurality of decoded bits assigned using at least one of the hard decoding and the soft decoding represents the LLR for the received at least one symbol.

Consider an example scenario, wherein the receiver 104 represents the received symbol on the 64QAM defined with the uncertainty region as depicted in FIG. 19a. At step 1901, the receiver 104 performs the soft decoding to assign the bits "000001" to the received symbol if the received symbol is present in the uncertainty region defined on the 64QAM.

As depicted in FIG. 19b, at step 1902a, the receiver 104 performs the hard decoding to assign the two bits "00" to the received symbol, if the received symbol is not present in the uncertainty region defined on the 64QAM. As depicted in FIG. 19c, at step 1902b, the receiver 104 transforms the received symbol into the 16QAM. As depicted in FIG. 19d, at step 1902c, the receiver 104 determines of the received symbol is present in the uncertainty region on the 16QAM. The receiver 104 performs the soft decoding to assign the remaining plurality of bits "0001" to the received symbol, since the received symbol is present in the uncertainty region defined on the 16QAM. The assigned bits "000001" represent the LLR for the received symbol.

Embodiments herein decide to compute the LLR by selecting any one of the methods based on user specific parameters such as, but not limited to, noise variance, average interference, User Equipment (UE) distribution, Quality of Service (QoS) requirement, instantaneous signal-to-noise-plus-interference ratio (SINR) ratio, estimated interference, average Channel Quality Indicator (CQI) information, instantaneous CQI information, available computing power, system load, bandwidth, signal to noise ratio (SNR), and so on.

Embodiments herein compute the LLR without using any complex equations that include exponential, cosine, sine, absolute functions, and without using a belief propagation algorithm. Such computations leads to
  reduced hardware requirement and size of the receiver;
  reduced computational complexity, wherein computational complexity may be represented as $O(\log\_4(x/4))+O(B)$, where is x is 256 for 256 QAM and 64 for 64 QAM respectively and $O(B)$ is the computational complexity of decision making process for four constellation points, wherein the reduced computational complexity leads to lesser core/processing units requirements at the receiver for computing the LLR;
  reduced power requirements at the receiver;
  reduced computational time, which further leads to low latency and faster processing; and
  reduced processing requirement of the receiver, that leads to saving in hardware costs.

The embodiments disclosed herein can be implemented through at least one software program running on at least one hardware device and performing network management functions to control the elements. The elements shown in FIGS. 1-3 can be at least one of a hardware device, or a combination of hardware device and software module.

The embodiments disclosed herein describe methods and systems for optimizing computation of log-likelihood ratio (LLR) for decoding modulated symbols. Therefore, it is understood that the scope of the protection is extended to such a program and in addition to a computer readable means having a message therein, such computer readable storage means contain program code means for implementation of one or more steps of the method, when the program runs on a server or mobile device or any suitable programmable device. The method is implemented in a preferred embodiment through or together with a software program written in e.g. Very high speed integrated circuit Hardware Description Language (VHDL) another programming language, or implemented by one or more VHDL or several software modules being executed on at least one hardware device. The hardware device can be any kind of portable device that can be programmed. The device may also include means which could be e.g. hardware means like e.g. an ASIC, or a combination of hardware and software means, e.g. an ASIC and an FPGA, or at least one microprocessor and at least one memory with software modules located therein. The method embodiments described herein could be implemented partly in hardware and partly in software. Alternatively, the invention may be implemented on different hardware devices, e.g. using a plurality of CPUs.

The foregoing description of the specific embodiments will so fully reveal the general nature of the embodiments herein that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments herein have been described in terms of embodiments, those skilled in the art will recognize that the embodiments herein can be practiced with modification within the spirit and scope of the embodiments as described herein.

According to various embodiments, this present invention provides that a method for decoding modulated symbols in a communication system (100), the method comprising: receiving, by a receiver (104), at least one symbol transmitted from at least one device (102), computing, by the receiver (104), a log-likelihood ratio (LLR) of each bit in the received at least one symbol using a centroid method and decoding, by the receiver (104), the computed LLR to obtain decoded data corresponding to the received at least one symbol.

According to various embodiments, wherein the received at least one symbol includes a plurality of data bits.

According to various embodiments, wherein the centroid method involves exploiting symmetry of the constellation of codewords.

According to various embodiments, wherein computing, by the receiver (104), the LLR using the centroid method includes: representing the received at least one symbol on the constellation of codewords, wherein the received at least one symbol includes a real part and an imaginary part: and performing a hard decoding to assign a plurality of decoded bits for the received at least one symbol, wherein performing the hard decoding involves recursively: checking a sign of the received at least one symbol to identify a quadrant on the constellation of codewords in which the received at least one symbol is present; assigning at least two decoded bits of the plurality of decoded bits for the received at least one symbol based on the identified quadrant; and transforming the received at least one symbol to the constellation of codewords of a size that is resultant from a subtraction of a centroid of the identified quadrant from the received at least one symbol till the received at least one symbol is transformed into the constellation of codewords of an untransformable size, wherein the assigned plurality of decoded bits represents the LLR for the received at least one symbol.

According to various embodiments, the method comprising: representing the received at least one symbol on the constellation of codewords; defining an uncertainty region on the constellation of codewords based on at least one parameter; and computing the LLR for each bit of the received at least one symbol by checking if the received at least one symbol is present in the defined uncertainty region.

According to various embodiments, wherein the at least one parameter includes at least one of noise variance, average interference, frequency of operations, distribution of long term and short term channels, Radio Resource Control (RRC) parameters, User Equipment (UE) distribution, Quality of Service (QoS) requirement, instantaneous signal-to-noise-plus-interference ratio (SINR) ratio, estimated interference, average Channel Quality Indicator (CQI) information, instantaneous CQI information, available computing power, system load, and bandwidth.

According to various embodiments, wherein computing the LLR by checking if the received at least one symbol is present in the defined uncertainty region includes: performing a soft-decoding to assign the plurality of decoded bits for the received at least one symbol if the received at least one symbol is present in the uncertainty region on the represented constellation of codewords; and performing at least one first decoding action to assign the plurality of decoded bits for the received at least one symbol if the received at least one symbol is not present in the uncertainty region on the represented constellation of codewords.

According to various embodiments, wherein the at least one first decoding action is performed recursively till the received at least one symbol is present in at least one of the defined uncertainty region on the transformed constellation of codewords, and the constellation of codewords with the untransformable size.

According to various embodiments, wherein the at least one first decoding action includes: transforming the received at least one symbol to the constellation of codewords of the size that is resultant from the subtraction of the centroid of the identified quadrant from the received at least one symbol; and determining if the received at least one symbol is present in the defined uncertainty region on the transformed constellation of codewords, wherein the soft decoding is performed to assign the plurality of decoded bits to the received at least one symbol if the received at least one symbol is present in the defined uncertainty region on the transformed constellation of codewords.

According to various embodiments, the method comprising: performing the hard decoding on the received at least one symbol to assign the plurality of decoded bits to the received at least one symbol even if the received at least one symbol is not present in the defined uncertainty region on the constellation of codewords of the untransformable size, wherein the assigned plurality of decoded bits represent the LLR for the received at least one symbol.

According to various embodiments, the method comprising: performing the hard decoding on the real part of the received at least one symbol to assign the plurality of decoded bits to the real part of the received at least one symbol even if the real part of the received at least one symbol is not present in the defined uncertainty region on the constellation of codewords of the untransformable size, wherein the assigned plurality of decoded bits represent the LLR for the real part of the received at least one symbol.

According to various embodiments, the method comprising: determining if the imaginary part of the received at least one symbol is present in the defined uncertainty region on the represented constellation of codewords; performing the soft-decoding on the imaginary part of the received at least one symbol to assign the plurality of decoded bits for the imaginary part of the received at least one symbol if the imaginary part of the received at least one symbol is present in the uncertainty region on the represented constellation of codewords; performing at least one imaginary part decoding action recursively till the imaginary part of the received at least one symbol is present in the uncertainty region on the transformed constellation of codewords or the constellation of codewords of the untransformable size if the imaginary part of the received at least one symbol is not present in the uncertainty region on the represented constellation of codewords, wherein the at least one imaginary part decoding action includes: transforming the imaginary part of the received at least one symbol to the constellation of codewords of the size that is resultant from the subtraction of the centroid of the identified quadrant from the imaginary part of the received at least one symbol; and determining if the imaginary part of the received at least one symbol is present in the defined uncertainty region on the transformed constellation of codewords, wherein the soft decoding is performed to assign the plurality of decoded bits to the imaginary part of the received at least one symbol if the imaginary part of the received at least one symbol is present in the defined uncertainty region on the transformed constellation of codewords; and performing the hard decoding on the imaginary part of the received at least one symbol to assign the plurality of decoded bits to the imaginary part of the received at least one symbol even if the imaginary part of the received at least one symbol is not present in the constellation of the untransformable size, wherein the assigned plurality of decoded bits represent the LLR for the imaginary part of the received at least one symbol.

According to various embodiments, wherein computing the LLR by checking if the received at least one symbol is present in the defined uncertainty region includes: performing at least one of the soft decoding and the hard decoding on the received at least one symbol recursively by deriving at least two decoded bits for the received at least one symbol at a time on checking if the received at least one symbol is present in the defined uncertainty region of codewords.

According to various embodiments, the method comprising: performing at least one of the soft decoding and the hard decoding on the real part of the received at least one symbol recursively by deriving at least two decoded bits for the real part of the received at least one symbol at a time on checking if the real part of the received at least one symbol is present in the defined uncertainty region; and performing at least one of the soft decoding and the hard decoding on the imaginary part of the received at least one symbol recursively by deriving at least two decoded bits for the imaginary part of the received at least one symbol at a time on checking if the imaginary pa of the received at least one symbol is present in the defined uncertainty region.

According to various embodiments, wherein computing the LLR by checking if the received at least one symbol is present in the defined uncertainty region includes: performing the soft decoding to assign the plurality of decoded bits for the received at least one symbol if the received at least one symbol is present in the defined uncertainty region on the represented constellation of codewords; and performing at least one second decoding action to assign the plurality of decoded bits for the received at least one symbol if the received at least one symbol is not present in the defined uncertainty region on the represented constellation of codewords.

According to various embodiments, wherein the at least one second decoding action is recursively performed till the received at least one symbol is present in at least one of the defined uncertainty region on the transformed constellation of codewords, and the constellation of codewords of the untransformable size.

According to various embodiments, wherein the at least one second decoding action includes: performing the hard decoding to assign at least two decoded bits at a time for the received at least one symbol; transforming the received at least one symbol to the constellation of codewords of the size that is resultant from the subtraction of the centroid of the identified quadrant from the received at least one symbol; and determining if the received at least one symbol is present in the defined uncertainty region on the transformed constellation of codewords, wherein the soft decoding is performed to assign remaining succeeding decoded bits of the plurality of bits for the received at least one symbol if the received at least one symbol is present n the defined uncertainty region on the transformed constellation of codewords, wherein the plurality of decoded bits assigned using at least one of the hard decoding and the soft decoding represents the LLR for the received at least one symbol.

According to various embodiments, the method comprising: performing the soft decoding on the real part of the received at least one symbol to assign the plurality of decoded bits for the real part of the received at least one symbol if the real part of the received at least one symbol is present in the defined uncertainty region on the represented constellation of codewords; and performing at least one real part hard decoding action recursively till the real part of the received at least one symbol is present in the uncertainty region on the transformed constellation of codewords or the constellation of codewords of the untransformable size if the real part of the received at least one symbol is not present in the defined uncertainty region on the represented constellation of codewords, wherein the at least one real part hard decoding action includes: performing the hard decoding to assign at least two decoded bits at a time for the real part of the received at least one symbol; transforming the real part of the received at least one symbol to the constellation of the size that is resultant from the subtraction of the centroid of the identified quadrant from the real part of the received at least one symbol; and determining if the real part of the received at least one symbol is present in the defined uncertainty region on the transformed constellation of codewords, wherein the soft decoding is performed to assign remaining succeeding decoded bits of the plurality of bits for the real part of the received at least one symbol if the real part of the received at least one symbol is present in the defined uncertainty region on the transformed constellation of codewords, wherein the plurality of decoded bits assigned using at least one of the hard decoding and the soft decoding represents the LLR for the real part of the received at least one symbol.

According to various embodiments, wherein the method comprising: performing the soft decoding on the imaginary part of the received at least one symbol to assign the plurality of decoded bits for the imaginary part of the received at least one symbol if the imaginary part of the received at least one symbol is present in the defined uncertainty region on the represented constellation of codewords; and performing at least one imaginary part hard decoding action recursively till the imaginary part of the received at least one symbol is present in the uncertainty region on the transformed constellation of codewords or the constellation of codewords of the untransformable size if the imaginary part of the received at least one symbol is not present in the defined uncertainty region on the represented constellation of codewords, wherein the at least one imaginary part hard decoding action includes: performing the hard decoding to assign at least two decoded bits at a time for the imaginary part of the received at least one symbol; transforming the imaginary part of the received at least one symbol to the constellation of the size that is resultant from the subtraction of the centroid of the identified quadrant from the imaginary part of the received at least one symbol; and determining if the imaginary part of the received at least one symbol is present in the defined uncertainty region on the transformed constellation of codewords, wherein the soft decoding is performed to assign remaining succeeding decoded bits of the plurality of bits for the imaginary part of the received at least one symbol if the imaginary part of the received at least one symbol is present in the defined uncertainty region on the transformed constellation of codewords, wherein the plurality of decoded bits assigned using at least one of the hard decoding and the soft decoding represents the LLR for the imaginary part of the received at least one symbol.

According to various embodiments, this present invention provides that a method for optimizing a Log likelihood ratio (LLR) computation at a device (104), the method comprising: receiving, by the device (104), a signal; analyzing, by the device (104), the received signal to check if bit value of the received signal falls within a predefined range; applying, by the device (104), a soft LLR decoding on the received signal if the analyzed bit value of the received signal falls within the predefined range; applying, by the device (104), a hard LLR decoding on the received signal if the analyzed bit value of the received signal does not fall within the predefined range; and determining, by the device (104), the LLR values from the decoded signal.

According to various embodiments, wherein the device (104) is at least one of a User Equipment and a Base Station.

According to various embodiments, this present invention provides that a receiver (104) in a communication system (100), wherein the receiver (104) comprising: a memory (210) configured to store a constellation of codewords; and a decoder (212*b*) coupled to the memory (210) configured to: receive at least one symbol transmitted from at least one device (102); compute a log-likelihood ratio (LLR) of each bit in the received at least one symbol using a centroid method; and decode the computed LLR to obtain decoded data corresponding to the received at least one symbol.

According to various embodiments, wherein the received at least one symbol includes a plurality of data bits.

According to various embodiments, wherein the centroid method involves exploiting symmetry of the constellation of codewords.

According to various embodiments, wherein the decoder (212*b*) is further configured to: represent the received at least one symbol on the constellation of codewords, wherein the received at least one symbol includes a real part and an imaginary part; and perform a hard decoding to assign a plurality of decoded bits for the received at least one symbol, wherein performing the hard decoding involves recursively: checking a sign of the received at least one symbol to identify a quadrant on the constellation of codewords in which the received at least one symbol is present; assigning at least two decoded bits of the plurality of decoded bits for the received at least one symbol based on the identified quadrant; and transforming the received at least one symbol to the constellation of codewords of a size that is resultant from a subtraction of a centroid of the identified quadrant from the received at least one symbol till the received at least one symbol is transformed into the constellation of codewords of an untransformable size, wherein the assigned plurality of decoded bits represents the LLR for the received at least one symbol.

According to various embodiments, wherein the decoder (212*b*) is further configured to: represent the received at least one symbol on the constellation of codewords; define an uncertainty region on the constellation of codewords based on at least one parameter; and compute the LLR for each bit of the received at least one symbol by checking if the received at least one symbol is present in the defined uncertainty region.

According to various embodiments, herein the at least one parameter includes at least one of noise variance, average interference, frequency of operations, distribution of long term and short term channels. Radio Resource Control (RRC) parameters, User Equipment (UE) distribution, Quality of Service (QoS) requirement, instantaneous signal-to-noise-plus-interference ratio (SINR) ratio, estimated interference, average Channel Quality Indicator (CQI) information, instantaneous CQI information, available computing power, system load, and bandwidth.

wherein the decoder (212*b*) is further configured to: perform a soft-decoding to assign the plurality of decoded bits for the received at least one symbol if the received at least one symbol is present in the uncertainty region on the represented constellation of codewords; and perform at least one first decoding action to assign the plurality of decoded bits for the received at least one symbol if the received at least one symbol is not present in the uncertainty region on the represented constellation of codewords.

According to various embodiments, wherein the at least one first decoding action is performed recursively till the received at least one symbol is present in at least one of the defined uncertainty region on the transformed constellation of codewords, and the constellation of codewords with the untransformable size.

According to various embodiments, wherein the decoder (212*b*) is further configured to: transform the received at least one symbol to the constellation of codewords of the size that is resultant from the subtraction of the centroid of the identified quadrant from the received at least one symbol; and determine if the received at least one symbol is present in the defined uncertainty region on the transformed constellation of codewords, wherein the soft decoding is performed to assign the plurality of decoded bits to the received at least one symbol if the received at least one symbol is present in the defined uncertainty region on the transformed constellation of codewords.

According to various embodiments, wherein the decoder (212*b*) is further configured to: perform the hard decoding on the received at least one symbol to assign the plurality of decoded bits to the received at least one symbol even if the received at least one symbol is not present in the defined uncertainty region on the constellation of codewords of the untransformable size, wherein the assigned plurality of decoded bits represent the LLR for the received at least one symbol.

According to various embodiments, wherein the decoder (212*b*) is further configured to: determine if the real part of the received at least one symbol is present in the defined uncertainty region on the represented constellation of codewords; perform the soft-decoding on the real part of the received at least one symbol to assign the plurality of decoded bits for the real part of the received at least one symbol if the real part of the received at least one symbol is present in the uncertainty region on the represented constellation of codewords; perform at least one real part decoding action recursively till the real part of the received at least one symbol is present in the uncertainty region on the transformed constellation of codewords or the constellation of codewords of the untransformable size if the real part of the received at least one symbol is not present in the uncertainty region on the represented constellation of codewords, wherein the at least one real part, decoding action includes: transforming the real part of the received at least one symbol to the constellation of codewords of the size that is resultant from the subtraction of the centroid of the identified quadrant from the real part of the received at least one symbol; and determining if the real part of the received at least one symbol is preset in the defined uncertainty region on the transformed constellation of codewords, wherein the soft decoding is performed to assign the plurality of decoded bits to the real part of the received at least one symbol if the real part of the received at least one symbol is present in the defined uncertainty region on the transformed constellation of codewords; and performing the hard decoding on the real part of the received at least one symbol to assign the plurality of decoded bits to the real part of the received at least one symbol even if the real part of the received at least one symbol is not present in the defined uncertainty region on the constellation of codewords of the untransformable size, wherein the assigned plurality of decoded bits represent the LLR for the real part of the received at least one symbol.

According to various embodiments, wherein the decoder (212b) is further configured to: determine if the imaginary part of the received at least one symbol is present in the defined uncertainty region on the represented constellation of codewords; perform the soft-decoding on the imaginary part of the received at least one symbol to assign the plurality of decoded bits for the imaginary part of the received at least one symbol if the imaginary part of the received at least one symbol is present in the uncertainty region on the represented constellation of codewords; perform at least one imaginary part, decoding action recursively till the imaginary part of the received at least one symbol is present in the uncertainty region on the transformed constellation of codewords or the constellation of codewords of the untransformable size if the imaginary part of the received at least one symbol is not present in the uncertainty region on the represented constellation of codewords, wherein the at least one imaginary part decoding action includes: transforming the imaginary part of the received at least one symbol to the constellation of codewords of the size that is resultant from the subtraction of the centroid of the identified quadrant from the imaginary part of the received at least one symbol; and determining if the imaginary part of the received at least one symbol is present in the defined uncertainty region on the transformed constellation of codewords, wherein the soft decoding is performed to assign the plurality of decoded bits to the imaginary part of the received at least one symbol if the imaginary part of the received at least one symbol is present in the defined uncertainty region on the transformed constellation of codewords; and perform the hard decoding on the imaginary part of the received at least one symbol to assign the plurality of decoded bits to the imaginary part of the received at least one symbol even if the imaginary part of the received at least one symbol is not present in the constellation of the untransformable size, wherein the assigned plurality of decoded bits represent the LLR for the imaginary part of the received at least one symbol.

According to various embodiments, wherein the decoder (212b) is further configured to: perform at least one of the soft decoding and the hard decoding on the received at least one symbol recursively by deriving at least two decoded bits for the received at least one symbol at a time on checking if the received at least one symbol is present in the defined uncertainty region of codewords.

According to various embodiments, wherein the decoder (212b) is further configured to: perform at least one of the soft decoding and the hard decoding on the real part of the received at least one symbol recursively by deriving at least two decoded bits for the real part of the received at least one symbol at a time on checking if the real part of the received at least one symbol is present in the defined uncertainty region; and perform at least one of the soft decoding and the hard decoding on the imaginary part of the received at least one symbol recursively by deriving at least two decoded bits for the imaginary part of the received at least one symbol at a time on checking if the imaginary part of the received at least one symbol is present in the defined uncertainty region.

According to various embodiments, wherein the decoder (212b) is further configured to: perform the soft decoding to assign the plurality of decoded bits for the received at least one symbol if the received at least one symbol is present in the defined uncertainty region on the represented constellation of codewords; and perform at least one second decoding action to assign the plurality of decoded bits for the received at least one symbol if the received at least one symbol is not present in the defined uncertainty region on the represented constellation of codewords.

According to various embodiments, wherein the at least one second decoding action is recursively performed till the received at least one symbol is present in at least one of the defined uncertainty region on the transformed constellation of codewords, and the constellation of codewords of the untransformable size.

According to various embodiments, wherein the decoder (212b) is further configured to: perform the hard decoding to assign at least two decoded bits at a time for the received at least one symbol; transform the received at least one symbol to the constellation of codewords of the size that is resultant from the subtraction of the centroid of the identified quadrant from the received at least one symbol; and determine if the received at least one symbol is present in the defined uncertainty region on the transformed constellation of codewords, wherein the soft decoding is performed to assign remaining succeeding decoded bits of the plurality of bits for the received at least one symbol if the received at least one symbol is present in the defined uncertainty region on the transformed constellation of codewords, wherein the plurality of decoded bits assigned using at least one of the hard decoding and the soft decoding represents the LLR for the received at least one symbol.

According to various embodiments, wherein the decoder (212b) is further configured to: perform the soft decoding on the real part of the received at least one symbol to assign the plurality of decoded bits for the real part of the received at least one symbol if the real part of the received at least one symbol is present in the defined uncertainty region on the represented constellation of codewords; and perform at least one real part hard decoding action recursively till the real part of the received at least one symbol is present in the uncertainty region on the transformed constellation of codewords or the constellation of codewords of the untransformable size if the real part of the received at least one symbol is not present in the defined uncertainty region on the represented constellation of codewords, wherein the at least one real part hard decoding action includes: performing the hard decoding to assign at least two decoded bits at a time for the real part of the received at least one symbol; transforming the real part of the received at least one symbol to the constellation of the size that is resultant from the subtraction of the centroid of the identified quadrant from the real part of the received at least one symbol; and determining if the real part of the received at least one symbol is present n the defined uncertainty region on the transformed constellation of codewords, wherein the soft decoding is performed to assign remaining succeeding decoded bits of the plurality of bits for the real part of the received at least one symbol if the real part of the received at least one symbol is present in the defined uncertainty region on the transformed constellation of codewords, wherein the plurality of decoded bits assigned using at least one of the hard decoding and the soft decoding represents the LLR for the real part of the received at least one symbol.

According to various embodiments, wherein the decoder (212b) is further configured to: perform the soft decoding on the imaginary part of the received at least one symbol to assign the plurality of decoded bits for the imaginary part of the received at least one symbol if the imaginary part of the received at least one symbol is present in the defined uncertainty region on the represented constellation of codewords; and perform at least one imaginary part hard decoding action recursively till the imaginary part of the received at least one symbol is present in the uncertainty region on the transformed constellation of codewords or the constellation of codewords of the untransformable size if the imaginary part of the received at least one symbol is not present in the defined uncertainty region on the represented constellation of codewords, wherein the at least one imaginary part hard decoding action includes: performing the hard decoding to assign at least two decoded bits at a time for the imaginary part of the received at least one symbol; transforming the imaginary part of the received at least one symbol to the constellation of the size that is resultant from the subtraction of the centroid of the identified quadrant from the imaginary part of the received at least one symbol; and determining if the imaginary part of the received at least one symbol is present in the defined uncertainty region on the transformed constellation of codewords, wherein the soft decoding is performed to assign remaining succeeding decoded bits of the plurality of bits for the imaginary part of the received at least one symbol if the imaginary part of the received at least one symbol is present in the defined uncertainty region on the transformed constellation of codewords, wherein the plurality of decoded bits assigned using at least one of the hard decoding and the soft decoding represents the LLR for the imaginary part of the received at least one symbol.

According to various embodiments, this present invention provides that a device (104) in a communication system (100), wherein the device (104) comprising: a memory (210) configured to store a constellation of codewords; and a decoder (212b) coupled to the memory (210) configured to: receive a signal; analyze the received signal to check if bit value of the received signal falls within a predefined range; apply a soft LLR decoding on the received signal if the analyzed bit value of the received signal falls within the predefined range; apply a hard LLR decoding on the received signal if the analyzed bit value of the received signal does not fall within the predefined range; and determine the LLR values from the decoded signal.

According to various embodiments, wherein the device (104) is at least one of a User Equipment and a Base Station.

The invention claimed is:

1. A method for decoding modulated symbols in a communication system, the method comprising:
  receiving, by a receiver, at least one symbol transmitted from at least one device;
  computing, by the receiver, a log-likelihood ratio (LLR) of each bit in the received at least one symbol using a centroid method; and
  decoding, by the receiver, the computed LLR to obtain decoded data corresponding to the received at least one symbol.

2. The method of claim 1, wherein computing, by the receiver, the LLR using the centroid method comprises:
  representing the received at least one symbol on the constellation of codewords, wherein the received at least one symbol includes a real part and an imaginary part; and
  performing a hard-decoding to assign a plurality of decoded bits for the received at least one symbol, wherein performing the hard-decoding further comprises:
  checking a sign of the received at least one symbol to identify a quadrant on the constellation of codewords in which the received at least one symbol is present;
  assigning at least two decoded bits of the plurality of decoded bits for the received at least one symbol based on the identified quadrant; and
  transforming the received at least one symbol to the constellation of codewords of a size that is resultant from a subtraction of a centroid of the identified quadrant from the received at least one symbol till the received at least one symbol is transformed into the constellation of codewords of an untransformable size, wherein the assigned plurality of decoded bits represents the LLR for the received at least one symbol.

3. The method of claim 1, the method comprising:
  representing the received at least one symbol on the constellation of codewords;
  defining an uncertainty region on the constellation of codewords based on at least one parameter; and
  computing the LLR for each bit of the received at least one symbol by checking if the received at least one symbol is present in the uncertainty region,
  wherein the centroid method involves exploiting symmetry of the constellation of codewords, and
  wherein the at least one parameter includes at least one of noise variance, average interference, frequency of operations, distribution of long term and short term channels, radio resource control (RRC) parameters, user equipment (UE) distribution, quality of service (QoS) requirement, instantaneous signal-to-noise-plus-interference ratio (SINR) ratio, estimated interference, average channel quality indicator (COI) information, instantaneous CQI information, available computing power, system load, and bandwidth.

4. The method of claim 3, wherein computing the LLR by checking if the received at least one symbol is present in the defined uncertainty region comprises:
  performing a soft-decoding to assign the plurality of decoded bits for the received at least one symbol, if the received at least one symbol is present in the uncertainty region on the represented constellation of codewords; and performing at least one first decoding action to assign the plurality of decoded bits for the received at least one symbol, if the received at least one symbol is not present in the uncertainty region on the represented constellation of codewords, wherein the at least one first decoding action is performed recursively till the received at least one symbol is present in at least one of the uncertainty region on the transformed constellation of codewords, and the constellation of codewords with the untransformable size.

5. The method of claim 4, wherein performing the at least one first decoding action comprises:

transforming the received at least one symbol to the constellation of codewords of the size that is resultant from the subtraction of the centroid of the identified quadrant from the received at least one symbol; and determining if the received at least one symbol is present in the uncertainty region on the transformed constellation of codewords, performing the soft-decoding to assign the plurality of decoded bits to the received at least one symbol, if the received at least one symbol is present in the uncertainty region on the transformed constellation of codewords, performing the hard-decoding on the received at least one symbol to assign the plurality of decoded bits to the received at least one symbol, if the received at least one symbol is not present in the uncertainty region on the constellation of codewords of the untransformable size, wherein the assigned plurality of decoded bits represent the LLR for the received at least one symbol.

6. The method of claim 4, the method comprising:

determining if a real part of the received at least one symbol is present in the uncertainty region on the represented constellation of codewords;

performing the soft-decoding on the real part of the received at least one symbol, to assign the plurality of decoded bits for the real part of the received at least one symbol if the real part of the received at least one symbol is present in the uncertainty region on the represented constellation of codewords;

performing at least one real part decoding action recursively till the real part of the received at least one symbol is present in the uncertainty region on the transformed constellation of codewords or the constellation of codewords of the untransformable size, if the real part of the received at least one symbol is not present in the uncertainty region on the represented constellation of codewords, wherein performing the at least one real part decoding action comprises:

transforming the real part of the received at least one symbol to the constellation of codewords of the size that is resultant from the subtraction of the centroid of the identified quadrant from the real part of the received at least one symbol; and determining if the real part of the received at least one symbol is present in the uncertainty region on the transformed constellation of codewords, wherein the soft-decoding is performed to assign the plurality of decoded bits to the real part of the received at least one symbol, if the real part of the received at least one symbol is present in the uncertainty region on the transformed constellation of codewords; and performing the hard-decoding on the real part of the received at least one symbol to assign the plurality of decoded bits to the real part of the received at least one, if the real part of the received at least one symbol is not present in the uncertainty region on the constellation of codewords of the untransformable size, wherein the assigned plurality of decoded bits represent the LLR for the real part, of the received at least one symbol.

7. The method of claim 4, the method comprising:

determining if the imaginary part of the received at least one symbol is present in the uncertainty region on the represented constellation of codewords;

performing the soft-decoding on the imaginary part of the received at least one symbol to assign the plurality of decoded bits for the imaginary part of the received at least one symbol, if the imaginary part of the received at least one symbol is present in the uncertainty region on the represented constellation of codewords;

performing at least one imaginary part decoding action recursively till the imaginary part of the received at least one symbol is present in the uncertainty region on the transformed constellation of codewords or the constellation of codewords of the untransformable size if the imaginary part of the received at least one symbol is not present in the uncertainty region on the represented constellation of codewords, wherein performing the at least one imaginary part decoding action comprises:

transforming the imaginary part of the received at least one symbol to the constellation of codewords of the size that is resultant from the subtraction of the centroid of the identified quadrant from the imaginary part of the received at least one symbol; and determining if the imaginary part of the received at least one symbol is present in the uncertainty region on the transformed constellation of codewords, wherein the soft-decoding is performed to assign the plurality of decoded bits to the imaginary part of the received at least one symbol, if the imaginary part of the received at least one symbol is present in the uncertainty region on the transformed constellation of codewords; and performing the hard-decoding on the imaginary part of the received at least one symbol to assign the plurality of decoded bits to the imaginary part of the received at least one symbol, if the imaginary part of the received at least one symbol is not present in the constellation of codewords of the untransformable size, wherein the assigned plurality of decoded bits represent the LLR for the imaginary part of the received at least one symbol.

8. The method of claim 3, wherein computing the IAA by checking if the received at least one symbol is present in the uncertainty region comprises:

performing at least one of the soft-decoding and the hard-decoding on the received at least one symbol recursively by deriving at least two decoded bits for the received at least one symbol at a time on checking, if the received at least one symbol is present in the uncertainty region of codewords, performing at least one of the soft-decoding and the hard-decoding on the real part of the received at least one symbol recursively by deriving at least two decoded bits for the real part of the received at least one symbol at a time on checking, if the real part of the received at least one symbol is present in the uncertainty region; and performing at least one of the soft-decoding and the hard-decoding on the imaginary part of the received at least one symbol recursively by deriving at least two decoded bits for the imaginary part of the received at least one symbol at a time on checking, if the imaginary part of the received at least one symbol is present in the uncertainty region.

9. The method of claim 3, wherein computing the LLR by checking if the received at least one symbol is present in the uncertainty region comprises:
performing the soft-decoding to assign the plurality of decoded bits for the received at least one symbol, if the received at least one symbol is present in the uncertainty region on the represented constellation of codewords; and
performing at least one second decoding action to assign the plurality of decoded bits for the received at least one symbol, if the received at least one symbol is not present in the uncertainty region on the represented constellation of codewords,
wherein the at least one second decoding action is recursively performed till the received at least one symbol is present in at least one of the uncertainty region on the transformed constellation of codewords, and the constellation of codewords of the untransformable size.

10. The method of claim 9, wherein performing the at least one second decoding action comprises:
performing the hard-decoding to assign at least two decoded bits at a time for the received at least one symbol;
transforming the received at least one symbol to the constellation of codewords of the size that is resultant from the subtraction of the centroid of the identified quadrant from the received at least one symbol; and
determining if the received at least one symbol is present in the uncertainty region on the transformed constellation of codewords,
wherein the soft-decoding is performed to assign remaining succeeding decoded bits of the plurality of bits for the received at least one symbol, if the received at least one symbol is present in the uncertainty region on the transformed constellation of codewords, wherein the plurality of decoded bits assigned using at least one of the hard-decoding and the soft-decoding represents the LLR for the received at least one symbol.

11. The method of claim 9, the method comprising:
performing the soft-decoding on the real part of the received at least one symbol to assign the plurality of decoded bits for the real part of the received at least one symbol, if the real part of the received at least one symbol is present in the uncertainty region on the represented constellation of codewords; and
performing at least one real part hard-decoding action recursively till the real part of the received at least one symbol is present in the uncertainty region on the transformed constellation of codewords or the constellation of codewords of the untransformable size if the real part of the received at least one symbol is not present in the uncertainty region on the represented constellation of codewords,
wherein performing the at least one real part hard-decoding action comprises:
performing the hard-decoding to assign at least two decoded bits at a time for the real part of the received at least one symbol;
transforming the real part of the received at least one symbol to the constellation of the size that is resultant from the subtraction of the centroid of the identified quadrant from the real part of the received at least one symbol; and
determining if the real part of the received at least one symbol is present in the uncertainty region on the transformed constellation of codewords, wherein the soft-decoding is performed to assign remaining succeeding decoded bits of the plurality of bits for the real part of the received at least one symbol if the real part of the received at least one symbol is present in the uncertainty region on the transformed constellation of codewords, wherein the plurality of decoded bits assigned using at least one of the hard-decoding and the soft-decoding represents the LLR for the real part of the received at least one symbol.

12. The method of claim 9, the method comprising:
performing the soft-decoding on the imaginary part of the received at least one symbol to assign the plurality of decoded bits for the imaginary part of the received at least one symbol if the imaginary part, of the received at least one symbol is present in the uncertainty region on the represented constellation of codewords; and
performing at least one imaginary part hard-decoding action recursively till the imaginary part of the received at least one symbol is present in the uncertainty region on the transformed constellation of codewords or the constellation of codewords of the untransformable size if the imaginary part of the received at least one symbol is not present in the uncertainty region on the represented constellation of codewords,
wherein performing the at least one imaginary part hard-decoding action comprises:
performing the hard-decoding to assign at least two decoded bits at a time for the imaginary part of the received at least one symbol;
transforming the imaginary part of the received at least one symbol to the constellation of the size that is resultant from the subtraction of the centroid of the identified quadrant from the imaginary part of the received at least one symbol; and
determining if the imaginary part of the received at least one symbol is present in the uncertainty region on the transformed constellation of codewords, wherein the soft-decoding is performed to assign remaining succeeding decoded bits of the plurality of bits for the imaginary part of the received at least one symbol if the imaginary part of the received at least one symbol is present in the uncertainty region on the transformed constellation of codewords, wherein the plurality of decoded bits assigned using at least one of the hard-decoding and the soft-decoding represents the LLR for the imaginary part of the received at least one symbol.

13. A method for optimizing a log likelihood ratio (LLR) computation at a device, the method comprising:
receiving, by the device, a signal;
analyzing, by the device, the received signal to check if bit value of the received signal falls within a predefined range;
applying, by the device, a soft LLR decoding on the received signal if the analyzed bit value of the received signal falls within the predefined range;
applying, by the device, a hard LLR decoding on the received signal if the analyzed bit value of the received signal does not fall within the predefined range; and
determining, by the device, the LLR values from the decoded signal,
wherein the device is at least one of a User Equipment and a Base Station.

14. A receiver comprising:
a processor; and memory coupled to the processor the memory comprising instructions that, when executed by the processor, cause the receiver to:
   receive at least one symbol transmitted from at least one device;
   compute a log-likelihood ratio (LLR) of each bit in the received at least one symbol using a centroid method; and
   decode the computed LLR to obtain decoded data corresponding to the received at least one symbol.

15. An apparatus configured to optimize a log likelihood ratio (LLR) computation, the apparatus comprising:
a processor; and
memory coupled to the processor the memory comprising instructions that, when executed by the processor, cause the apparatus to:
   receive a signal;
   analyze the received signal to cheek if hit value of the received signal falls within a predefined range;
   apply a soft LLR decoding on the received signal if the analyzed bit value of the received signal falls within the predefined range;
   apply a hard LLR decoding on the received signal if the analyzed bit value of the received signal does not fall within the predefined range; and
   determine the LLR values from the decoded signal.

* * * * *